United States Patent [19]
Tarng et al.

[11] Patent Number: 5,850,093
[45] Date of Patent: Dec. 15, 1998

[54] UNI-DIRECTIONAL FLASH DEVICE

[76] Inventors: Huang Chang Tarng; Min Ming Tarng, both of 1367 Glenmoor Way, San Jose, Calif. 95129

[21] Appl. No.: 892,358

[22] Filed: Jul. 14, 1997

Related U.S. Application Data

[63] Continuation-in-part of Ser. No. 419,503, Apr. 10, 1995, abandoned, Ser. No. 932,916, Sep. 9, 1992, abandoned, and Ser. No. 439,200, Nov. 20, 1989, abandoned.

[51] Int. Cl.$^6$ .............................. H01L 29/78; H01L 27/10
[52] U.S. Cl. .......................... 257/327; 257/335; 257/345; 257/654
[58] Field of Search ............................ 257/329, 327, 257/345, 653, 654, 335

[56] References Cited

U.S. PATENT DOCUMENTS

| | | | |
|---|---|---|---|
| 4,163,985 | 8/1979 | Schuermeyer et al. | 257/318 |
| 4,471,368 | 9/1984 | Mohsen | 257/296 |
| 4,994,999 | 2/1991 | Nishizawa | 257/296 |
| 5,198,691 | 3/1993 | Tam | 257/316 |
| 5,552,623 | 9/1996 | Nishizawa et al. | 257/345 |

FOREIGN PATENT DOCUMENTS

| | | | |
|---|---|---|---|
| 61-55963 | 3/1986 | Japan | 257/345 |
| 62-229978 | 10/1987 | Japan | 257/345 |
| 63-289870 | 11/1988 | Japan | 257/345 |
| 63-300567 | 12/1988 | Japan | 257/345 |
| 002027992 | 2/1980 | United Kingdom | 257/345 |

*Primary Examiner*—Donald L. Monin, Jr.

[57] ABSTRACT

The flash device is a field effect single cell device. The flash device has the source laying under the gate. The variance of gate voltage has the direct capacitor coupling and current injecting effects with the source to speed up the response of circuit. Furthermore, the process of the flash device is comparable with the CMOS device. It is an ideal device for the output buffer which has the anti-ground-bounce and anti-power-droop capabilities. The single cell technology is applied to the single cell active pixel to integrate four different components into one cell. The versatile operation is applied to have the super-flash EEPROM.

71 Claims, 50 Drawing Sheets

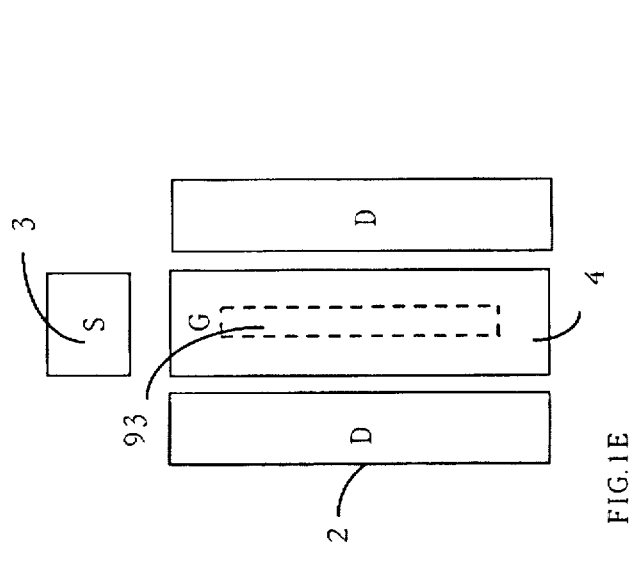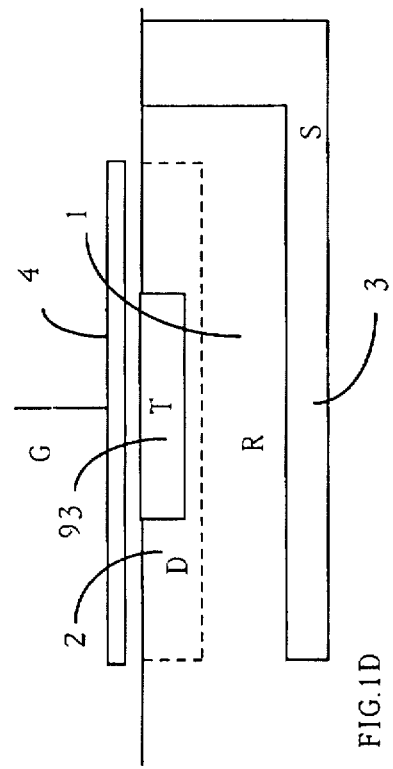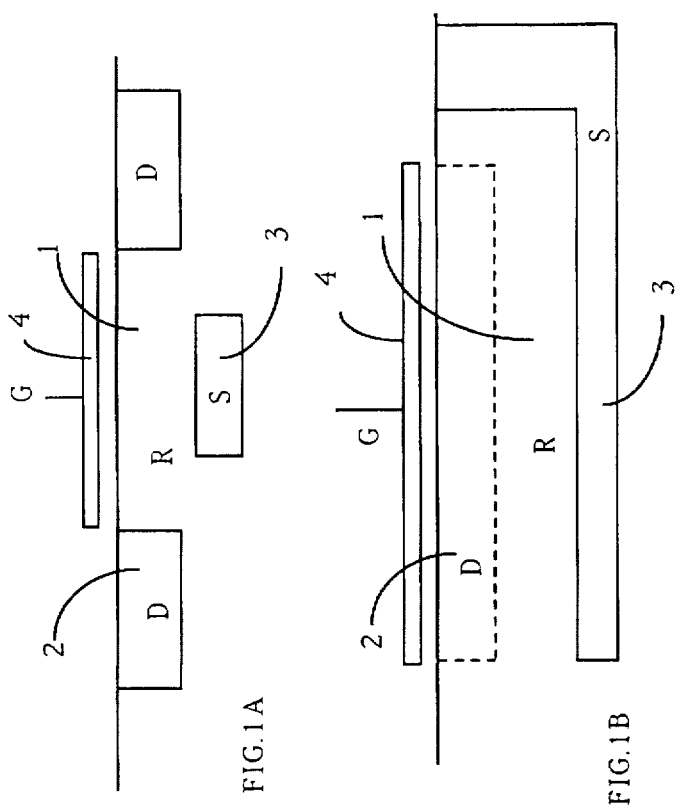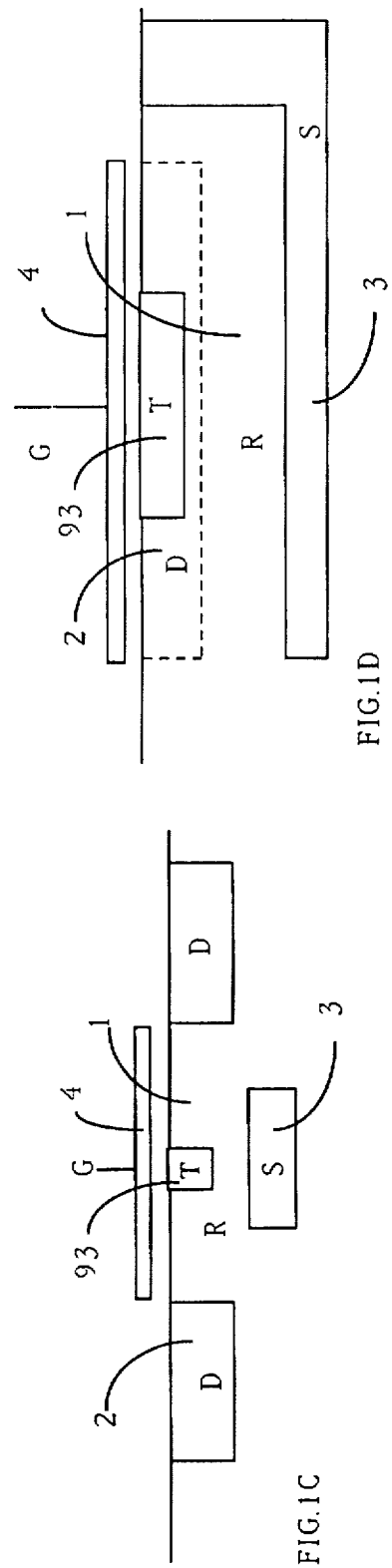

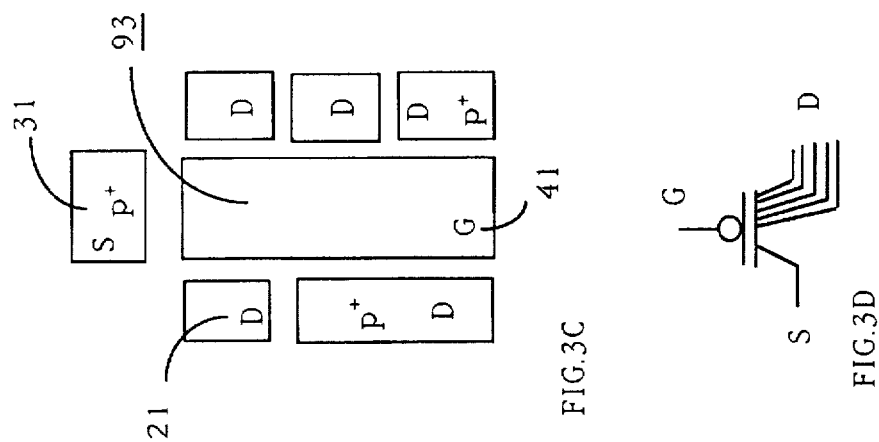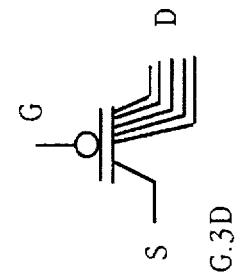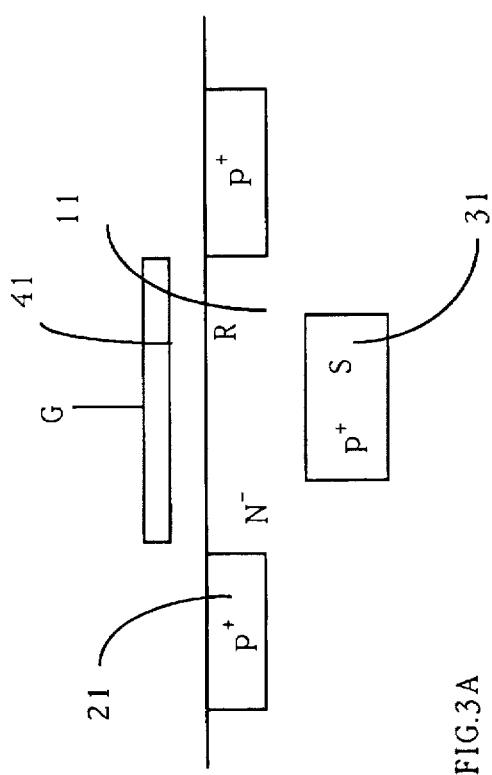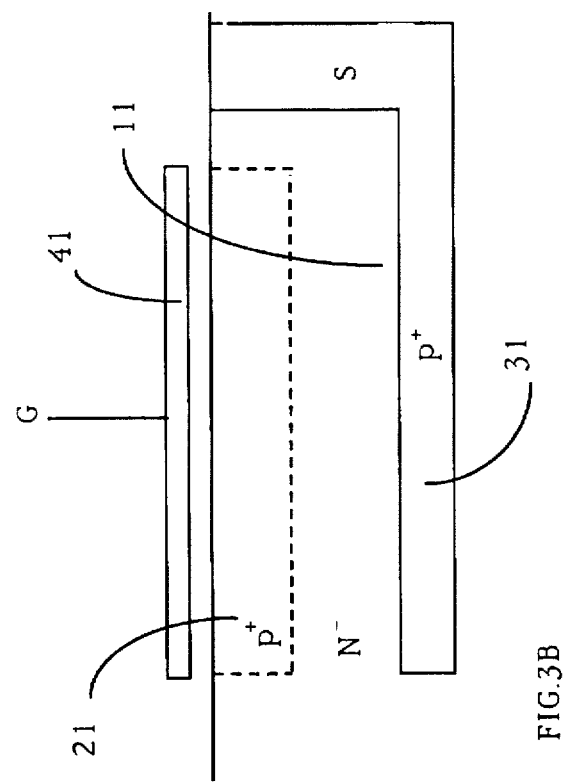

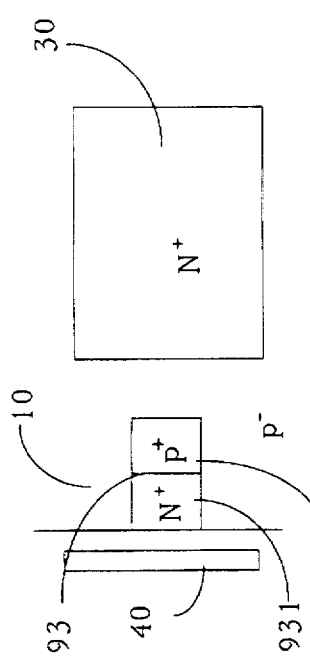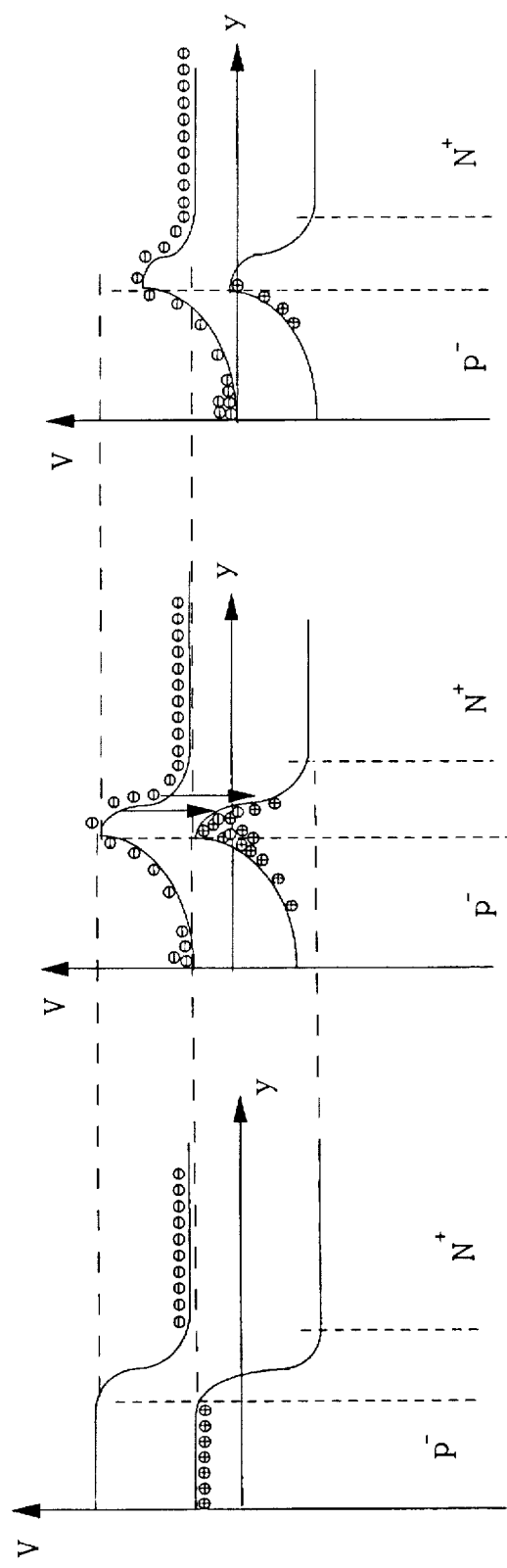
FIG.4A
FIG.4B
FIG.4C
FIG.4D

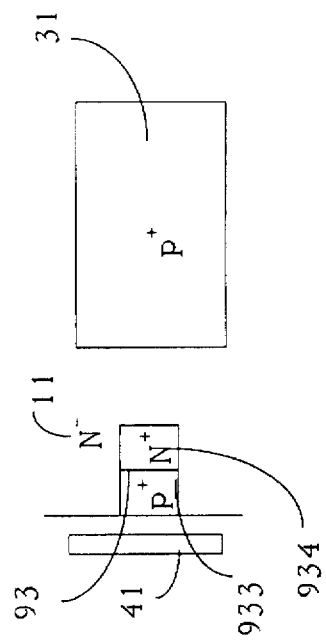
FIG.5A
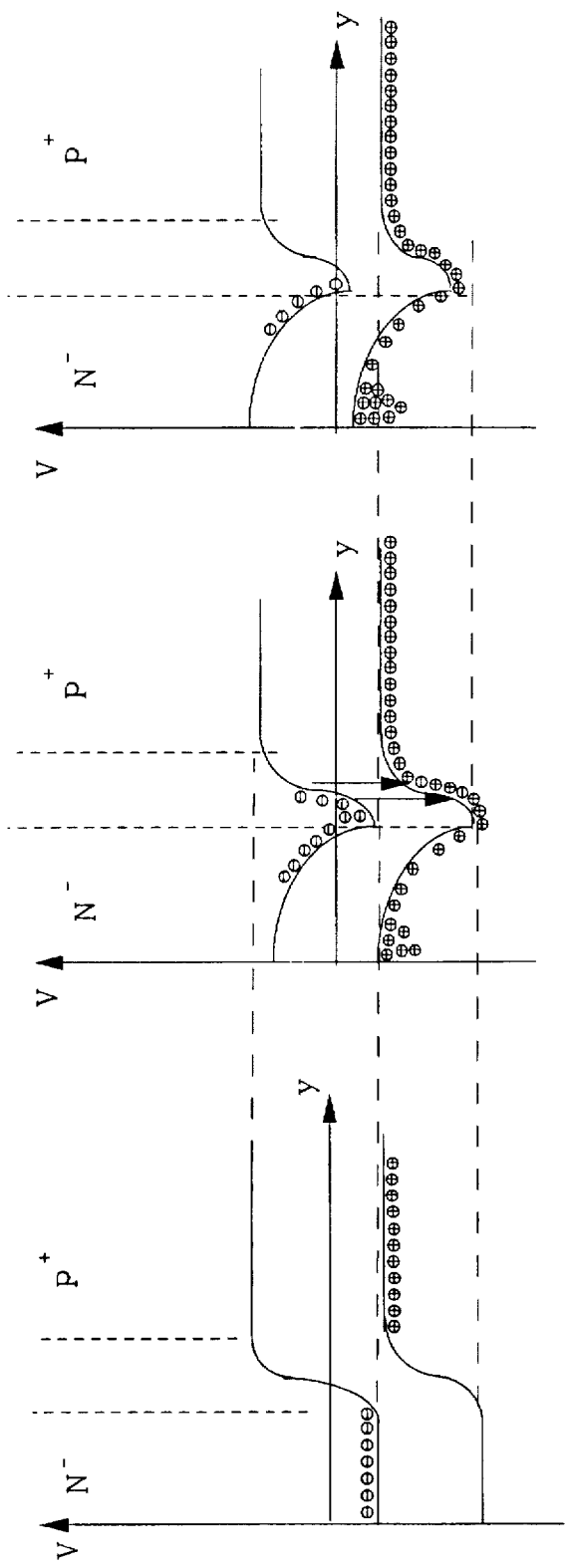
FIG.5B
FIG.5C
FIG.5D

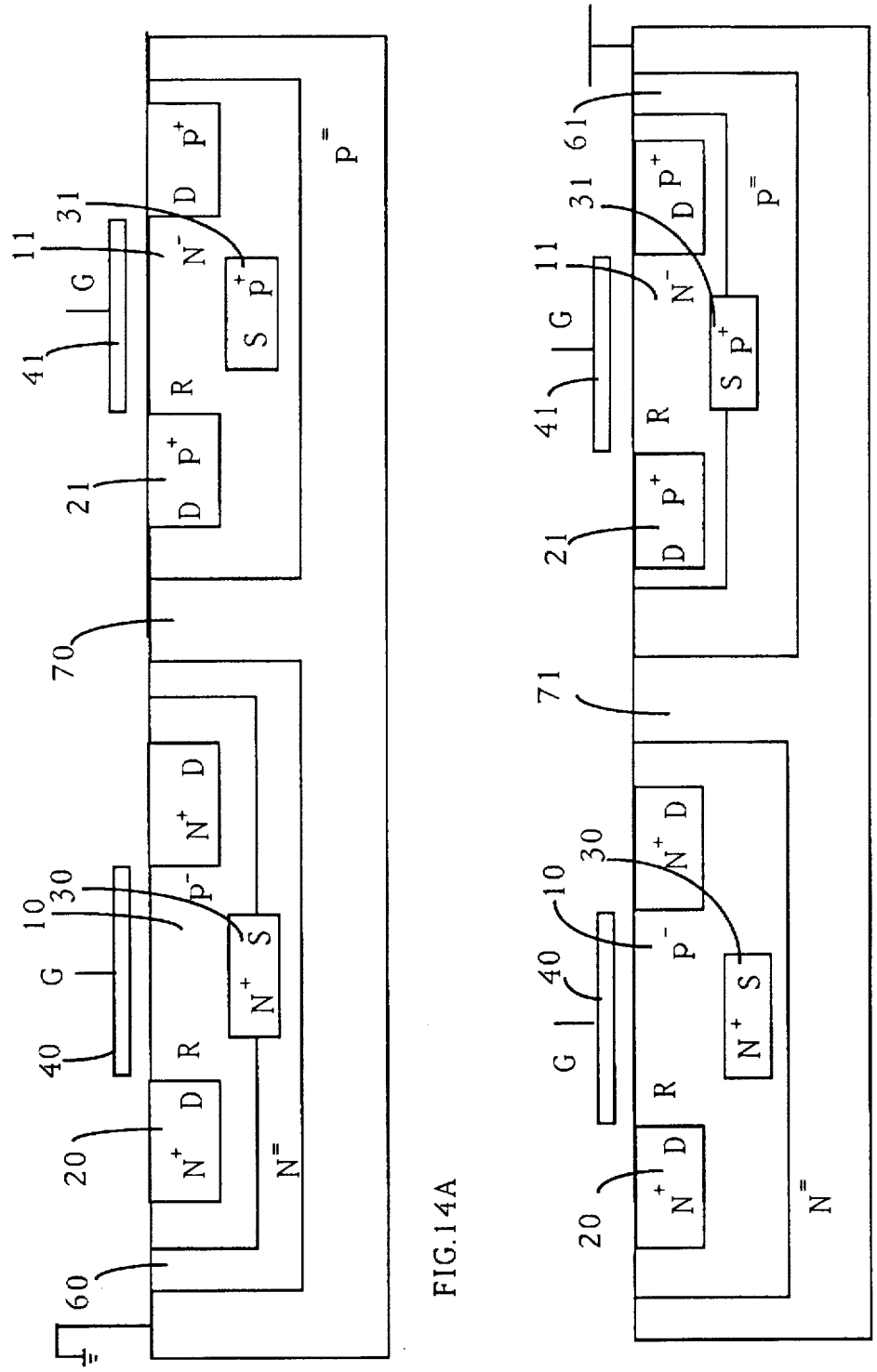

|  | Flash Device | CMOS | DMOS | Bipolar |
|---|---|---|---|---|
| Active Region | River | Channel | Channel | Base |
| Isolation | Extra Layer | Substrate | Substrate | Extra Layer |
| Structure | Asymmetric | Symmetric | Symmetric | Symmetric |
| Current Pattern | Surface & Volumn | Surface Effect (Channel underneath Gate) | Surface Effect (Channel underneath Gate) | Volumn |
| Steady Carrier | Unipolar | Unipolar | Unipolar | Bipolar |
| Fast Transient | Bipolar | Bipolar |  | Bipolar |
| AC/Slow Transient | Bipolar/Unipolar | Unipolar | Unipolar | Bipolar |
| threshold voltage control | well-controlled | well-controlled | difficult |  |
| Switch Region | Floating | Bias at Gnd/Vcc | Bias at Gnd/Vcc | Base Voltage |
| Current | Uni-direction | Bi-direction | Bi-direction | Uni-direction |
| Hot Electron | No | Yes | Yes* | No |
| Device Structure | N-P-N P-N-P | N-P-N P-N-P + light doping | N-P-v-N P-N-v-P | N-P-N P-N-P |
| Width of Switch Region | Wide | Wide | Narrow | Narrow |
| Switch Dealy | No | Yes | Yes | Yes |
| Mechanism | Field Injection | Field Effect | Field Effect | Current Injection |
| Layout | < 1/2 CMOS layout area |  |  |  |
| Latch-Up | No | Yes |  |  |
| Output Buffer Anti-Bounce Anti-Droop | Yes | No | No | Yes |
| Structure symmetry | No | Yes | Yes** | Yes |
| Source/Drain Density | Same | Same | Same | Emitter > Collector |
| Uni-direction Effect | Structure |  |  | Density |

** Don't consider the lightly doped region

FIG.15

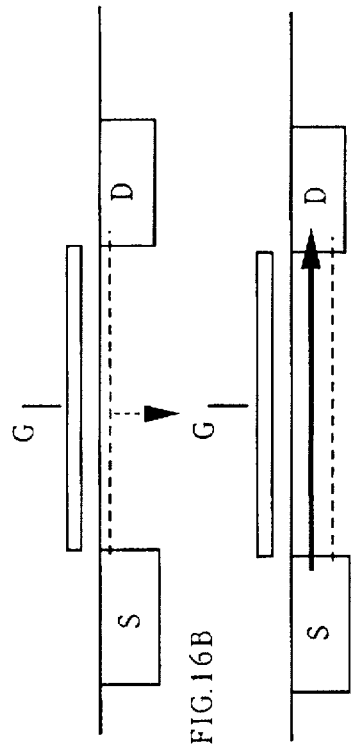
FIG.16A
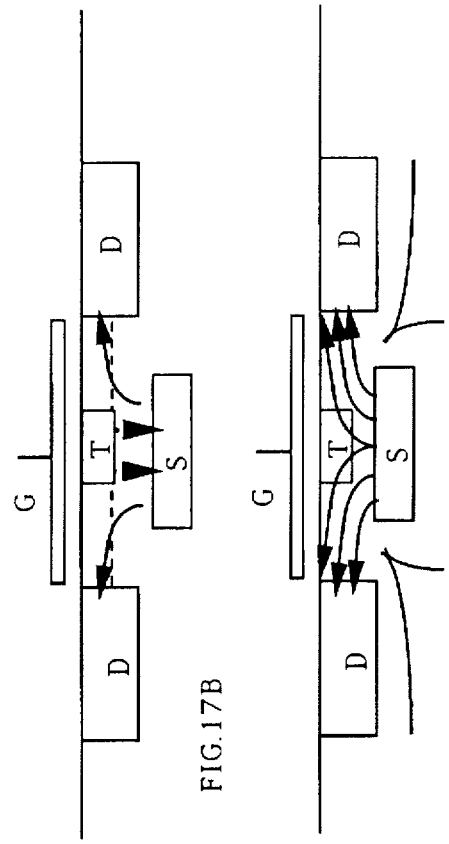
FIG.16B
FIG.16C
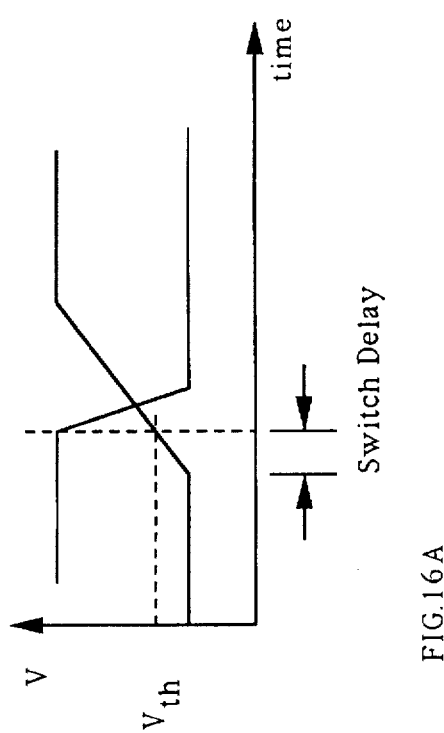
FIG.17A
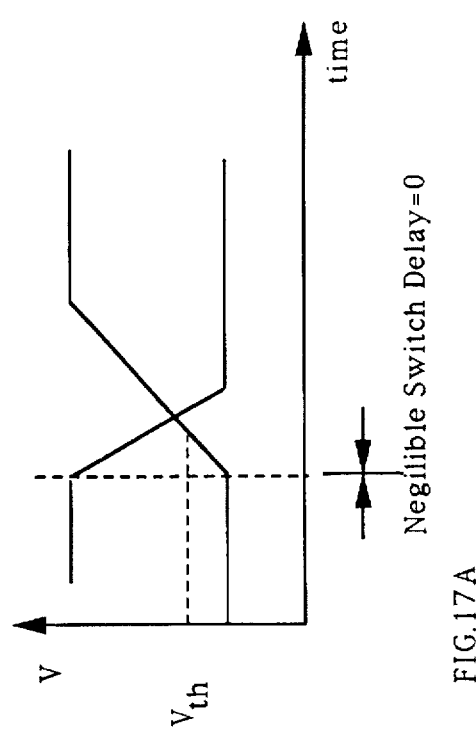
FIG.17B
FIG.17C

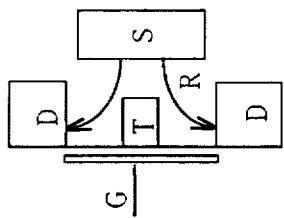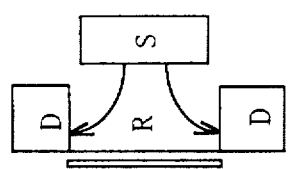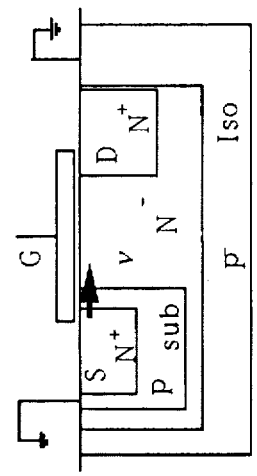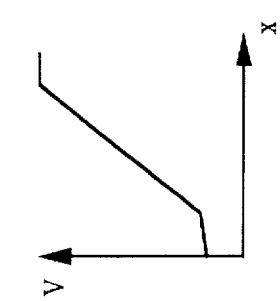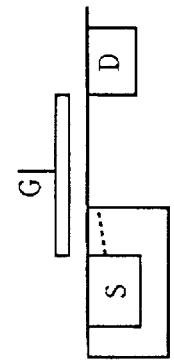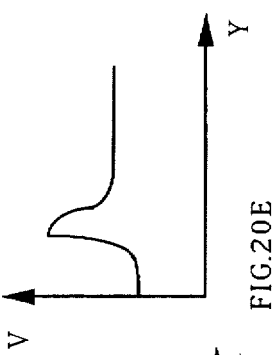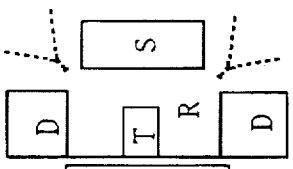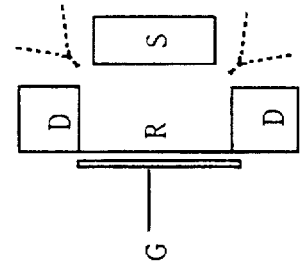

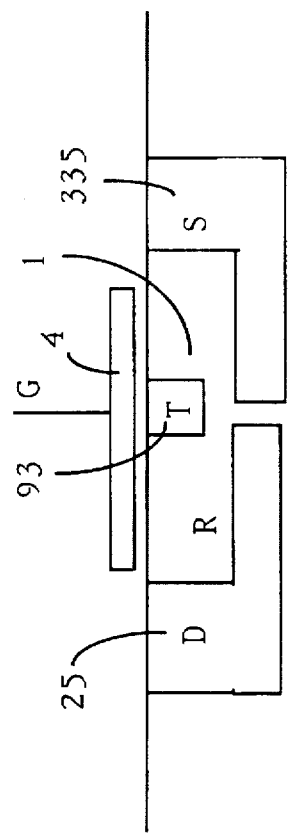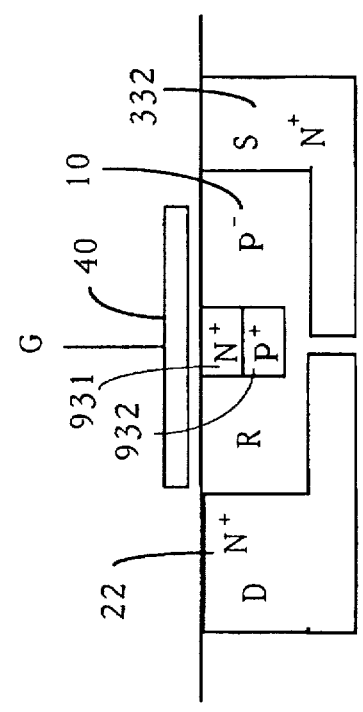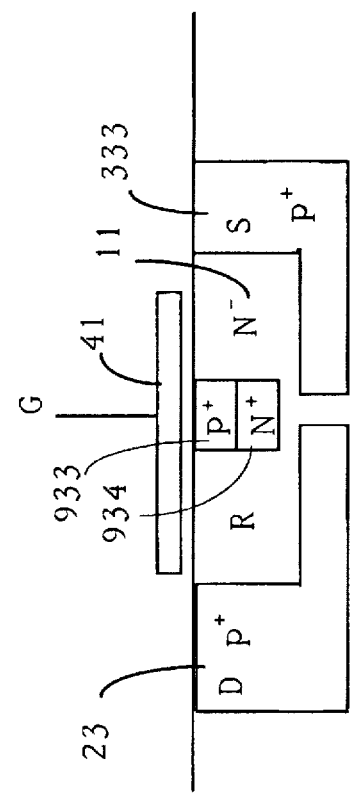

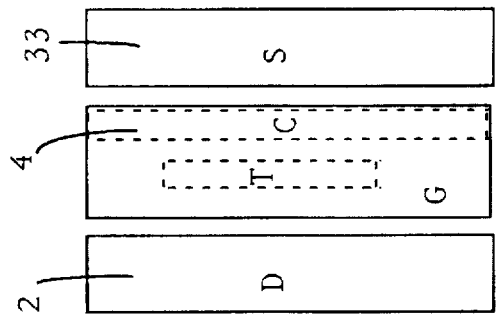
FIG.22F
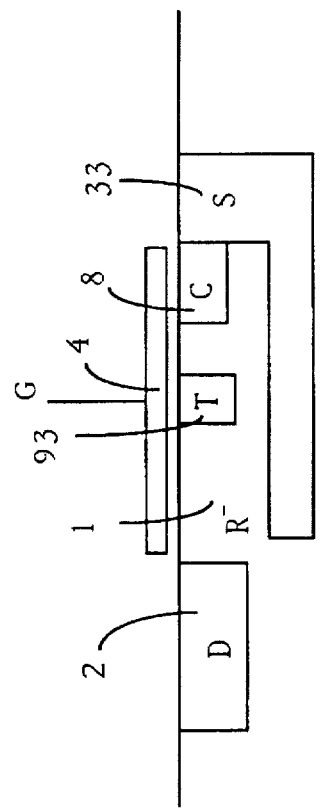
FIG.22E
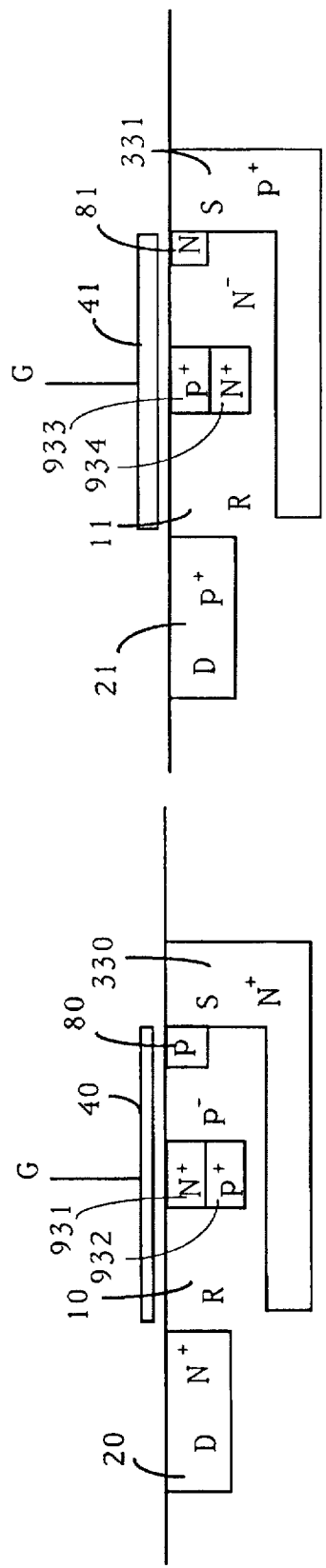
FIG.22H
FIG.22G

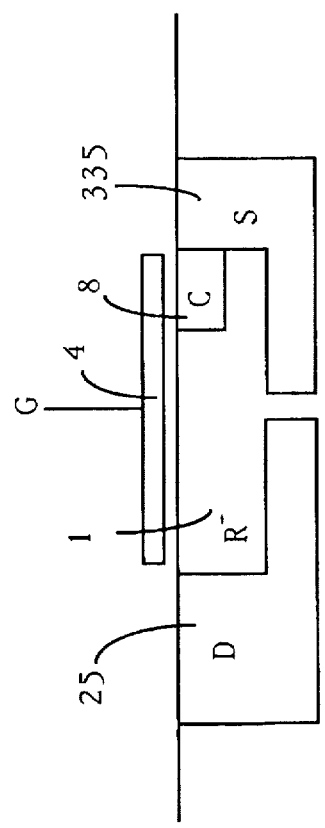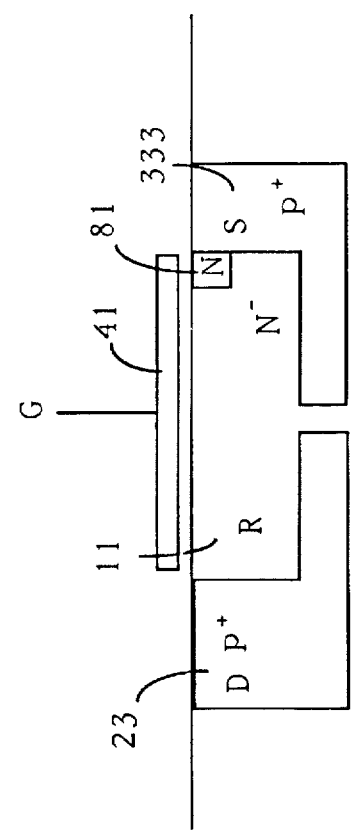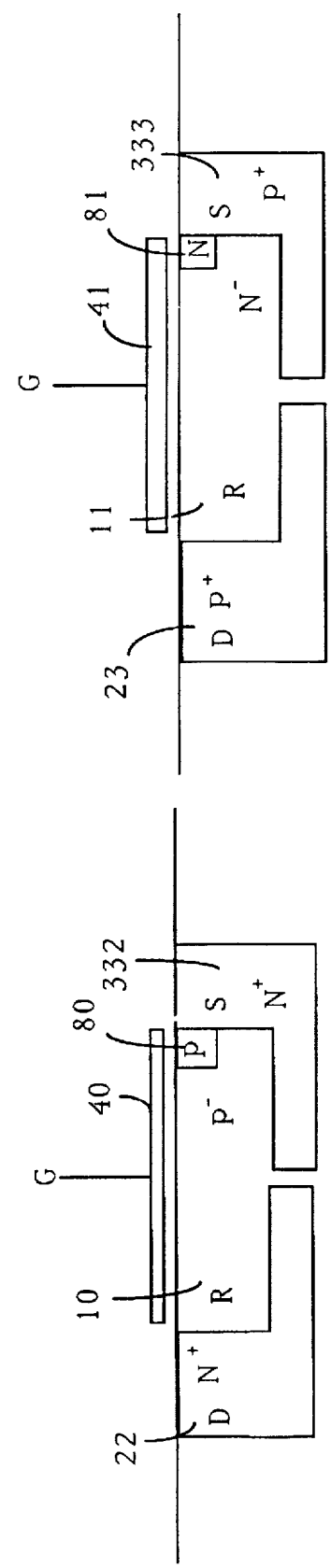

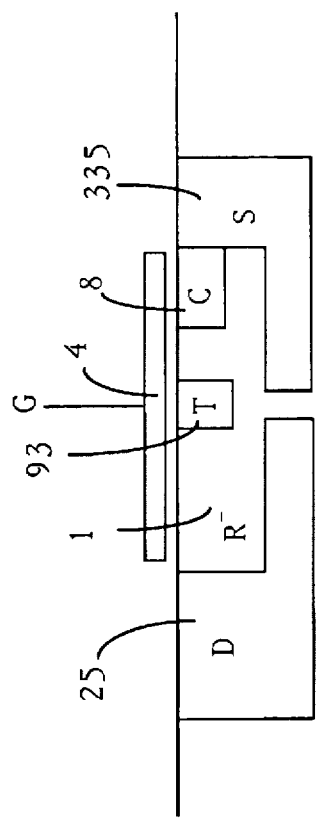
FIG.22L
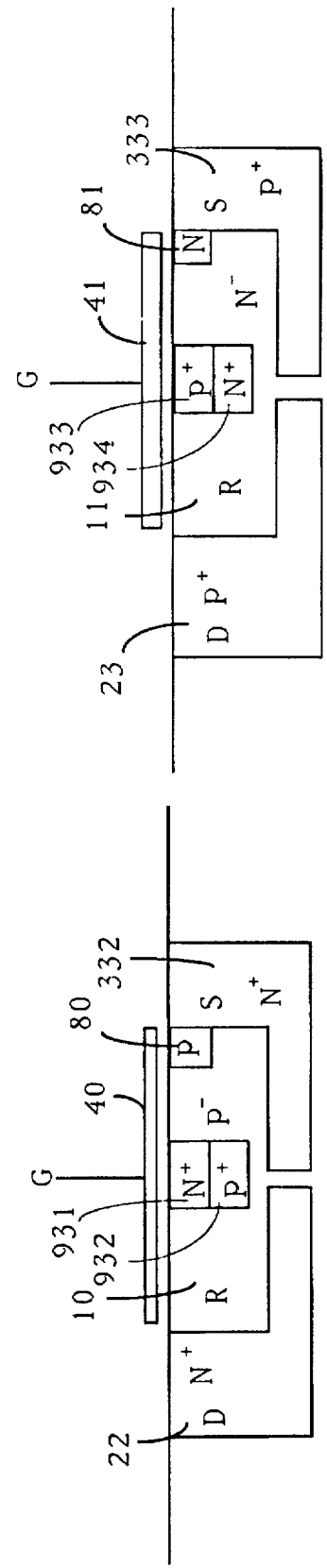
FIG.22M
FIG.22N

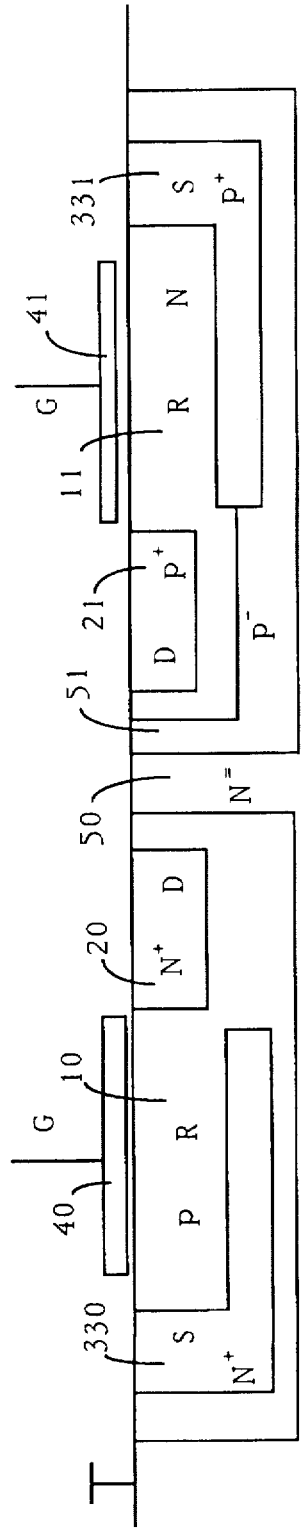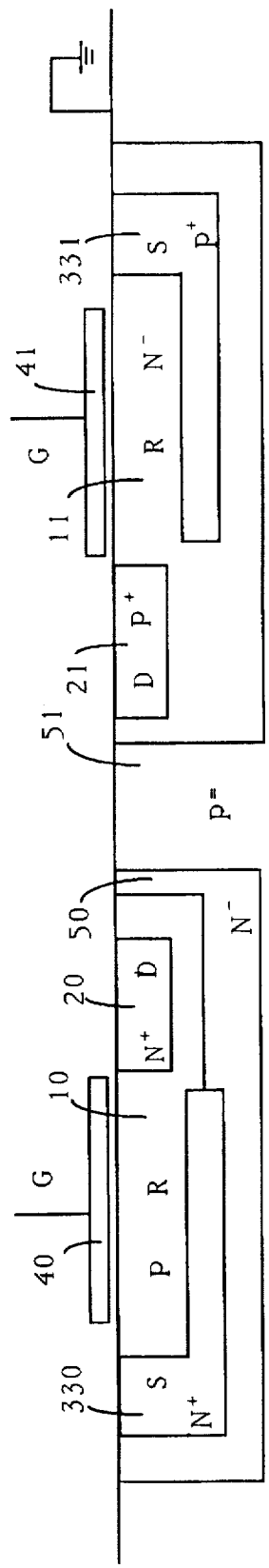
FIG.27A
FIG.27B

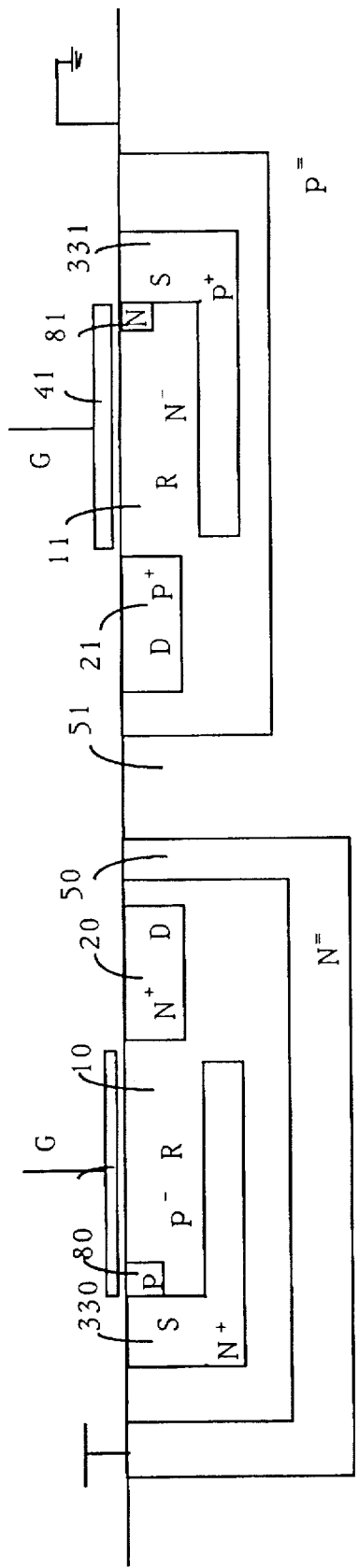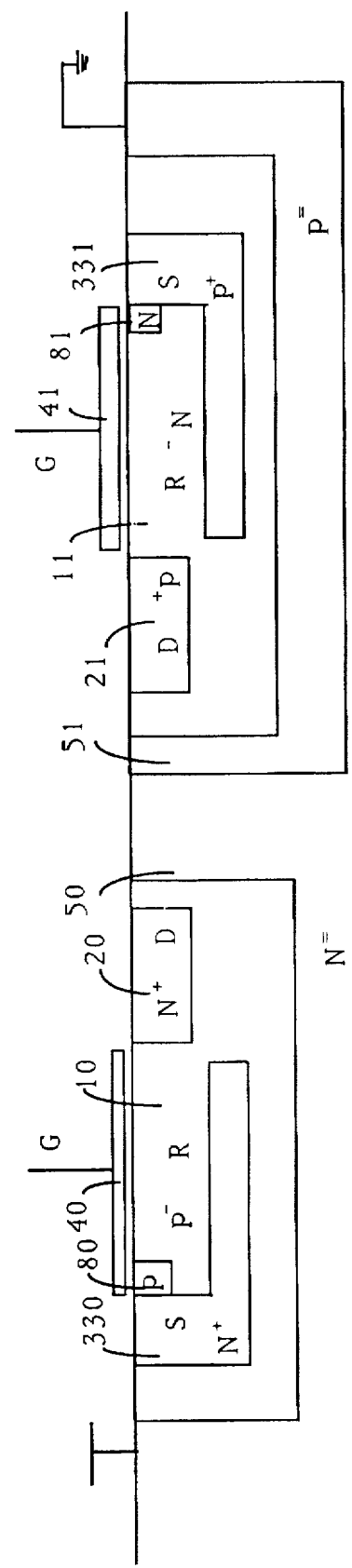
FIG.28A
FIG.28B

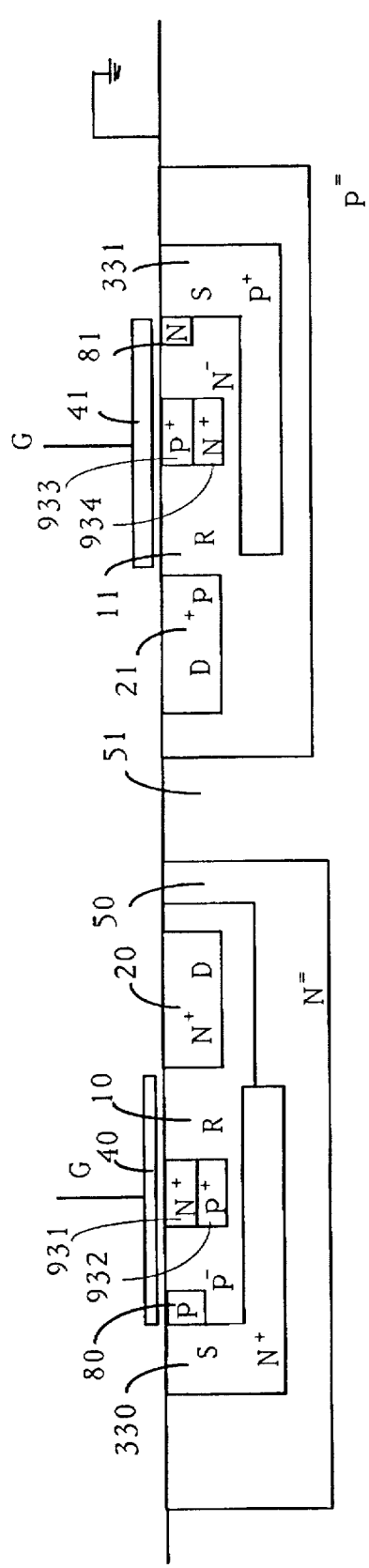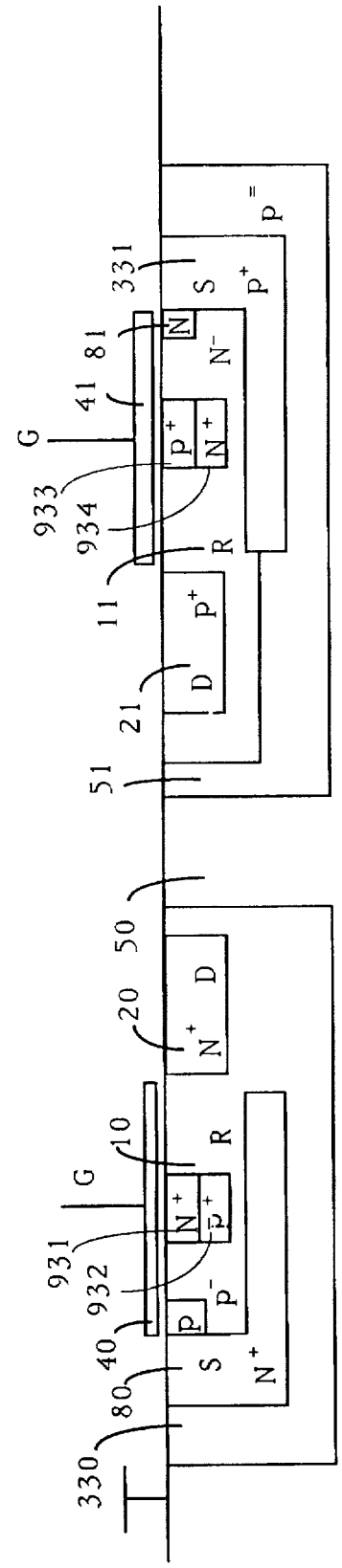
FIG.29C
FIG.29D

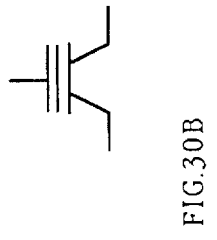
FIG.30B
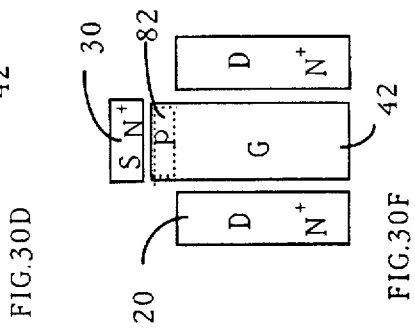
FIG.30D
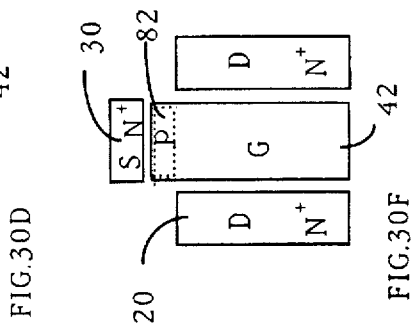
FIG.30F
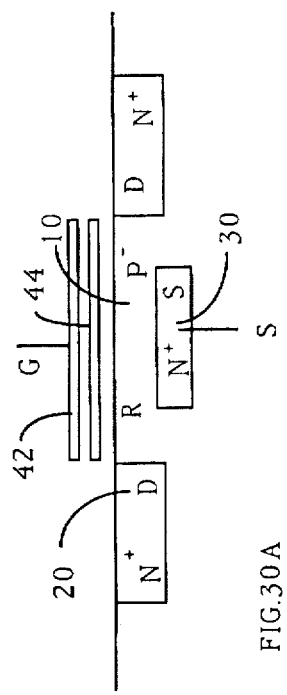
FIG.30A
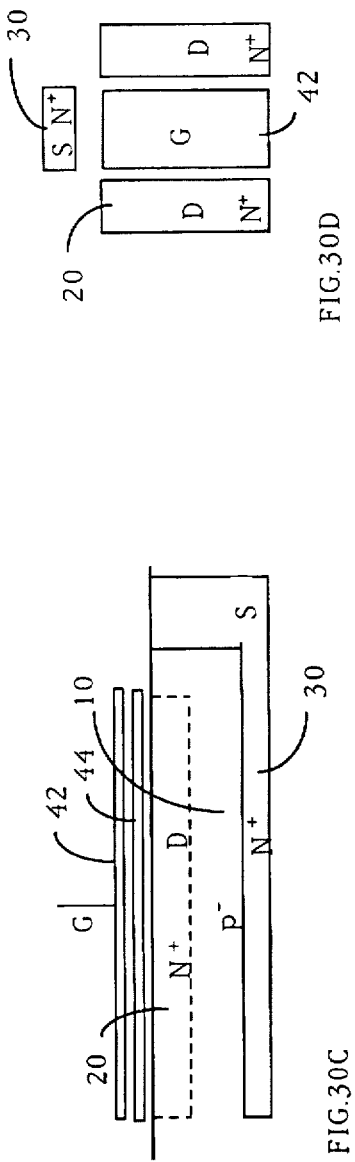
FIG.30C
FIG.30E

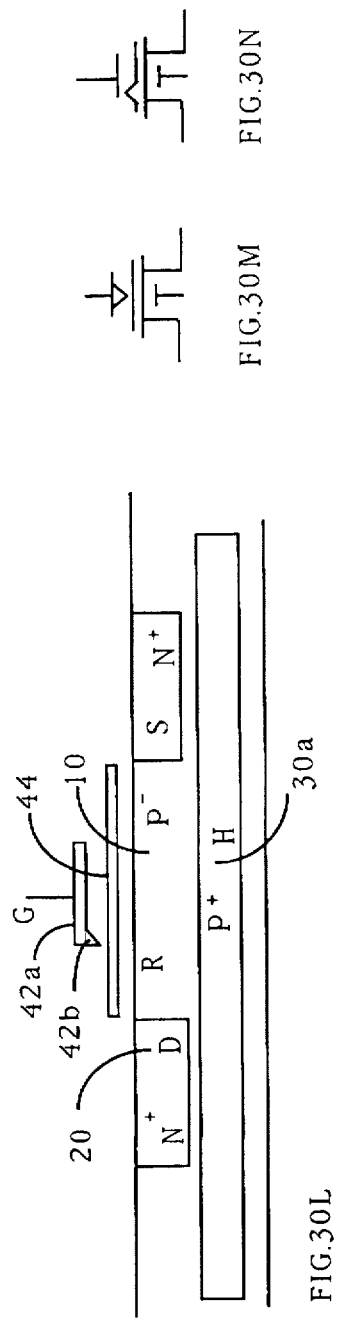
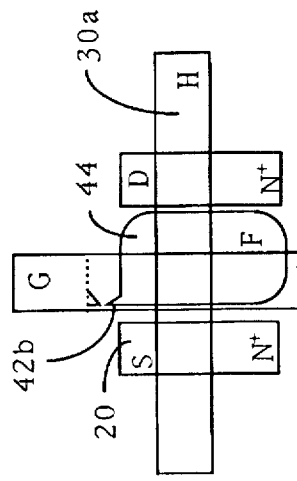
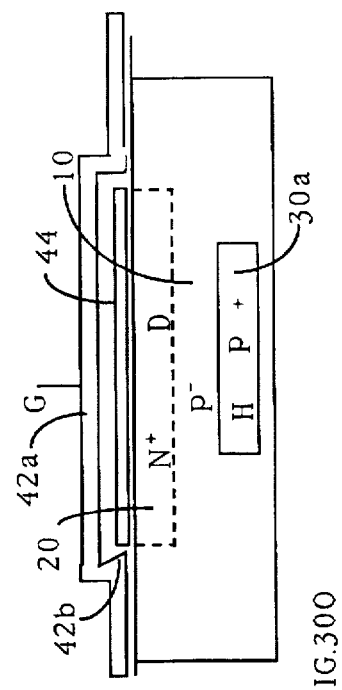
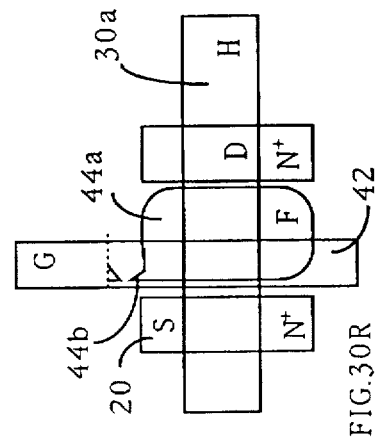
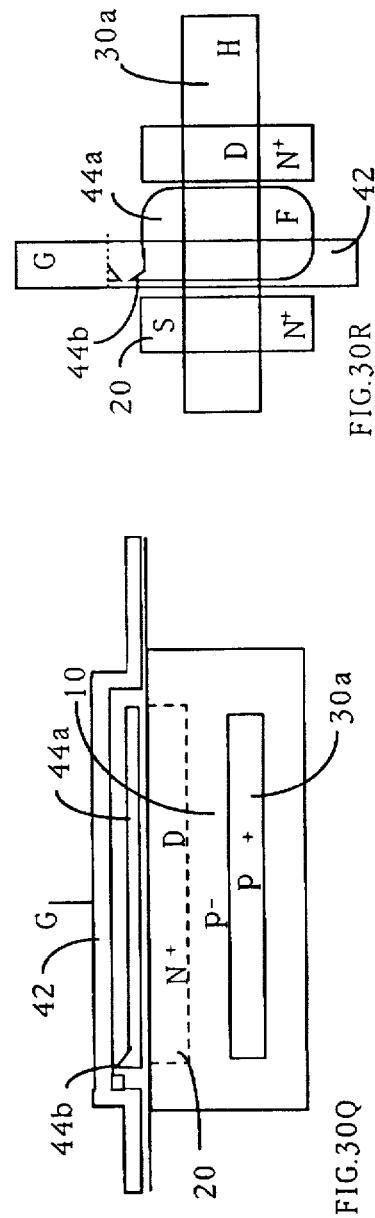

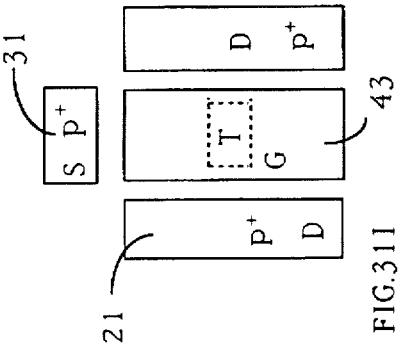
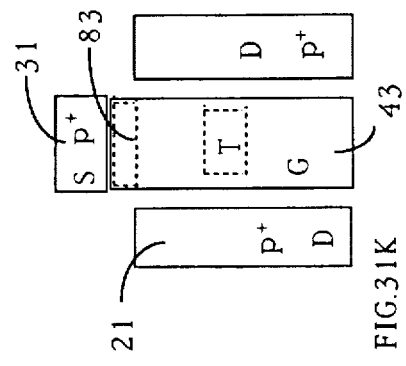
FIG.31I
FIG.31K
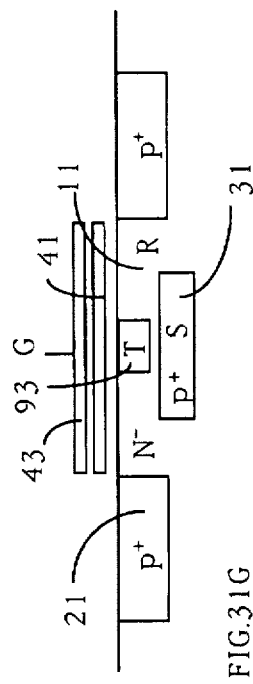
FIG.31G
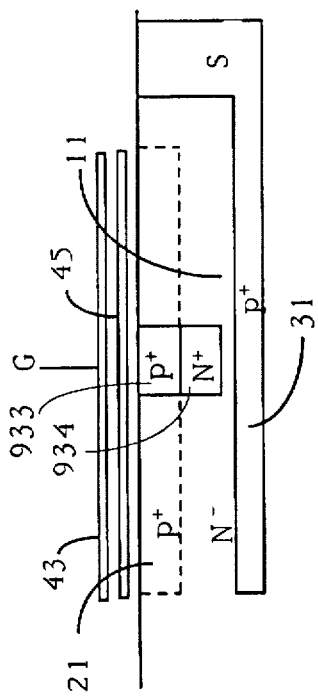
FIG.31H
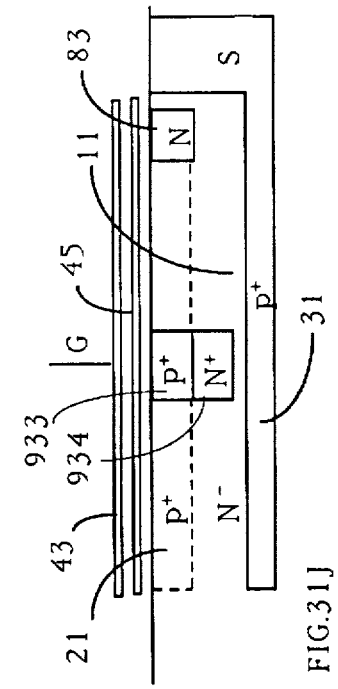
FIG.31J

UNI-DIRECTIONAL FLASH DEVICE

This is a continuation-in-part of Ser. No. 08/419,503, filed Apr. 10, 1995, now abandoned, which is a continuation-in-part of Ser. No. 07/932,916, filed Sep. 9, 1992, now abandoned, which is a continuation-in-part of Ser. No. 07/439,200, filed Nov. 20, 1989 now abandoned.

BACKGROUND—FIELD OF INVENTION

This invention is related to a field effect current injecting unidirectional flash device.

BACKGROUND—DESCRIPTION OF PRIOR ART

The CMOS VLSI has the tremendous I/O problems. The CMOS output ground bounce generates the false signal on the TTL input. So the BiC-MOS process was developed to integrate both bipolar and CMOS on the same chip. CMOS is used as the logic inside the core; bipolar used as the output buffers in the peripheral. However, the increment of complexity of the process reduces the yield and increases the cost.

The advantage of the bipolar is the unidirectional current, i.e., the current flowing from the emitter to collector is much larger than the current flowing from the collector to emitter. The uni-direction current has the anti-ground bounce capability. The disadvantage of the bipolar is the static base current. The advantage of the MOS device is the field controlled with gate voltage. The disadvantage of MOS device is the bidirectional current. During the ground-bounce, the output low will generate the false high signal.

So far, there is no effort to generate a new device which has the good characteristics of CMOS and bipolar device: field controlled with gate voltage as the CMOS and the anti-ground-bounce unidirectional current as the bipolar with current injection. The vertical charge coupling MOS device of Moshsen's patent 4,471,368 doesn't have the sufficient driving capability and high speed as the bipolar device does. The carriers accumulated under the gate reduces the field in the bulk of channel region. The gate and the accumulated charges are constituted of the capacitor. I invent the current injecting flash device to solve the above problems. Due to the novel structure of the flash device, the current flowing from the source to the drain is much much larger than the current flowing from the drain to the source. The injecting current uses the contact to inject the current into the intermediate active/river region. The contact has the focus effect to have the field penetrating into the bulk region in depth. With the L-shaped drain and source, the local strong field will induce the carrier to flow from the source to drain through the bulk region directly. The carriers are not necessary to flow to the surface region beneath the gate. It will elinimate the capacitor effect which blocks the field to penetrate into the bulk of river region. This contact technology is developed by us in the BiMOS device Patent 5,198,691. This invention is the further enhancement of the original patent.

Furthermore,waiting for the formation of channel is the cause of the switch delay of the traditional CMOS device. The flash device still can conduct the current during the fast switching transient process even the gate voltage is below the threshold voltage. In the transient process, the formation of channel can induce the displacement current to drive the output load. It does not need to wait the formation of channel to conduct the channel current.

The flash device is three-layer device, NPN or PNP structure. The flash device doesn't have the lightly doped drain region. The flash device can adjust the depth of the source to avoid the hot electron problem. It doesn't need the four layers structure as the DMOS does. The DMOS has to use the lightly doped drain region to avoid the hot electron problem. The DMOS uses the double diffusion process. It has the channel region [is] as narrow as the bipolar device does. It induces the control problem of threshold voltage. However, the flash device doesn't use the double diffusion process that the threshold voltage is under good control.

Due to the novel structure, [the flash device has no substrate current. So] the flash device doesn't have the latch-up problem as the CMOS does. The distance between devices can be substantially reduced. The layout area of flash device is much more compact than the CMOS device.

Furthermore, all the memory devices, such as the EPROM and EEPROM devices, made of the MOS technology can be applied to the flash device to have the flash EPROM and flash EEPROM device. Since the carriers flow upward toward the gates directly. So the speed to write into memory is much faster than the MOS EPROM and MOS EEPROM devices.

In summary, the flash device is a novel device which is different from the traditional devices. The flash device is a unipolar, uni-direction device. The MOS device is a unipolar, bi-direction device. The bipolar is a bipolar, uni-direction device. The bipolar device has the base current [to] consum [e]ing a lot of driving power and has a small input impedance. While the flash device has the zero static gate current and very large input impedance as CMOS does. With the advantages mentioned above, the flash device is the next generation of sub-micrometer device.

Objects and Advantages

The flash device is a delayless uni-direction gate controlled current injecting device which is suitable for the next generation sub-micrometer ULSI(Ultra Large System Integration) device.

DRAWING FIGURES

FIG. 1 (A) is the cross section alignment of the flash device having vertical charge coupling effect only; (B) is the side view of the flash device having vertical charge coupling effect only; (C) is the cross section alignment of the flash device having both vertical charge coupling effect and current injecting effect; (D) is the side view of the flash device having vertical charge coupling effect and current injecting effect; (E) is the top view of the layout of the flash device having vertical charge coupling effect and current injecting effect.

FIG. 2 (A) is the cross section alignment of the N type flash device having vertical charge coupling effect only; (B) is the side view of the N type flash device having vertical charge coupling effect only; (C) is the top view of the layout of the N type flash device having vertical charge coupling effect only; (D) is the symbol for the multiple fanouts of N type flash device; (E) is the cross section alignment of the N type flash device having vertical charge coupling effect and current injecting effect; (F) is the side view of the N type flash device having vertical charge coupling effect and current injecting effect; (G) is the top view of the layout of the N type flash device having vertical charge coupling effect and current injecting effect.

FIG. 3 (A) is the cross section alignment of the P type flash device having vertical charge coupling effect only; (B) is the side view of the P type flash device having vertical charge coupling effect only; (C) is the top view of the layout of the P type flash device having vertical charge coupling effect only; (D) is the symbol for the multiple fanouts of P type flash device; (E) is the cross section alignment of the P type flash device having vertical charge coupling effect and current injecting effect; (F) is the side view of the P type flash device having vertical charge coupling effect and current injecting effect; (G) is the top view of the layout of the P type flash device having both vertical charge coupling effect and current injecting effect.

FIG. 4 is the energy band diagram of N type flash device having both vertical charge coupling effect and current injecting effect; (A) is the one dimensional simplified model for flash device; (B) is the energy band diagram before the the formation of channel; (C) is the energy band diagram during the transition process of the formation of the channel; (D) is the energy band diagram after the formation of the channel.

FIG. 5 is the energy band diagram of P type flash device having both vertical charge coupling effect and current injecting effect; (A) is the one dimensional simplified model for flash device; (B) is the energy band diagram before the the formation of channel; (C) is the energy band diagram during the transition process of the formation of the channel; (D) is the energy band diagram after the formation of the channel.

FIG. 6 for the flash device having both vertical charge coupling effect and current injecting effect (A) is the potential curve of the flash device as the gate is turned on; (B) is the stream line of the carrier, either holes or electrons.

FIG. 7 for the flash device having both vertical charge coupling effect and current injecting effect (A) is the potential curve of the flash device without the drain; (B) is the electrical field of the flash device without the drain.

Figure 2C:
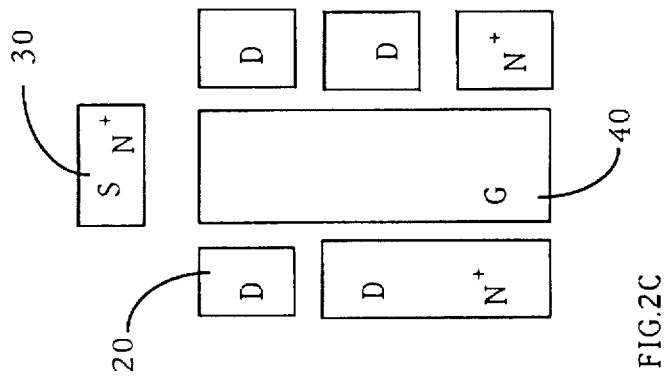
Figure 2D:
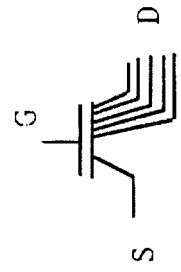
Figure 2A:
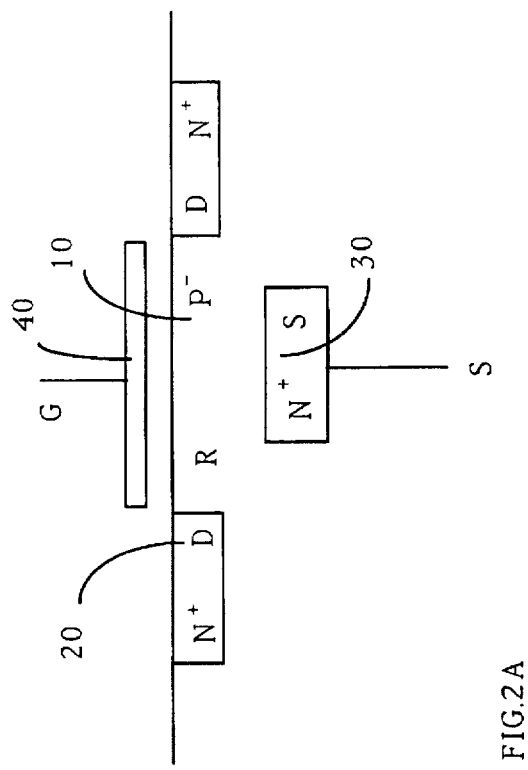
Figure 2B:
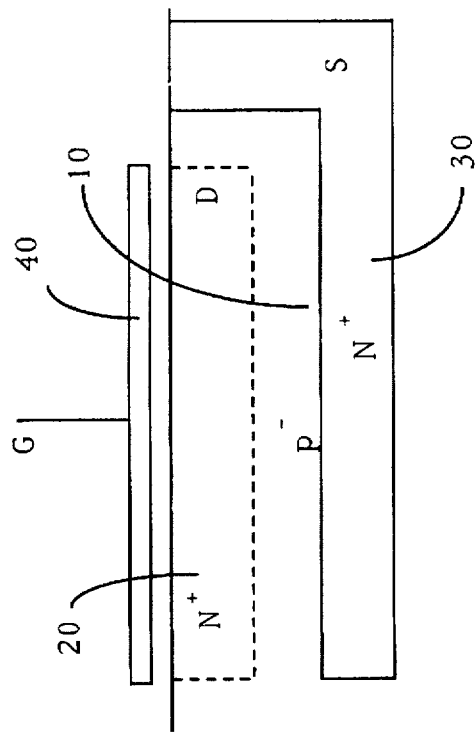
Figure 2G:
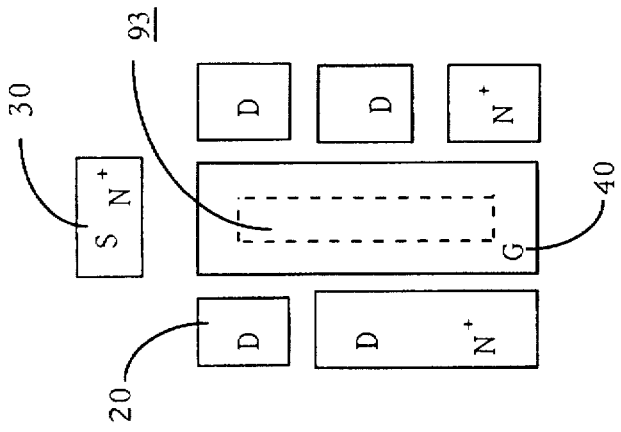
Figure 2E:
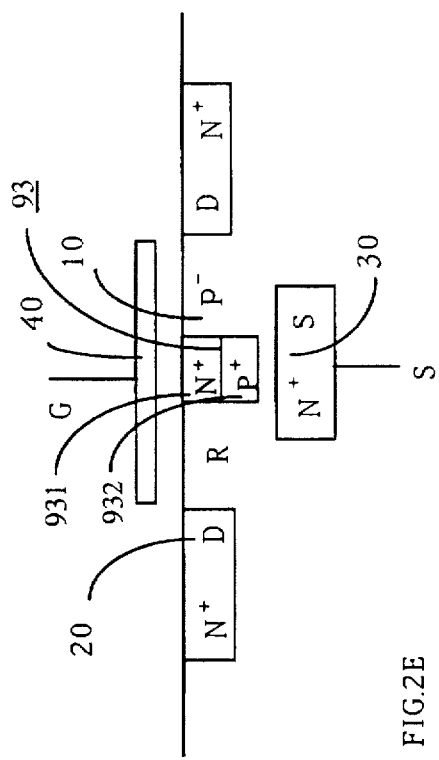
Figure 2F:
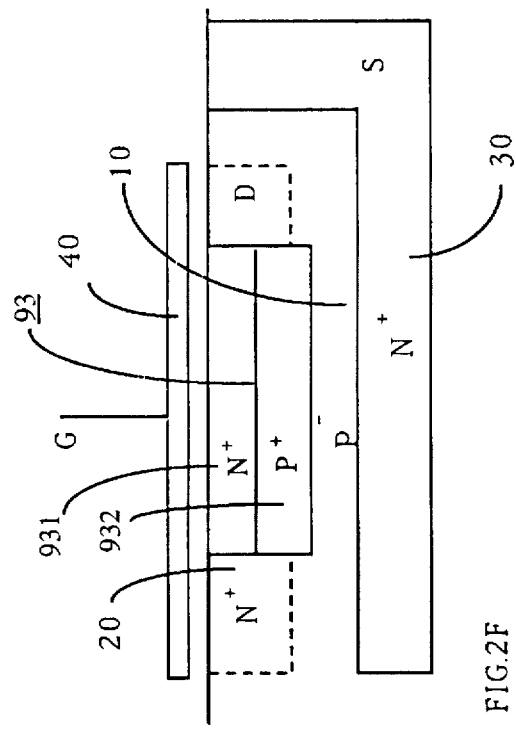

FIG. 10 (A) is the N type flash device having vertical charge coupling effect only with the envelop of the N isolation layer for the system integration; (B) is the P type flash device having vertical charge coupling effect only with the envelop of the P isolation layer for the system integration; (C) is the N type flash device having both having vertical charge coupling effect and current injecting effect with the envelop of the N isolation layer for the system integration; (D) is the P type flash device having both having vertical charge coupling effect and current injecting effect with the envelop of the P isolation layer for the system integration.

FIG. 11 (A) is the N type flash device having vertical charge coupling effect only with the envelop of the P isolation layer for the system integration; (B) is the P type flash device having vertical charge coupling effect only with the envelop of the N isolation layer for the system integration; (C) is the N type flash device having both having vertical charge coupling effect and current injecting effect only with the envelop of the P isolation layer for the system integration; (D) is the P type flash device having both having vertical charge coupling effect and current injecting effect with the envelop of the N isolation layer for the system integration.

FIG. 12 (A) is the twin-well complementary flash device having vertical charge coupling effect only made of the N type flash device with the envelop of the N isolation layer and the P type flash device with the envelop of the P isolation layer; (B) is the twin-well complementary flash device having vertical charge coupling effect only made of the N type flash device with the envelop of the P isolation layer and the P type flash device with the envelop of the N isolation layer; (C) is the twin-well complementary flash device having both having vertical charge coupling effect and current injecting effect made of the N type flash device with the envelop of the N isolation layer and the P type flash device with the envelop of the P isolation layer; (D) is the twin-well complementary flash device having both having vertical charge coupling effect and current injecting effect made of the N type flash device with the envelop of the P isolation layer and the P type flash device with the envelop of the N isolation layer.

FIG. 13 (A) is the complementary flash device with vertical charge coupling effect only having the P substrate with N isolation layer; (B) is the twin-well complementary flash device with vertical charge coupling effect only having the N substrate with P isolation layer; (C) is the complementary flash device with vertical charge coupling effect and current injecting effect having the P substrate with N isolation layer; (D) is the twin-well complementary flash device with vertical charge coupling effect and current injecting effect having the N substrate with P isolation layer.

FIG. 14 (A) is the complementary flash device with vertical charge coupling effect only having the P substrate; (B) is the twin-well complementary flash device with vertical charge coupling effect only having the N substrate; (C) is the complementary flash device with vertical charge coupling effect and current injecting effect having the P substrate; (D) is the twin-well complementary flash device with vertical charge coupling effect and current injecting effect having the N substrate.

FIG. 15 is the table making the comparisons among the flash device, CMOS device, DMOS device and bipolar device.

FIG. 16 (A) is the switch delay of CMOS; (B) is the formation of channel; (C) is the current flowing through the channel after the formation of the channel.

FIG. 17 (A) is the neglible switch delay of flash device having vertical charge coupling effect and current injecting effect; (B) is the induced current during the formation of channel; (C) is the streamline of current after the formation of channel.

FIG. 18 (A) is the CMOS device with the substrate serving as isolation layer; (B) is voltage distribution along the channel; (C) is the current region of CMOS device.

FIG. 19 (A) is the section view of DMOS device; (B) is the voltage distribution curve along the channel and the lightly doped region; (C) is the current region of the DMOS device.

FIG. 20 (A) is the section view and current pattern of the flash device having vertical charge coupling effect only; (B) is the voltage distribution along the "river", the horizontal section line in FIG. 20A; (C) is the "river region" of flash device; (D) is the section view and current pattern of the flash device having vertical charge coupling effect and current injecting effect; (E) is the voltage distribution along the "river", the horizontal section line in FIG. 20D; (F) is the "river region" of flash device as shown in FIG. 20D.

FIG. 21 (A) is the flash device having the L-shaped source with vertical charge coupling effect and current injecting effect; (B) is the top view of the layout of the flash device having the L-shaped source with vertical charge coupling effect and current injecting effect; (C) is the N flash device with vertical charge coupling effect and current injecting effect having the L-shaped source having the reactive river region been enwraped by both source and drain; (D) is the P flash device with vertical charge coupling effect and current injecting effect having the L-shaped source having the reactive river region been enwraped by both source and drain; (E) is the flash device having the L-shaped source with vertical charge coupling MOS effect and current injecting bipolar effect; (F) is the N flash device with vertical charge coupling MOS effect and current injecting bipolar effect having the L-shaped source having the reactive river region been enwraped by both source and drain; (G) is the P flash device with vertical charge coupling MOS effect and current injecting bipolar effect having the L-shaped source having the reactive river region been enwraped by both source and drain; (H) is the modifided flash device to serve as the single device active pixel cell; (I) is the equivalent circuit of the single device active pixel cell as shown in FIG. 21K; (J) is the alternative design of the single device active pixel cell as shown in FIG. 21K with the different connections; (K) is the N type single device active pixel cell which is corresponding to FIG. 21I and FIG. 21J; (L) is the P type single device active pixel cell; (M) is the modifided flash device having the bipolar mechanism to serve as the single device active pixel cell; (N) is the equivalent circuit of the single device active pixel cell as shown in FIG. 21P; (O) is the alternative design of the single device active pixel cell as shown in FIG. 21P with the different connections; (P) is the N type single device active pixel cell which is corresponding to FIG. 21N and FIG. 21O; (Q) is the P type single device active pixel cell as shown in FIG. 21M.

FIG. 22 is the another alternative design of L-shape-source flash device having the high threshold channel region; (A) is the section view; (B) is the top view of the layout of flash device; (C) is section view of N flash device; (D) is section view of P flash device having the L-shaped source with the reactive river region being enwraped by both source and drain; (E) is the section view having vertical charge coupling effect and current injecting effect; (F) is the top view of the layout of flash device having vertical charge coupling effect and current injecting effect; (G) is section view of N flash device having vertical charge coupling effect and current injecting effect; (H) is section view of P flash device having vertical charge coupling effect and current injecting effect with the L-shaped source with the reactive river region being enwraped by both source and drain; (I) is the section view having vertical charge coupling bipolar effect; (J) is section view of N flash device having vertical charge coupling bipolar effect; (K) is section view of P flash device having vertical charge coupling bipolar effect and the L-shaped source with the reactive river region being enwraped by both source and drain; (L) is the section view having vertical charge coupling and current injecting bipolar effect; (M) is section view of N flash device having vertical charge coupling and current injecting bipolar effect; (N) is section view of P flash device having vertical charge coupling and current injecting bipolar effect; the L-shaped source and L-shaped drain with the reactive river region are enwraped by both source and drain.

FIG. 23 (A) is the vectors of the electrical field of the flash device having the L-shaped source; (B) is the streamlines of carrier for the flash device having the L-shaped source; (C) is the vectors of the electrical field of the flash device having the L-shaped source with high-threshold voltage channel region near the source; (D) is the streamlines of carrier for the flash device having the L-shaped source with high-threshold voltage channel region near the source; (E) is the vectors of the electrical field of the flash device having the L-shaped source and L-shaped drain with with vertical charge coupling and current injecting effects and high-threshold voltage channel region near the source; (F) is the streamlines of carrier for the flash device having the L-shaped source and L-shaped drain with vertical charge coupling and current injecting effects and high-threshold voltage channel region near the source.

FIG. 24 (A) is the twin-well complementary flash device having vertical charge coupling and current injecting effects made of L-shape source N type flash device with the envelop of the N isolation layer and the P type flash device with the envelop of the P isolation layer; (B) the flash device having vertical charge coupling and current injecting effects has high threshold voltage channel portion near the source; (C) is the twin-well complementary flash device having vertical charge coupling bipolar effects made of L-shape source and L-shape drain N type flash device with the envelop of the N isolation layer and the P type flash device with the envelop of the P isolation layer; (D) is the twin-well complementary flash device having vertical charge coupling and current injecting bipolar effects made of L-shape source and L-shape drain N type flash device with the envelop of the N isolation layer and the P type flash device with the envelop of the P isolation layer.

FIG. 25 (A) is the twin-well complementary flash device made of L-shape source N type flash device with the envelop of the P isolation layer and the P type flash device with the envelop of the N isolation layer; (B) the flash device has high threshold voltage channel portion near the source; (C) is the twin-well complementary flash device having vertical charge coupling and current injecting effects made of L-shape source N type flash device with the envelop of the P isolation layer and the P type flash device with the envelop of the N isolation layer; (D) the flash device having vertical charge coupling and current injecting effects has high threshold voltage channel portion near the source.

FIG. 26 (A) is the complementary flash device having the P substrate with N isolation layer; (B) is the twin-well complementary flash device having the N substrate with P isolation layer; (C) is the complementary flash device having vertical charge coupling and current injecting effects with the P substrate and N isolation layer; (D) is the twin-well complementary flash device having vertical charge coupling and current injecting effects with the N substrate and P isolation layer.

FIG. 27 (A) is the complementary flash device having the N substrate; (B) is the twin-well complementary flash device having the P substrate; (C) is the complementary flash device having vertical charge coupling and current injecting effects with the N substrate; (D) is the twin-well complementary flash device having vertical charge coupling and current injecting effects with the P substrate.

FIG. 28 (A) is the complementary flash device with high threshold voltage channel portion near the source having the P substrate and N isolation layer; (B) is the twin-well complementary flash device having the N substrate and P isolation layer; (C) is the complementary flash device having vertical charge coupling and current injecting effects with high threshold voltage channel portion near the source having the P substrate and N isolation layer; (D) is the twin-well complementary flash device having vertical charge coupling and current injecting effects with the N substrate and P isolation layer.

FIG. 29 (A) is the complementary flash device with high threshold voltage channel portion near the source having the P substrate; (B) is the twin-well complementary flash device having the N substrate; (C) is the complementary flash device having vertical charge coupling and current injecting effects with high threshold voltage channel portion near the source with the P substrate; (D) is the twin-well complementary flash device having vertical charge coupling and current injecting effects with the N substrate.

FIG. 30 (A) is the section view of the EEPROM made of the N type flash device; (B) is the symbol of the N type flash EEPROM device; (C) is the longitudial section view of the flash EEPROM device; (D) is the top view of the layout of the flash EEPROM device as shown in FIG. 30C ; (E) is the longitudial section view of the alternative design of the flash EEPROM device; (F) is the top view of the layout of the flash EEPROM device as shown in FIG. 30E; (G) is the section view of the EEPROM made of the N type flash device having vertical charge coupling and current injecting effects; (H) is the longitudial section view of the flash EEPROM device having vertical charge coupling and current injecting effects; (I) is the top view of the layout of the flash EEPROM device as shown in FIG. 30H ; (J) is the longitudial section view of the alternative design of the flash EEPROM device having vertical charge coupling and current injecting effects; (K) is the top view of the layout of the flash EEPROM device as shown in FIG. 30J; (L) is the super-flash EEPROM using the substrate capacitor to injecting the carriers into the floating gate with the needle pin field effect; (M) is the symbol for the super-flash EEPROM as shown in FIG. 30L which has the needle pin beneath the injecting gate; (N) is the symbol for the super-flash EEPROM as shown in FIG. 30Q which as the needle pin on the top of the float gate; (O) is the super-flash EEPROM having the needle pin beneath the injecting gate and the controlling gate being perpendicular to the channel length; (P) is the top view of the super-flash EEPROM as shown in FIG. 30O; (Q) is the super-flash EEPROM having the needle pin on the floating gate and the controlling gate being perpendicular to the channel length; (R) is the top view of the super-flash EEPROM as shown in FIG. 30Q; (S) is the super-flash EEPROM having the needle pin beneath the injecting gate and the controlling gate being parallel with the channel length; (T) is the top view of the super-flash EEPROM as shown in FIG. 30O; (U) is the super-flash EEPROM having the needle pin on the floating gate and the controlling gate being parallel with the channel length; (V) is the top view of the super-flash EEPROM as shown in FIG. 30Q.

FIG. 31 (A) is the section view of the EEPROM made of the P type flash device; (B) is the symbol of the P type flash EEPROM device; (C) is the longitudial section view of the flash EEPROM device; (D) is the top view of the layout of the flash EEPROM device as shown in FIG. 31 C ; (E) is the longitudial section view of the alternative design of the flash EEPROM device; (F) is the top view of the layout of the flash EEPROM device as shown in FIG. 31E; (G) is the section view of the EEPROM made of the P type flash device having vertical charge coupling and current injecting effects; (H) is the longitudial section view of the flash EEPROM device having vertical charge coupling and current injecting effects; (I) is the top view of the layout of the flash EEPROM device as shown in FIG. 31H; (J) is the longitudial section view of the alternative design of the flash EEPROM device having vertical charge coupling and current injecting effects; (K) is the top view of the layout of the flash EEPROM device as shown in FIG. 31J.

FIG. 32 (A) is the N type flash EEPROM with the side gate on the drain side; (B) is the N type flash EEPROM with the side gate on the source side; (C) is the P type flash EEPROM with the side gate on the drain side; (D) is the P type flash EEPROM with the side gate on the source side; (E) is the N type flash EEPROM having vertical charge coupling and current injecting effects with the side gate on the drain side; (F) is the N type flash EEPROM having vertical charge coupling and current injecting effects with the side gate on the source side; (G) is the P type flash EEPROM having vertical charge coupling and current injecting effects with the side gate on the drain side; (H) is the P type flash EEPROM having vertical charge coupling and current injecting effects with the side gate on the source side.

FIG. 33 (A) is the N flash EEPROM with the stepped control gate on the source side; (B) is the N flash EEPROM with the stepped contol gate on the drain side; (C) is the P flash EEPROM with the stepped control gate on the source side; (D) is the P flash EEPROM with the stepped contol gate on the drain side; (E) is the N flash EEPROM having vertical charge coupling and current injecting effects with the stepped control gate on the source side; (F) is the N flash EEPROM having vertical charge coupling and current injecting effects with the stepped contol gate on the drain side; (G) is the P flash EEPROM having vertical charge coupling and current injecting effects with the stepped control gate on the source side; (H) is the P flash EEPROM having vertical charge coupling and current injecting effects with the stepped contol gate on the drain side.

FIG. 34 (A) is the single gate flash EEPROM device; (B) is the alternative design of the single gate flash EEPROM device; (C) is the single gate flash EEPROM device having L-shape source and drain with bipolar effect; (D) is the single gate flash EEPROM device having vertical charge coupling and current injecting effects; (E) is the alternative design of the single gate flash EEPROM device having vertical charge coupling and current injecting effects; (F) is the single gate flash EEPROM device having vertical charge coupling and current injecting effects with L-shape source and drain and bipolar effect.

DESCRIPTION

Flash device is a delayless field-effect unidirectional device. The source region is directly under the gate. The region between the gate and source is controllable in the process. It eliminates the hot electron problem. During the channel formation, the major carriers are expelled toward the source. It induces the current to minimize the switch delay. It is the field effect device as the CMOS. However, it is [the] a uni-directional device as the bipolar device does. The current flowing from the source to the drain is much larger than the current flowing from the drain to the source. This unidirectional characteristics makes the flash device to be a very good device for output driver. The device process of flash device is comparable with the CMOS device. The operation of flash device is compatible to the CMOS device, too. The drain of flash device is operated as the drain of CMOS device; the source of flash device is operated as the source of the CMOS device; the gate of flash device is operated as the gate of the CMOS device. With the flash device, there is no more the need to use the bipolar device as the output device.

The CMOS device has bidirectional current flowing characteristics that the ground bounce is a serious problem for CMOS device. The bipolar device has the unidirectional property that the ground bounce problem is elinimated. However, bipolar device consumes a lot of power. The CMOS device consumes much less power. So the BiCMOS process is proposed to have both the bipolar output drivers and CMOS logic circuits to be integrated on the same chip.

Now the flash device has the hybrid characteristics of the bipolar device and the CMOS device—field controlled unidirectional device. There is no need for the more expensive BiCMOS process. Furthermore, our flash device has both voltage charge coupling effect and current injecting bipolar effect. The driving force is much stronger than the device having only the voltage charge coupling effect. There is no carrier traping defect as the device having only voltage charging coupling effect does.

The flash device is the compact 3D device. The compact 3D device has the pioneer work to be done in the DRAM field. However, the compact 3D DRAM device technology doesn't apply successfully to the CMOS device design. The attracted carriers accumulating beneath the gate constitutes the capacitor. In CMOS, the accumulated carriers are drained to drain very quickly and the source continues to supply the carriers. However, in the 3D device, the accumulated carriers block the field of gates penetrating into the bulk. So the current is much less. To overcome this field-blocking effect, the contact is in the middle of gate. It has several effect: (1) has the local concentrated strong field that most of the depletion region doesn't need to reach the buried source; (2) has the short travel distance in the high resistance bulk region; (3) for the L shaped source and drain, it induce the bipolar effect, i.e., the carrier flows from the source to drain directly.

For the flash device having no contact, the gate supposed to be biased for analog circuit and the layer thin/lightly enough doped for a depletion region formed under the gate to reach the buried source. For the flash device having contact, the gate is not necessary to be biased and the layer is not necessary to be thin/lightly enough doped for a depletion region formed under the gate to reach the buried source. The local concentration of the field and/or the injection of the current can reach the buried source easily. The contact effect has the "tunnel" effect to reach the buried source. As the carriers flow out the source induced by the "tunnel" effect of contact, most of the carriers flow to the L-shaped drian directly and some of the carriers flows through the "tunnel" and the channel beneath the gate to the drain as the traditional CMOS does. For the flash device having a contact, the operation of the flash device is the same as the CMOS device. Furthermore, to get rid of the capacitor effect of the accumulated carriers in the channel at the beginning of switch-on, the high threshold voltage regions can be implemented at the boundaries of the drains. In the middle portion of the channel, the field of the gate can penetrate into the intermediate river region first.

FIG. 1 shows the basic alignment of the flash device. The buried source (S) 3 is under the gate(G) 4. The drain(D) 2 is located along the edge of the gate(G) 4. FIG. 1A is the cross section view of the flash device along the channel length direction. The river region(R) enclosed [among] between the source(S) and drain(D) is the active region during the switch of the gate 4. FIG. 1B is the section view along the width of the gate 4 in FIG. 1A. The dotted line around the drain(D) 2 means that the drain(D) 2 is not located on [the line of] the same cross section. The source(S) is in the L-shape to make the connection from the surface. As the device gate 4 is switched on, the field reachs to the buried source 3. The carrier flows out the buried source 3 and flows to the drain 2. The interface between the river region 1 and the buried source 3 is a p-n junction diode. So, it is a uni-directional device. As this p-n junction diode is reverse biased, the current is stopped. Since the surface charges flowing in the surface channel beneath the gate 4 will constitute a capacitor with the gate. To minimize the surface charge capacitor effect, as shown in FIG. 1B, there is a gap between the gate 4 and the source 3. As the gate 4 switches on, there is no carrier flows out from the source through the surface channel directly. So the field of gate 4 can penetrate into the river region 1 to reach the buried source 3. For the flash device having no contact, to have the field of gate 4 to reach the buried source 3, the layer of the river region 1 is either lightly doped or thin. To eliminate the capacitor effect, the high threshold voltage regions may deposited at the neighborhood of drain to block the carriers flowing out the drains that the field of gate may penetrate into the river region 1. However, to have much higher operation speed and performance, we can deposit much highly doped region to be a contact in the middle of channel. Even though the above two methods have the similar profiles in density and field distributions, however, the later one's performance is improved a lot. FIG. 1C is the flash device having both voltage charge coupling and current injecting effects. The ohmic contact 93 transmits the carriers from the channel to the substrate 1. As the gate 4 is switched on, the contact 4 is connected with drain 2 and ejecting the current into the river region 1. This contact region 93 and river region 1 are in the same voltage level. The contact region 93 serves as the carrier conversion to bridge the drain 2 and the river region 1. The contact region 93 can eject the current into the river region. So the river region is not necessary to be thin or lightly doped. Furthermore, the contact 93 has the field focalizing effect. The contact can focus the field that the field can penetrate the river region 1 in depth to reach the buried source. So the flash device has high speed operation. FIG. 1D is the section view along the width of the gate 4 in FIG. 1C. FIG. 1E is the top view of the layout of the flash device. This layout pattern is one example of the layout pattern of the flash device. The drain(D) 2 are located along the edge of the gate(G) 4. For the flash device, the source(S) 3 is under the gate(G) 4.

FIG. 2 is the N type flash device. There are many applications and circuit connections for the N type flash device. For example , for the inverter type circuit, the source is connected to ground. The drain is connected to the output. The gate is connected to the input switching signal. For the logic circuit, there is no need to bias the gate. The drain(D) 20 can be made of the N diffusion in the P river region(R) 10. The drain 20 is connected to the drain electrode. For the logic circuit, the drain electrode might be connected to the output. FIG. 2B shows the longitudinal section along the channel width of the gate(G) 40. The L-shape source 30 is connected to the source electrode. For the logic circuit, the source electrode might be 0 volt. The horizontal segment of the L-shape source(S) 30 can be made of the N implantation. The vertical segment of the source(S) can be made of the N diffusion process. FIG. 2C shows the top view of the layout of flash device. Similar to the bipolar device, the flash device can have mutiple fan-outs with different driving capability. In FIG. 2C, the drain(D) is divided to be many segments. The driving capability is proportional to the width of the segment along the gate(G) 40. FIG. 2D is the symbol of the N-type flash device. The one branch on the left side represents the source(S). The multiple branches on the right side represent the fanouts of the drain(D). As the gate voltage 40 switching form logic low to logic high voltage, the electric field needs to reach the buried source 30. For the intermediate river region 10 having no contact, to reach the buried source 30, the intermediate river region 10 is either thin or lightly doped. As shown in FIG. 2E, FIG. 2F and FIG. 2G, the flash device having the ohmic contact 93 to have both voltage charge coupling and current injecting effects. The ohmic contact 93 is made of the high concentration N+ region 931 and high concentration P+ region 932. As the gate 40 is switched off, 0 volt, the contact 93 is float. This voltage of contact 93 and the river region 10 is less than one diode voltage above the voltage of the buried source 30. As the gate 40 is switched on, from 0 volt to 5 volt, the channel is formed beneath the gate. The channel makes the connection between the drain 20 and the contact 93. The voltage of the contact 93 and the river region 10 have the same voltage as the drain 20. For the intermediate river region 10 having contact, to reach the buried source 30, the contact 93 focalizes the electric field and injecting the current into the intermediate river region 10. The contact 93 is constituted of two highly doped N+ region 931 and the highly doped P+ region 932. For the interface between the highly doped regions, it becomes an ohmic contact. Furthermore, it has the carrier conversion effect. Under the voltage difference between the drain 20 and the source 30, the electron-hole pairs are generated in the contact 93. The electrons are ejected out of the N+ contact region 931 and flowing through the channel beneath the gate to the drain 20. The holes are ejected out of the P+ contact region 932 and flow into the river region 10. At the interface between the intermediate river region 10 and buried source 30, it is a forward biased diode. The current easily flows out of the buried source in the forward bias condition. The diode interface between the intermediate river10 and the buried source 30 causes the current flowing in one direction. It can be considered the unidirectional device being the CMOS gate connected with a diode in series. For the current injection device, the intermediate river region 10 is not necessary to be thin or lightly doped. As the gate 40 is applied with logic high voltage, 5 volts, the MOS mechanism opens the channel beneath the gate 40 to make the connection between the drain and contact. Under the voltage difference between the drain 20 and the buried source 30, the electron flowing out of the contact 93 through the channel to the drain and the holes are ejected out of the contact 93 through the intermediate river region 10 to the buried source 30.

Figure 3G:
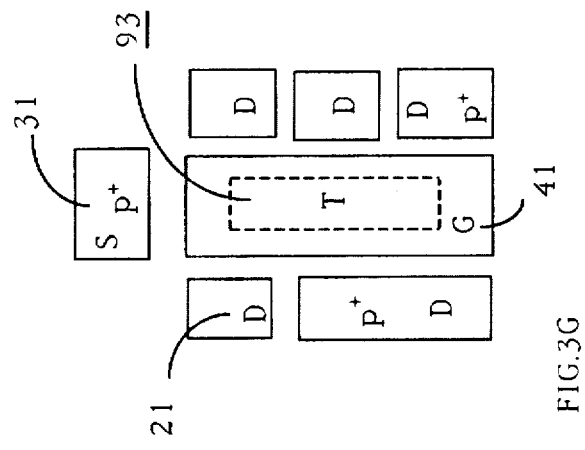
Figure 3E:
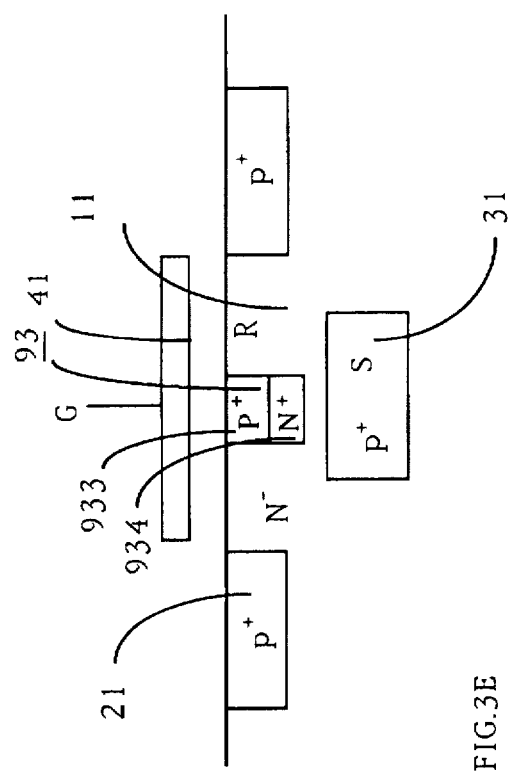
Figure 3F:
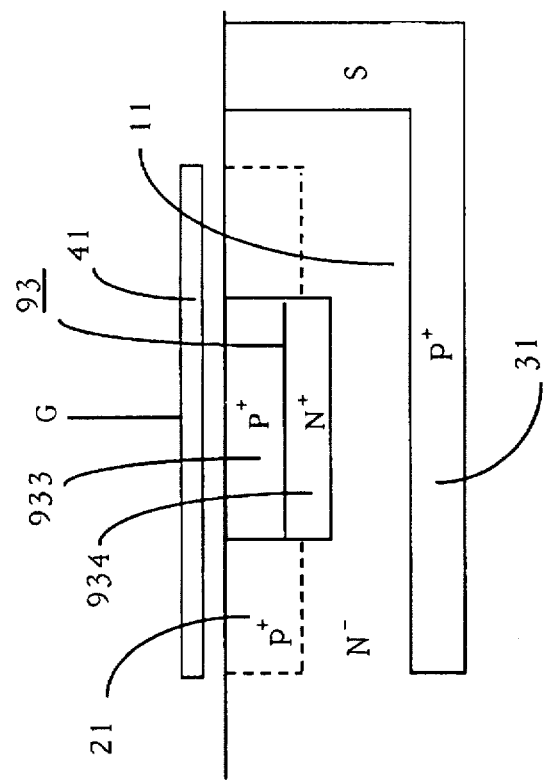

FIG. 3 is the P type flash device. There are many applications and circuit connections for the P type flash device. For example , for the inverter type circuit, the source is connected to power. The drain is connected to the output. The gate 41 is connected to the input switching signal. For the logic circuit, there is no need to bias the gate 41. The drain(D) 21 can be made of the P diffusion in the N river region(R) 11. FIG. 3B shows the longitudinal section along the channel width of the gate(G) 41. The horizontal segment of the L-shape source(S) 31 can be made of the P implanation. The vertical segment of the source(S) can be made of the P diffusion process. As the gate 41 switches from high to low, from 5 volts to 0 volts, the gate 41 is switched on. The field of the gate 41 penetrates into the river region 11. As the depletion region reached the buried source 31, the holes are attracted to flow out of the buried source 31 amd flows to the drain 21. For the river region 11 having no contact, the river region 11 is either to be thin layer or to be light doped. FIG. 3C shows the top view of the layout of flash device. Similar to the bipolar device, the flash device can have mutiple fanouts with different driving capability. In FIG. 3C, the drain(D) is divided to be many segments. The driving capability is proportional to the width of the segment along the gate(G) 41. FIG. 3D is the symbol of the P-type flash device. The one branch on the left side represents the source(S). The multiple branches on the right side represent the fanouts of the drain(D). The circle means the flash device being the P type flash device. As shown in FIG. 3E, FIG. 3F and FIG. 3G, the flash device having the ohmic contact 93 to have both voltage charge coupling and current injecting effects. The ohmic contact 93 is made of the high concentration P+ region 933 and high concentration N+ region 934. As the gate 41 is switched off, the gate voltage is 5 volt, the voltage of the contact 93 is one diode voltage below the voltage of buried source 31. As the gate switches on, switching from 5 volts to 0 volts, the channel of CMOS mechanism is formed to make the connection between the drain 21 and the contact 93. The contact 93 and the river region 41 has the same voltage level as the drain 21. Under the voltage difference of the drain 21 and the buried source 31, the hole-electron pairs are generated in the contact 93. The P+ contact region 933 ejects the holes into the channel beneath the gate 41 and N+ contact region 934 ejects the electrons into the river region 11. The electrons flows toward the buried source 31 and attracts the holes to flow out of the buried source 31. The interface of the river region 11 and the buried source 31 is constituted of a p-n junction diode. This diode connects in series with the PMOS mechanism beneath the gate 41. This p-n junction cuases the current flowing in uni-direction.

From FIG. 4 to FIG. 9 explain how a connection is achieved between the buried source 30 and contact 93. Depending on the device design, the ways to reach the buried source are different. For the device having no contact, to reach the buried source, the layer is either thin and/or the layer is lightly enough doped. For analog circuit with the device having no contact, the gate need to be biased properly. For the device having the contact, the local concentrated field is strong enough that the field and current inject to the buried source easily. The intermediate layer is not necessary to be thin or light doped.

FIG. 4 explains the working principle of the N flash device. FIG. 4A uses the simplified one dimensional diagram to illustrate the essential characteristics of the MOS having ohmic contact. From FIG. 4B to FIG. 4D are the energy band diagram of the one dimensional flash device under the different operations. In FIG. 4B, the flash device is off. The p-n junction between the river region 10 and the source (S) 30 causes the band energy having two different levels. In FIG. 4C, the gate switches on and the energy band is pulled down sharply at the boundary between river region and source 30. This is much different from the voltage charge coupling mechanism. In vertical charge coupling mechanism, the most sharp drop is at the boundary of the surface channel. The accelerating carriers impacting on the oxide isolation will introduce a lot of traps. In the current injecting mechanism, the carriers are accelerated much fast at the boundary of source. The device driving capability and speed are much faster. Furthermore, the carriers are attracted to the ohmic contact 93 instead of the oxide. It will not induce the trap defects. In FIG. 4C, the holes are expelled toward the source 30. During the transition of the formation of the channel under the gate 40, the expelled holes attract the electrons to flow across the depletion layer of the p-n junction. Even before the formation of the channel, it induces the current. The switch delay is reduced. After the formation of channel, in FIG. 4D, the energy barrier of p-n junction is reduced. A continuous electron current flows from the source across the barrier toward the channel.

FIG. 5 explains the working principle of the P flash device. FIG. 5A uses the simplified one dimension diagram to illustrate the essential characteristics. From FIG. 5B to FIG. 5D are the energy band diagram of the one dimensional flash device under the different operations. In FIG. 5B, the flash device is off. The p-n junction between the river region 11 and the source (S) 31 causes the band energy having two different levels. In FIG. 5C, the gate switches on and the energy band is pulled upward sharply at the boundary of river region 11 and source 31. The electrons are expelled toward the source 31. During the transition of the formation of the channel under the gate 41, the expelled electrons attract the holes to flow across the depletion layer of the p-n junction. Even before the formation of the channel, it induces the current. The switch delay is reduced. After the formation of channel, in FIG. 5D, the energy barrier of p-n junction is reduced. A continuous hole current flows from the source across the barrier toward the channel.

Figure 6A:
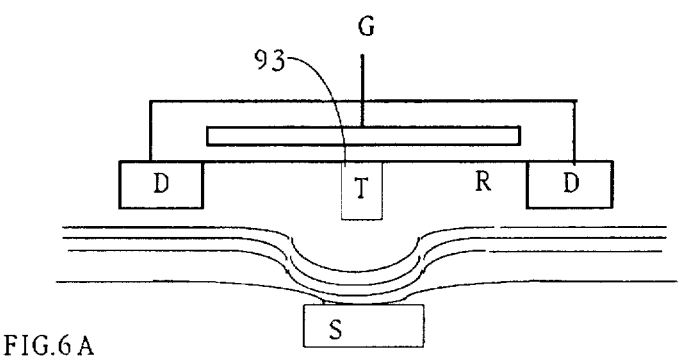
Figure 6B:
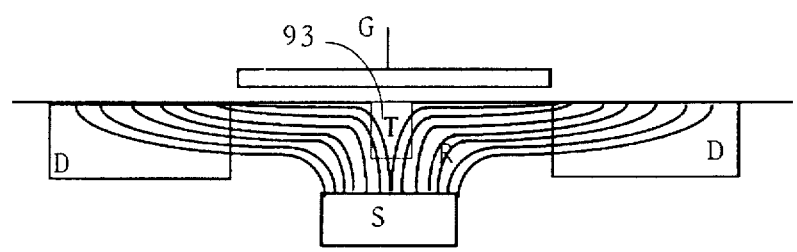

The flash device is 3D device. The actual working principles of flash devices have to use the two dimensional diagram to explain. FIG. 6 is the two dimensional diagram to explain the operation of the flash device. FIG. 6A is the potentional curves of constant voltage. The potential curves shows the sharp drop of voltage occuring at the boundary source. FIG. 6B is the streamlines of the flowing carriers, electrons or holes. It is referred to as the volume current. The carriers don't hit on the oxide directly that the trap defects don't occur. The pattern of current is volume current, not surface current. The current pattern is similar to the river. It is much different from the current pattern of CMOS. In the CMOS device, all the current flows beneath the gate. It is the surface current. The electrons flowing through the channel has the surface shield effect. The electric field cannot penetrates through the surface charges of the channel current that the substrate under the channel is at a constant voltage. So, the CMOS or DMOS devices don't have the volume current. Generally speaking, the device has the surface charges to be the channel current, the voltage is constant inside the volume(i.e., the substrate region under the channel region). It cannot have the volumn current. In other words, both CMOS and DMOS adopt the surface channel current mechanism. The voltage of substrate is constant and is biased at the voltage of ground, power supply or source. The CMOS and DMOS don't have the volumn current.

On the contrary, bipolar current is volume current. In bipolar device, the field is carried by the holes or electrons directly. The field is injected into the active base region with the carriers themselves. The field injected with the carriers can be injected into a narrow sheet region of base. However, it is at the cost of the power consumption of the base current. It causes the bipolar not suitable for the very large scale integration. To save the power consumption, instead of injecting the field with carrier, the flash device injects the field into the active river region with field induced by the gate voltage. However, the field injection cannot inject the electric field into the narrow region. So the ohmic contact is adopted to inject the carrier. The surface charges are removed quickly. The current caused by the surface charges is only a small amount of conductive current. Without the field shield of surface charges, the volume current is conductive to flow along the electric field.

Figure 7A:
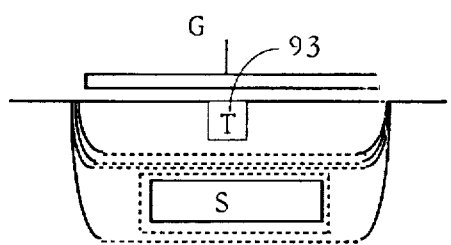
Figure 7B:
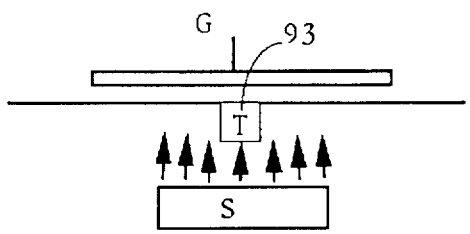
Figure 8:
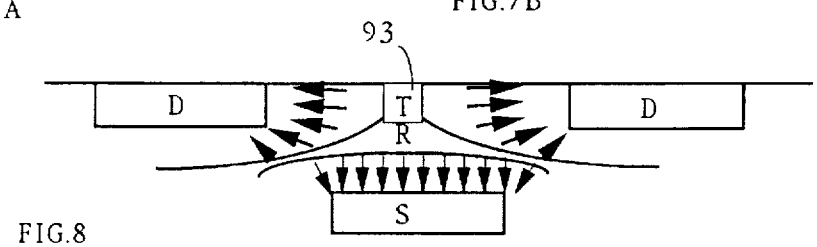
FIG. 8 is the potential curve and electrical field of the flash device without the gate.
Figure 9:
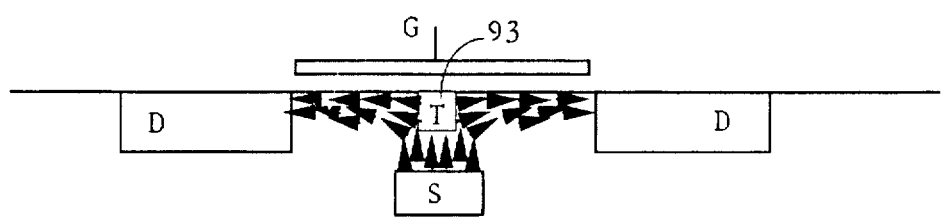
FIG. 9 is the electric field of the flash device which is the superposition of the electric fields of FIG. 7B and FIG. 8.

To understand the current pattern of the carrier, the working principles might be explained with the superposition of the fields. The flash device in FIG. 6 can be decomposed to the devices in FIG. 7 and FIG. 8. The field of FIG. 6 is the superposition of the fields in FIG. 7 and FIG. 8. In FIG. 7, there are the gate G, ohmic contact 93 and the source S. InFIG. 8, there are the drain D, ohmic contact 93 and source S. In FIG. 7, as the gate switches on, the potential curves of constant voltages are shown by the dotted lines. The vectors of the electrical field are shown by the arrows in FIG. 7B. In FIG. 8, the depletion layers are shown by the curve. The vectors of the electrical field in the depletion layer are shown by the arrows. FIG. 9 is the superposition of the vectors of the electrical field of FIG. 7B and FIG. 8. According to the electrical field in FIG. 9, the streamline of the electrical current is shown in FIG. 6B.

However, it is not only uni-polar current but also unidirectional current. Uni-polar current means the carriers are either electrons or holes, not both. Uni-directional means the current flowing from the source to the drain(forward current) is much larger than the current flowing from the drain to the source(reverse current). In the flash device, the reverse current is zero. The ratio of foward current to the reverse current is much larger than bipolar device. Consider the ground bounce problem in ouput buffer driver, the flash device is a better device than the bipolar device. However, flash device is as simple as CMOS device in every aspect. The device process of flash device is comparable with the device process of the CMOS device. So, with the flash device, there is no more need for the BiCMOS process. From FIG. 4, FIG. 5 and FIG. 6, as the gate switches on, the current flows from the source to the drain. However, the flowing direction from the drain to source is in the reverse direction of the field induced by the gate voltage. The current will not flow from the drain to source. So, the flash device is a uni-direction device. This characteristics is very important in the output driver design.

All the important characteristics of flash device have been simulated and confirmed with the device simulator PISCES program. So, the flash device is a real workable device for the semiconductor industry. It is one of the most important innovation since the invention of the transistor.

To implemennt the bi-direction transmission gate, two parallel N flash devices with the source of one flash device connected to the drain of the other flash device and vice versa; two parallel P flash devices with the source of one flash device connected to the drain of the other flash device and vice versa.

It is noted that the flash device is comparable with the CMOS device. The bi-direction transmission gate also can be implemented in the flash device process. Similar to the CMOS device, one of the drain can be changed to be the source; the source can be connected to either power supply or ground.

Figure 10A:
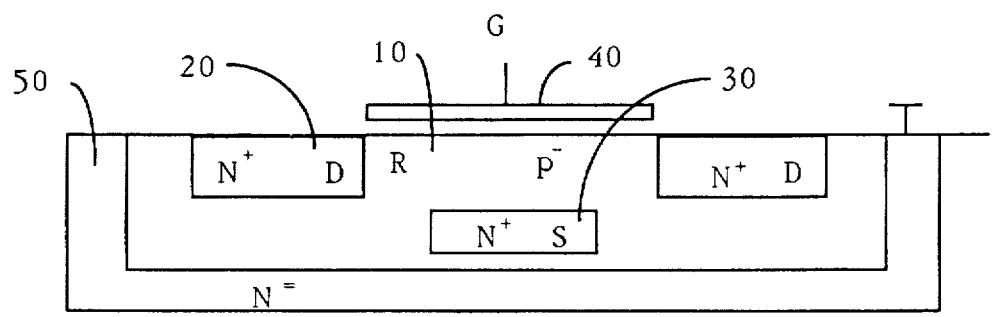
Figure 10B:
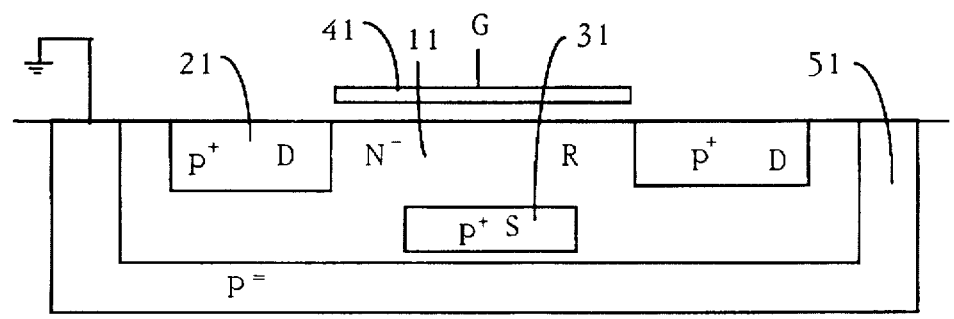
Figure 10C:
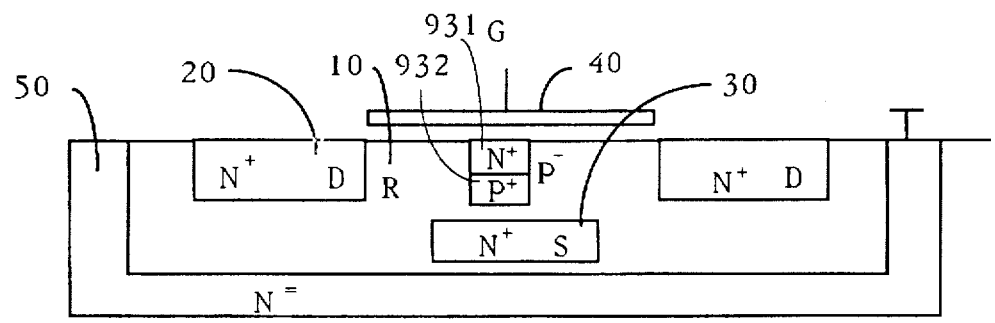
Figure 10D:
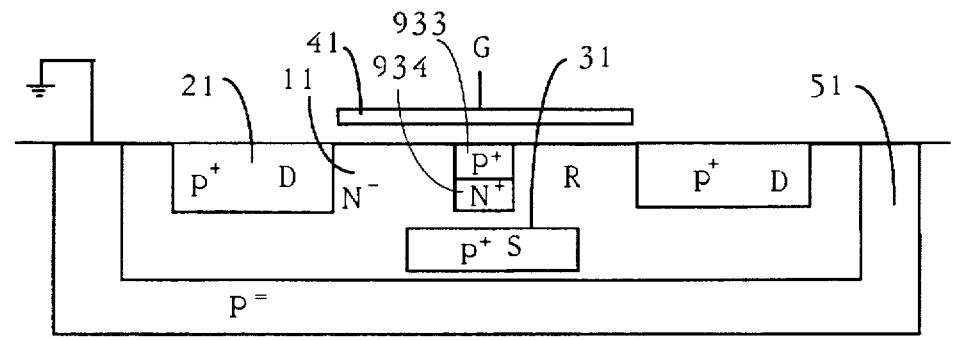
Figure 11A:
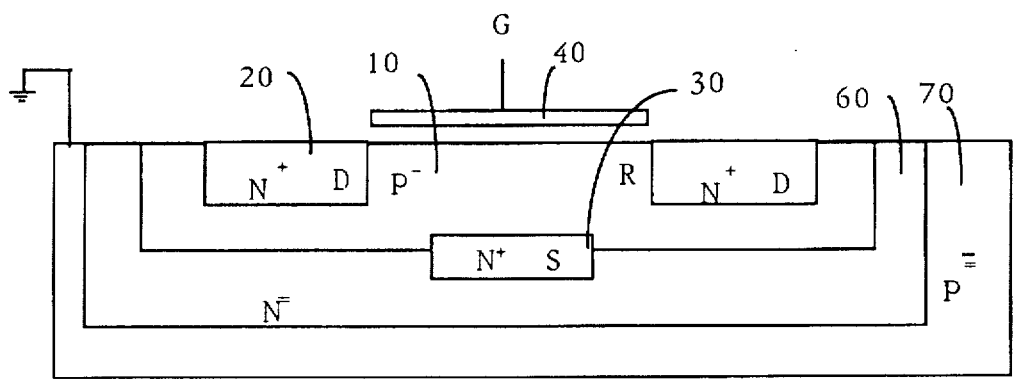
Figure 11B:
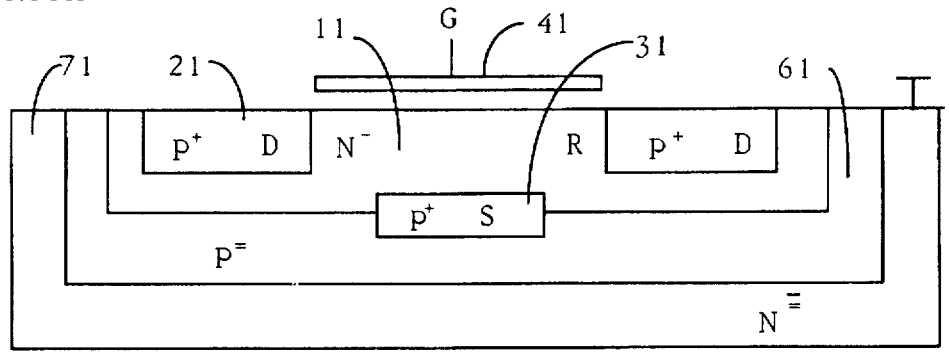
Figure 11C:
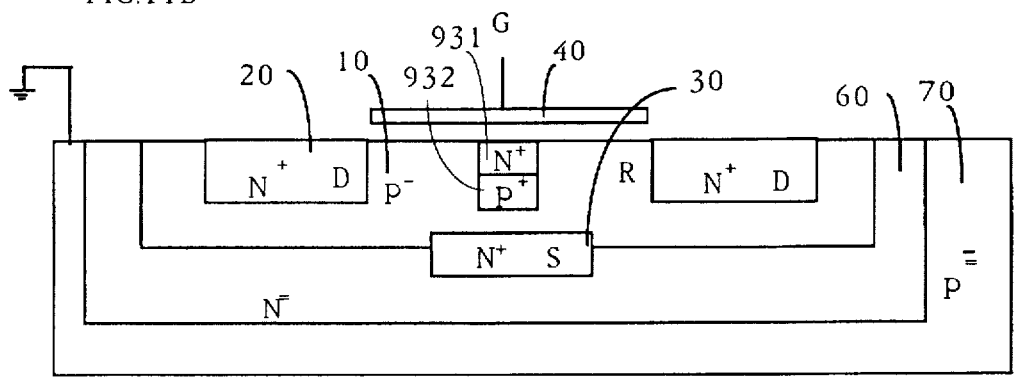
Figure 11D:
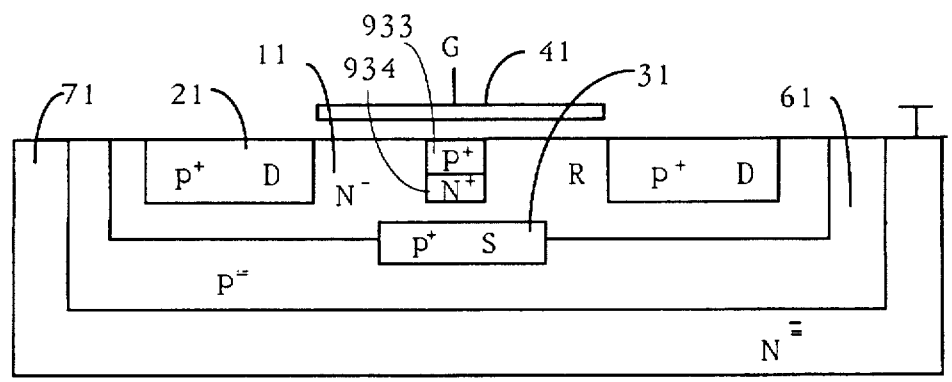

To have the very large scale system integration on the same chip, the device needs to have the insulation layers. The insulation layer of flash device is much different form the insulation layer of CMOS device. The flash device is volumn device; the CMOS device or DMOS device are the surface devices. So the insulation layer of the flash device is much different from the insulation layer of the CMOS device and DMOS device. FIG. 10 and FIG. 11 show the different designs for the insulation layer. FIG. 10A and FIG. 10C are the N flash device with N insulation layer; FIG. 11A and FIG. 11C are the N flash device with P insulation layer. FIG. 10B and FIG. 10D are the P flash device with P insulation layer; FIG. 11B and FIG. 11D are the P flash device with N insulation layer. However, the active river region is almost completely envelopped with the source and drain. It is noted that for the special cases, for example, the source is connected to the ground/power or the river region has large resistance. In such cases, the insulation layer of the flash device may be omitted for the simple layout without much degradation of the performance of the flash device. Here I use the rigorous approach that all the insulation layer is included to make sure that the flash device is well-isolated in the system integration. In FIG. 10A and FIG. 10C, all the drains(D) 20 and source(S) 30 are enveloped in the river region 10. The N insultaion layer 50 enwraps the P river region 10. In FIG. 10B and FIG. 10D, all the drains(D) 21 and source(S) 31 are enveloped in the river region 11. The P insultaion layer 51 enwraps the N river region 11. In FIG. 11A and FIG. 11C, the source(S) 30 contacts with the N region 60; the N region 60 enwraps the P river region 10. The P insulation 70 enwraps the N region 60. In FIG. 11B and FIG. 11D, the source(S) 31 contacts with the P region 61; the P region 61 enwraps the P river region 11. The N insulation 71 enwraps the P region 61.

Figure 12A:
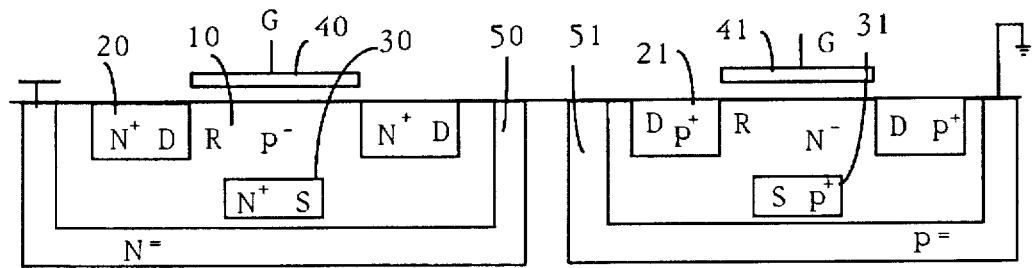
Figure 12B:
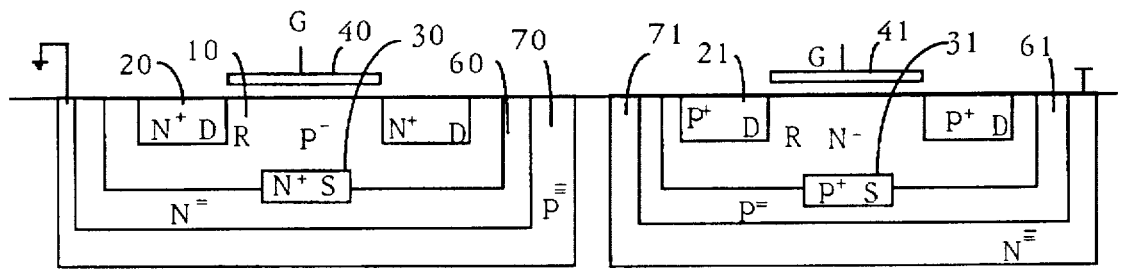
Figure 12C:
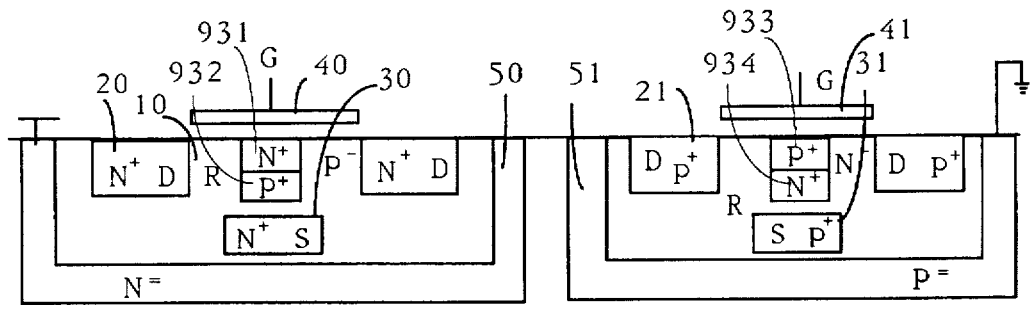
Figure 12D:
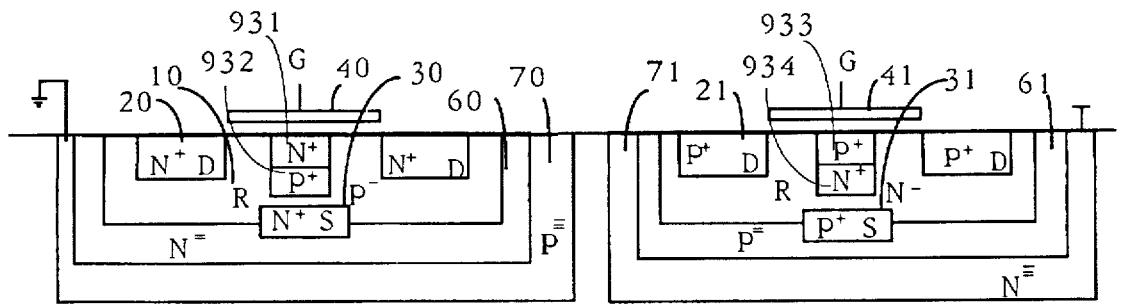
Figure 13A:
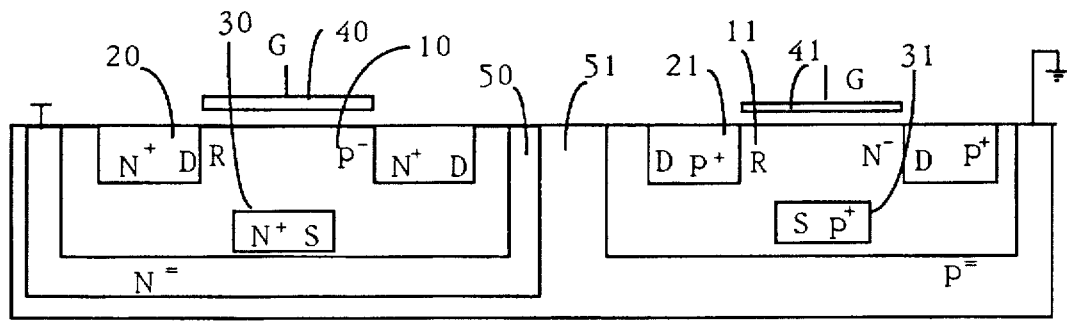
Figure 13B:
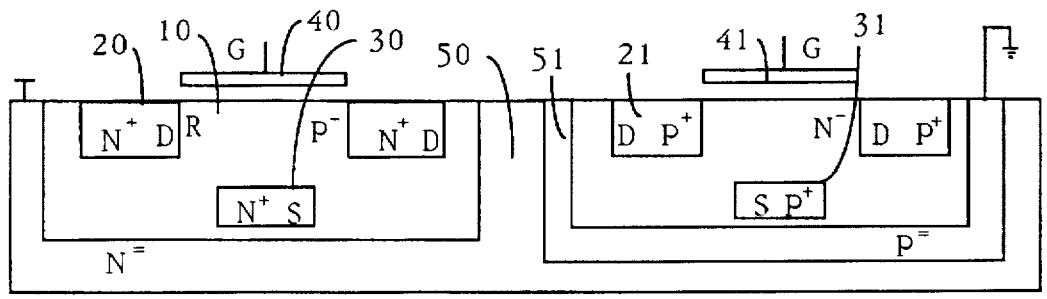
Figure 13C:
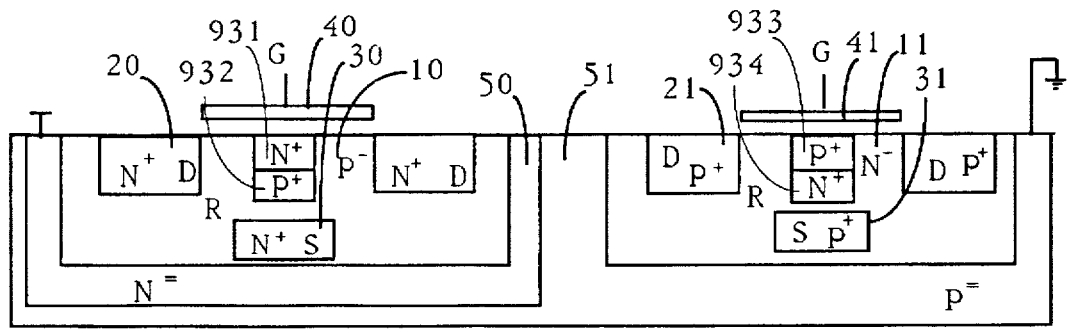
Figure 13D:
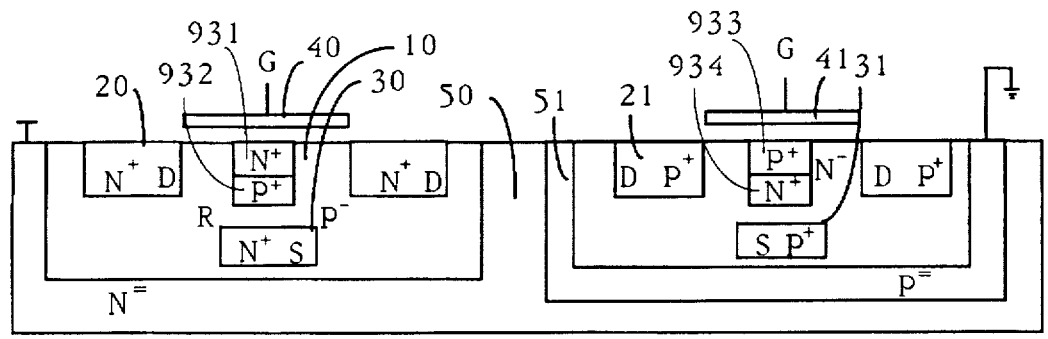

FIG. 12A and FIG. 12C are the twin-well complementary flash device made of the N flash device in FIG. 10A and the P flash device in FIG. 10C. FIG. 12B and FIG. 12D the twin-well complementary flash device made of the N flash device in FIG. 11A and the P flash device in FIG. 11C. FIG. 13A and FIG. 13C are the complementary flash devices embedded in the P type substrate 51. FIG. 13B and FIG. 13D are the complementary flash devices embeded in the N type substrate 50.

Figure 14C:
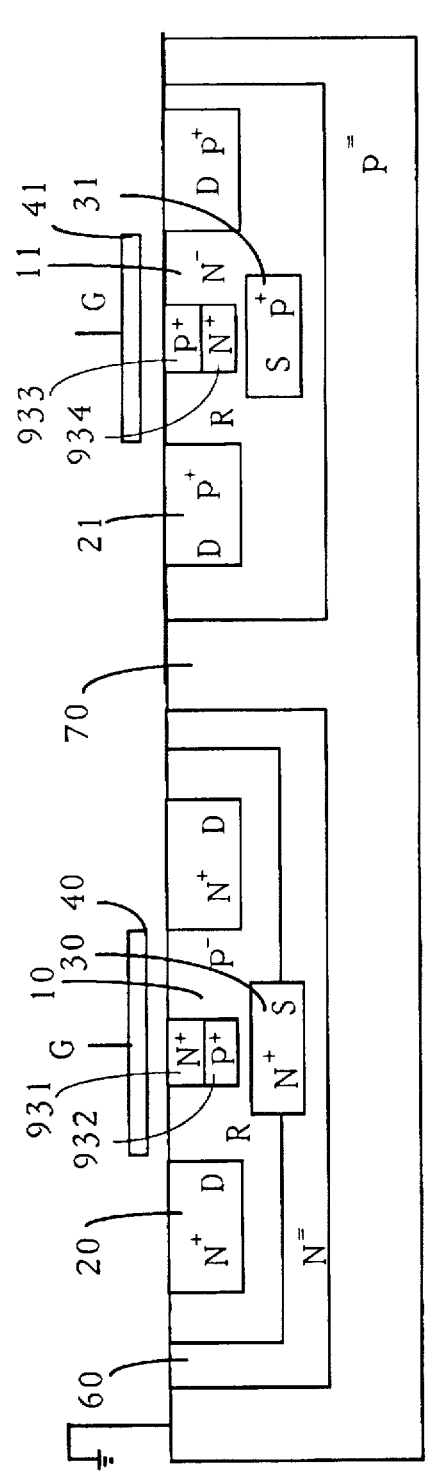
Figure 14D:
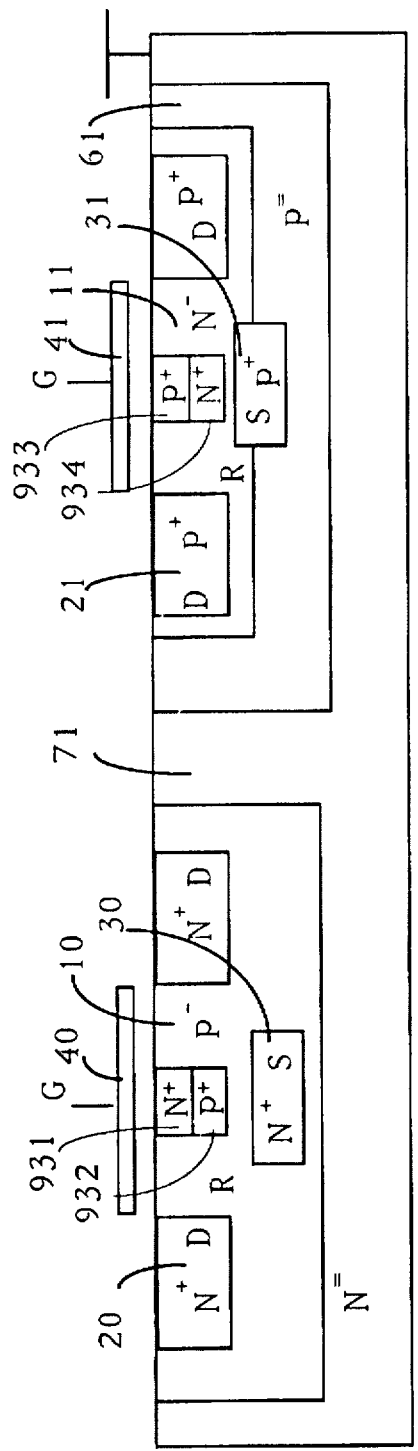

To save the insulation layer, the hybrid flash device structures made with both types of the flash devices in FIG. 10 and FIG. 11 [are adopted]. FIG. 14A and FIG. 14C are the N flash device in FIG. 11A and FIG. 11C and the P flash device in FIG. 10B and FIG. 10D. The hybrid flash device is embedded in the P substrate 70. FIG. 14B and FIG. 14D are the P flash device in FIG. 11B & FIG. 11D and the N flash device in FIG. 10A & FIG. 10C. The hybrid flash device is embedded in the N substrate 71. FIG. 14 is the most compact complementary flash device. To have the most compact layout, the N source region 30 contact with the N region 60 in FIG. 14A & FIG. 14C and the P source region 31 contact with the P region 61 in FIG. 14B & FIG. 14D.

To compare the characteristics of the existing devices, CMOS, DMOS and bipolar device, a table is generated to show the superiority of the flash device. The table make the summary for the characteristics of flash device, CMOS, DMOS and bipolar device. It shows that the flash device is an innovation which never existed before.

The flash device has the volume current. CMOS has the surface current; bipolar has the volume current. In the steady state, the current of the flash device is consituted of the unipolar carriers, either holes or electrons. It is referred as the uni-polar current. The CMOS and DMOS have the unipolar current. The current of bipolar device is constituted of the bipolar carriers, both electrons and holes. It is referred as the bipolar current. However, in the transient process, the current of flash device is constituted of the bipolar carriers. The bipolar carriers are due to the majority carriers in the river region being expelled toward the source to attract the opposite carriers to flow accross the potential barrier at the junction. So the flash device has the field injection type bipolar carriers. The expelled majority carriers has a large amount. It is equivalent the AC coupling between the gate and the source. Even the AC type slow operation of the gate voltage, the AC coupling is still large that the circuit speed is very fast.

Roughly speaking, as gate voltage is below the threshold voltage, the current is made of holes and electrons(bipolar carriers); as the gate voltage is above the threshold voltage, the current is unipolar, either holes or electrons. The field cannot be injected into the narrow region. DMOS has the substrate current being injected into the narrow base region. For slow and/or small AC signal variance, the DMOS device has no bipolar current at all. The DMOS has very narrow channel region as the bipolar device does. DMOS has the current injection type bipolar carrier as the bipolar device does. The expelled carriers during the channel formation of DMOS device is very few. So the DMOS needs to have very fast transient gate voltage. To have the parasitic bipolar current, the DMOS has to have very fast rising of the digital logic type gate voltage switch .

The flash device has much less switch delay than the CMOS. As shown in FIG. 16B, the CMOS has to wait for the channel to open. Until the gate voltage is above the threshold voltage, then the current starts to conduct as shown in FIG. 16C. It causes the switch delay as shown in FIG. 16A.

The flash device will start to conduct as soon as the gate voltage starts to switch. As shown in FIG. 17B, the majority carriers are expelled toward the source to induce the current instantly in the form of bipolar carriers. After the gate voltage is larger than the threshold voltage, the unipolar uni-direction current flows from the source to drain as shown in FIG. 17C. The switch delay is negligible as shown in FIG. 17A. Both the CMOS and DMOS are the surface current devices. Due to threshold voltage, they don't have this effect to reduce the delay.

Unlike the flash device with the river region floating, the base of bipolar device is biased to the voltage of the external connection. The river region of the flash device is floating and serves as the active switch region. The river region of the flash device serves as the active region and the resistive means to eliminate the hot electron effect. The current pattern is the volume current to flow in the river. It also serves as the channel region. The substrate of the CMOS and DMOS is biased to be power or ground and serves as the isolation region. The DMOS has the active channel region and isolation share the same layer. To get rid of the hot-electron effect, CMOS and DMOS need the extra lightly doped resistive region having the same type diffusion as the source and drain. DMOS current is the surface current in both the channel and lightly doped diffusion region.

The flash device and bipolar device have the uni-directional current. The CMOS and DMOS are bidirectional current even though the DMOS has the hot electron problem when operates reversely. As shown in FIG. 18, the CMOS has the hot electron problem. Most voltage drop occurs at the edge of the drain as shown in FIG. 18B. The hot electron occurs at the channel region closing to the edge of the drain as shown in FIG. 18C. To get rid of the hot electron problem as shown in FIG. 19, the DMOS has to use the extra lightly doped diffusion. In FIG. 19B, the lightly doped diffusion region has the linear voltage to keep the electric field weak. However, the DMOS uses the double diffusion that it has the difficulty to control its threshold voltage. The channel region for DMOS is very narrow. Otherwise, the DMOS has the serious problem of the control of threshold voltage. The channel regions for the flash device and CMOS device are wide.

In FIG. 20, the flash device uses the river region which is lightly doped. Cutting along the depth of the river region, in FIG. 20B, the electric field intensity is almost linear and small. By adjust the depth of the river region, the electric field strength may be adjusted accordingly. So the flash device has no hot electron effect. The flash device saves one extra layer. The flash device doesn't use the double diffusion process that it has the well controlled threshold voltage. Furthermore, in FIG. 20D and FIG. 20E, the flash device with ohmic contact has no trap defects been caused by the accelerated carriers. The speed and driving capability is much faster.

For the CMOS device to get rid of the hot electron problem, similar to the DMOS, the lightly doped regions are added near the source and drain. It is equivalent to five-layer structure, N-v-P-v-N or P-v-N-v-P.

The contact serves as the current injection with the carrier transformation capability to bridge the different isolated regions. To explain the mechanism, the general unified concept of the electric field is adopted. The current injection can inject the field into the narrow-deep region such as the base region of bipolar device. The field injection cannot inject into the narrow-deep region. The flash device injects the electric field into the the volume of active region with the field injection. The CMOS and DMOS have the electric field inducing the surface charge. The electric field is shielded by the surface charges of channel current that it cannot inject into the volume. The bipolar injects the field with the carriers that the electric field is injected with the current injection.

The CMOS is 2D surface device. The structure of CMOS has the potential latch-up problem. The flash device is the 3D volume device. The source is under the gate. So the layout area is less than the CMOS does. The active river region of flash device is enwrapped with source and drain that the river region will not serve as the base in the parasitic bipolar mechansim. Furthermore, the carrier of current flows upward, toward the drain; not downward, toward the substrate. So the flash device is latch-up free.

The CMOS has the symmetrical structure. The source and drain is interchangeable. In terms of source and drain, the flash device is not a symetrical device. The source and drain cannot be exchanged. The flash device has the unidirectional current as the bipolar does. The current flowing from the drain toward the source is in the opposite direction of the electric field in the river region. So the reverse current is prohibited in the flash device. The unidirectional flash device has the anti-ground-bounce and the anti-power-droop characteristics. The flash device is a good output buffer device as the bipolar does. Furthermore, for the submicron device, the driving current capability is comparable as the bipolar driving capability. So, the BiMOS device process will be eliminated from the industry in the future.

Figure 21B:
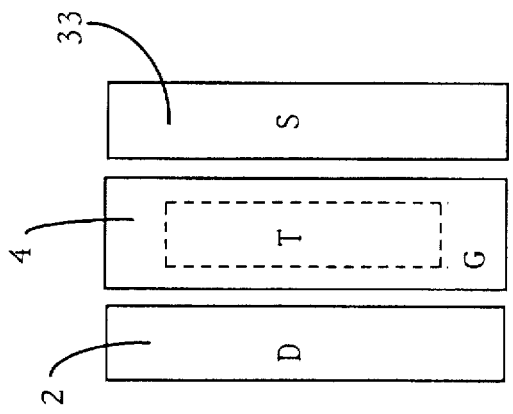
Figure 21A:
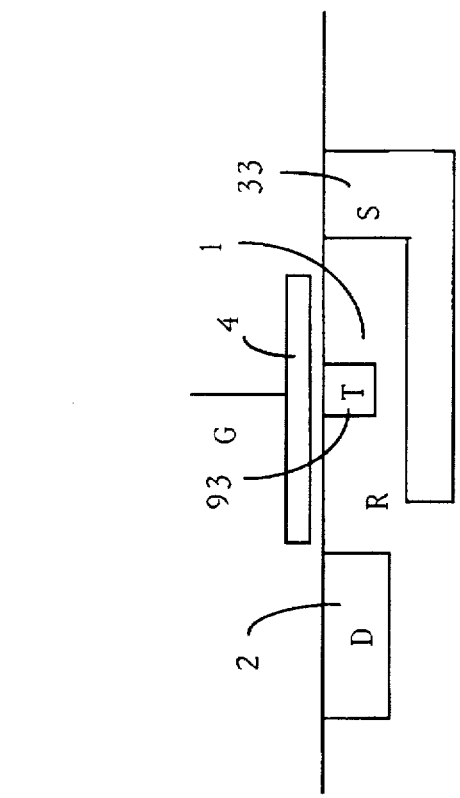
Figure 21D:
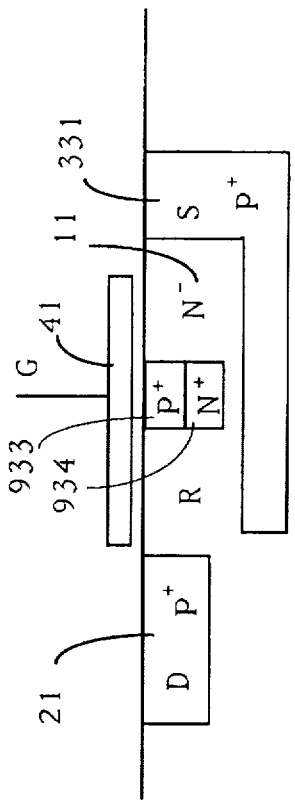
Figure 21C:
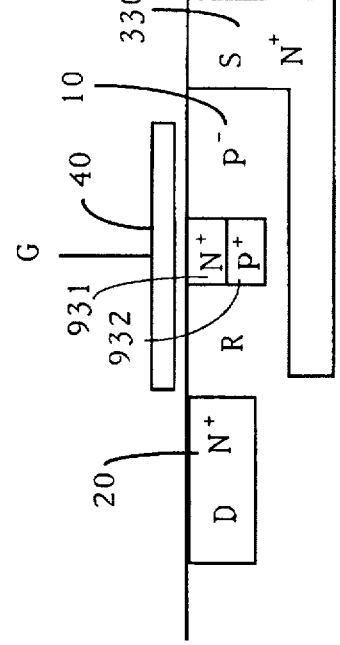
Figure 23A:
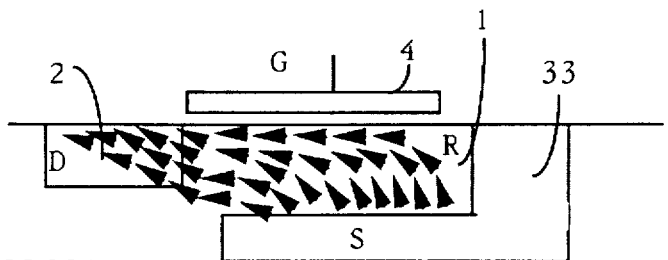
Figure 23B:
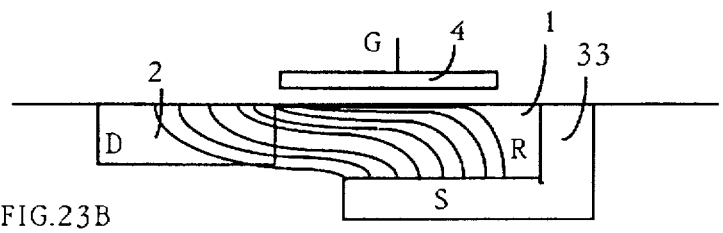
Figure 23C:
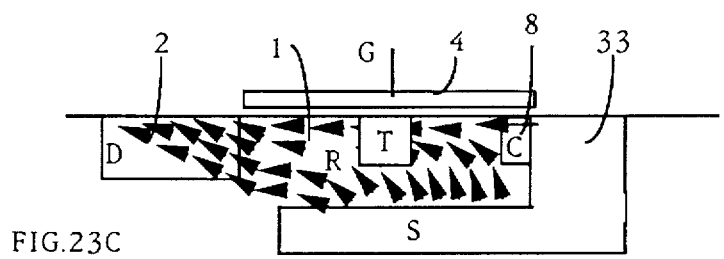
Figure 23D:
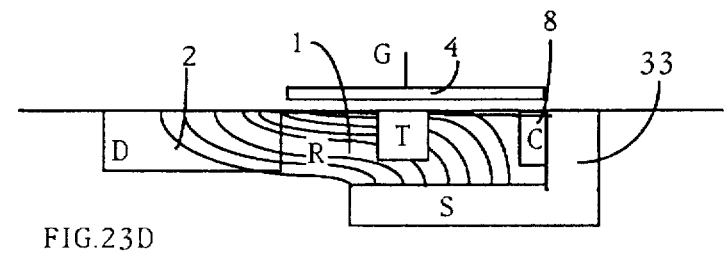

Based on the same principle, the other flash devices are designed. FIG. 21A shows the general structure of the flash device having the L shape source. Since the carriers beneath the gate will block the field. To increase the gain, the carriers had better to flows from the source to drain directly. To block the surface current, there is a distance between the edge of gate 4 and the edge of source(S) 33. FIG. 21B is the top view of the flash device. FIG. 21C shows the N type flash device. The source 330 is in the L shape segment having the horizontal N segment under the gate 40. FIG. 21D is the P type flash device. The source(S) 331 is L shape having the horizontal P segment under the gate 41. The vector field is shown in FIG. 23A & FIG. 23C; the streamline of the current is shown in FIG. 23B & FIG. 23D.

Figure 23E:
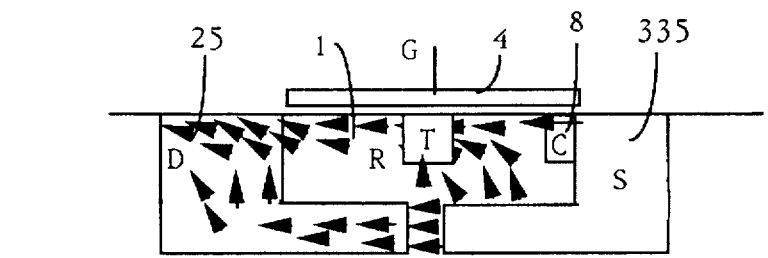
Figure 23F:
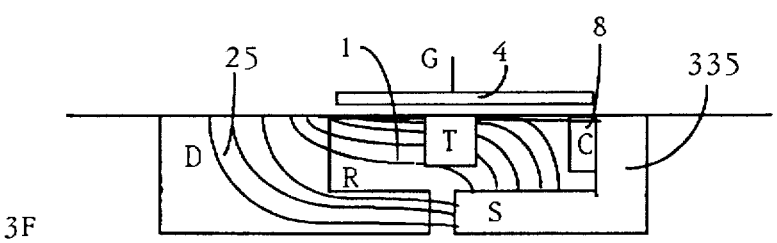

Just as the bipolar device does, as the carriers flows out of the emitter, the carriers are collected by the collector. FIG. 21E shows the general structure of the BiMOS flash device having the bipolar effect with the L shape source and L-Shape drain. The L shape source and L shape drain have the ends close together. The contact 93 injects the current and focalizing the field into the gap between the buried drain 25 and buried source 335. As the carriers flow out of the buried source 335, they will be collected by the buried drain 25 directly. This is a gate controlled bipolar effect. Only a small portion will flow through the contact 93 and the channel beneath the gate 4. So the capacitor effect induced the accumulated carriers beneath the gate is minimized. FIG. 21F shows the N type BiMOS flash device. The source 332 is in the L shape segment having the horizontal N segment buried under the gate 40. As the gate 40 is switched on at the logic high state, the drain 22 is connected to the contact 931. The ohmic contact 931 and 932 generate the electron-hole pairs. The holes are injected into the gap between the buried drain 22 and buried source 332. The electrons in the buried source 332 are attracted by these injected holes and flow out the buried source 332. These electrons are collected by the buried drain 22 as the electrons fly across the gap. This is equivalent to NPN bipolar effect. FIG. 21G is the P type flash device. The source(S) 333 is in the L shape having the horizontal P segment buried under the gate 41. As the gate 41 is switched on at the logic low state, the drain 23 is connected to the contact 933. The ohmic contact 933 and 934 generate the electronhole pairs. The electrons are injected into the gap between the buried drain 23 and the buried source 333. The holes in the buried source 333 are attracted by these injected electrons and flow out the buried source 333. These holes are collected by the drain 23 as the holes fly across the gap. This is equivalent to PNP bipolar effect. The vector field is shown in FIG. 23E; the streamline of the current is shown in FIG. 23F.

Figure 21J:
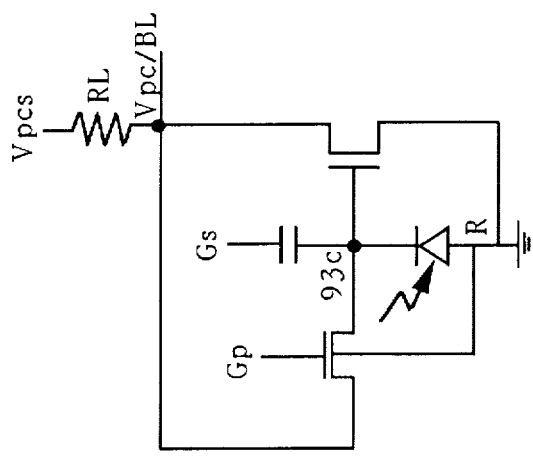
Figure 21I:
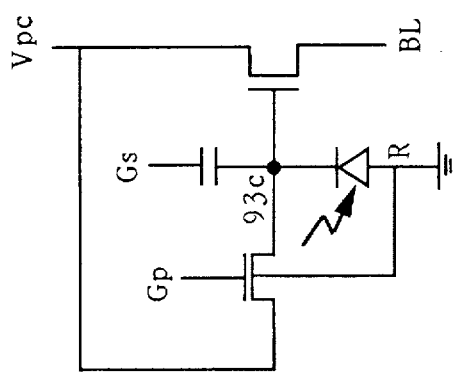
Figure 21L:
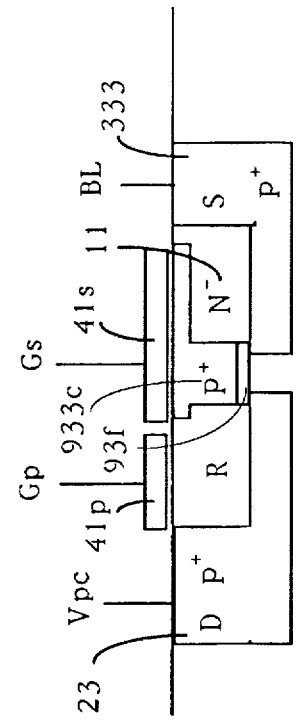
Figure 21H:
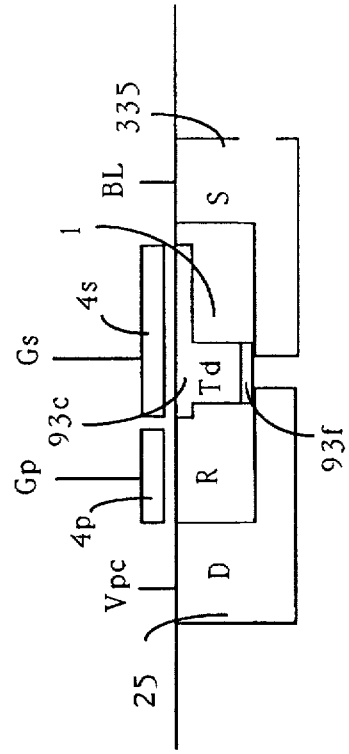
Figure 21K:
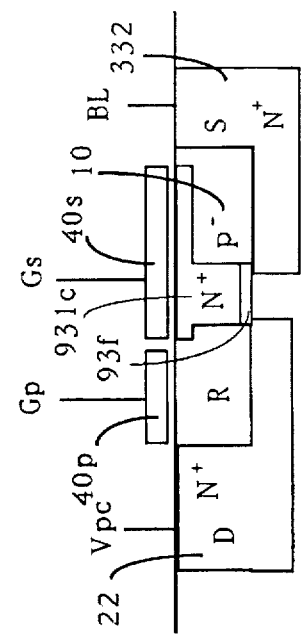

Furhtermore, as shown in FIG. 21H, with the small modification of the composite material of the composite regions of the contact 93 to be the charge storage region 93c and the isolation region 93f, the flash device becomes the single cell active pixel. FIG. 21K is the N-type single device active pixel. FIG. 21I is the corresponding equivalent circuit of FIG. 21K. In FIG. 21K, the junction between the N+ region 931c and the p- substrate region 10 constitutes of the reverse biased photon discharged diode DP. The isolation region 93f, the buried segments of the source 335 and the drain 25 constitute of the NMOS for the amplifier MA. The region 931 serves as charge storage region, swtich capacitor region, photon discharging diode region and the contact region. It makes the contact with the isolation 93f to serve as the gate of the MOS MA. The isolation region 93f of the composite region Td isolates the region 93c from the region 25 and 335. The precharge gate 4p, the drain 25 and the charge storage region 93c constitute of the NMOS device MPC. The gate 4s and the charge storage region 93c constitute the switch capacitor CS. The flash type single cell active pixel combines four components to be one device. The four devices are the amplifier MA, pre-charging switch gate MPC, the switch capacitor CS and the reverse biased diode DP. As shown in FIG. 21H and FIG. 21I, the precharge voltage is preferred to be just below the threshold voltage of NMOS device MA. The precharge voltage is stored as the reversed bias voltage as the charge stored in the depletion layer at the p-n junction. After the pre-charge gate Gp is switched off, the photon count or integration in time starts. As the photons shine on the reverse biased diode DP, a pair of electron-hole is generated and flows to the p-n junction to discharge the reversed-bias voltage. The more photons, the lower the voltage at node 93c is. To increase the capacitance of the capacitor CS and the p-n junction area of the reverse biased diode DP, the top portion of the composite region Td is enlarged to be a flat portion and is overlaped with the switching gate Gs. As the switch voltage Gs of switching capacitor CS switches from low to high, the voltage at node 93c is kicked from low to high with a proportion factor of capacitor ratio to be the voltage divider. The more the photons are, the less the voltage at node 93c before and after the voltage Gs switching, the less the output voltage or current is. So the output voltage or current is reverse proportional to the integration of the number of photons in the sample period. In FIG. 21I, the output of thebit line BL for the single device active pixel is connected as the source follower type circuit. The output is the current. In FIG. 21J, the output Vpc/BL is connected to an external resistor RL type node and the output is the amplified voltage Vpc/BL of the bit line. FIG. 21L is the P type single device active pixel. All the functions are similar to the the N type single device active pixel in the complementary sense. In the other words, the ground connection is connected to the Vcc power supply; the switch on is "from high to low" instead of "from low to high", etc.

Figure 21O:
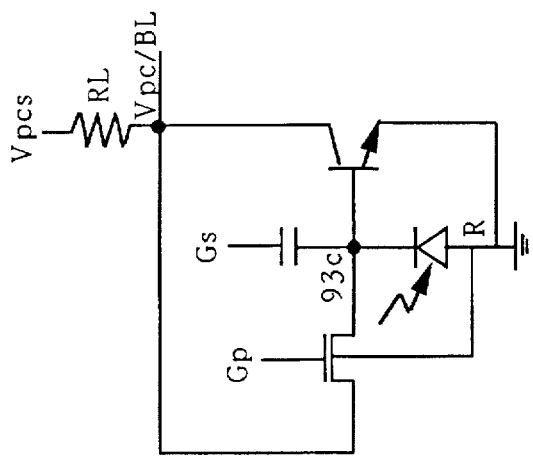
Figure 21N:
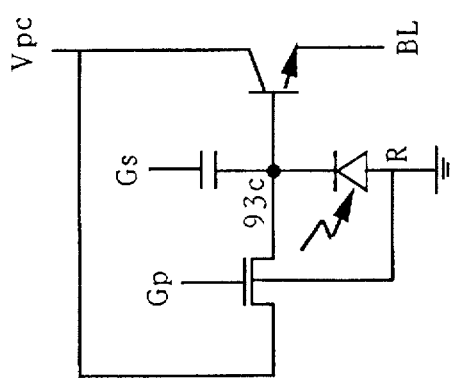
Figure 21M:
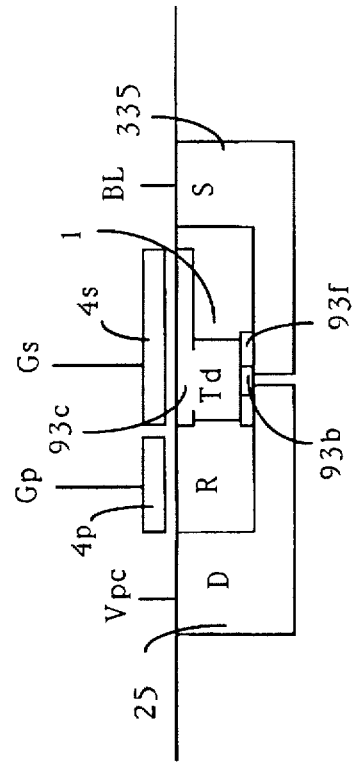
Figure 21Q:
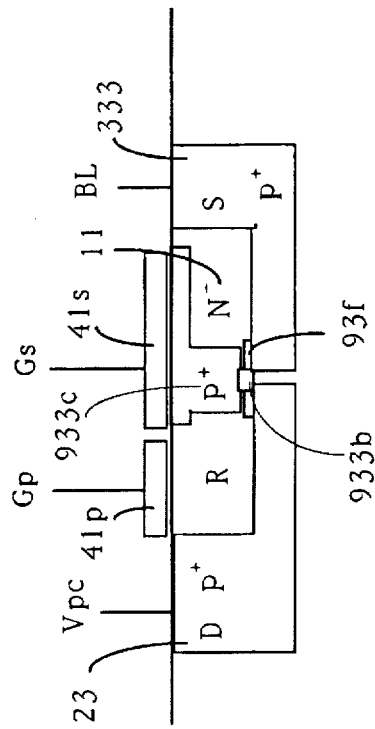
Figure 21P:
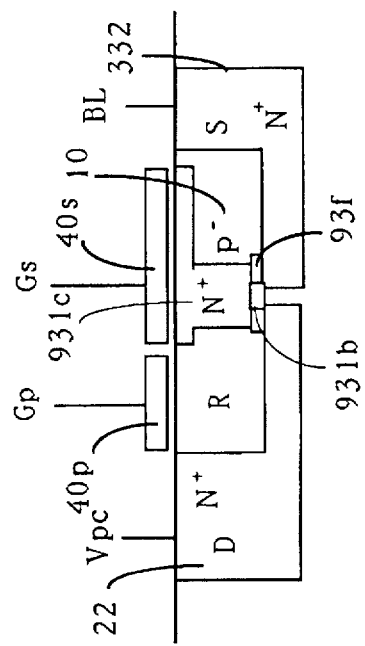

FIG. 21M shows the BiMOS type single device active pixel. The composite region Tc is the combination of the contact and isolation regions. It serves as the charge storage, reverse biasd diode and the base contact with the bipolar device. FIG. 21N is the BiMOS single device active pixel conneced as the source follower bit line type. FIG. 21O is the BiMOS single device active pixel conneced as the amplifier bit line type. The working principal of the BiMOS type single device active pixel is similar to the working principal of the MOS type single device active pixel. As shown in FIG. 21P, the contact region 931b is P+ and the contact region 931c is N+. They constitute the ohmic contact to make the connection to the base of the bipolar device MB. The isolation region 93f make the isolation from the N+ region 931c from the N+ regions 22 and 332. The gap between the regions 22 and 332 is very narrow that they constitute a bipolar device MB.

As the precharge gate Gp is switched on, the charge storage region 931d is precharged to be the voltage just beneath the turn-on voltage Vbe (the voltage between base and emitter). During the sampling period, the photon shines on the single device active pixel, the junction diode between 931d and substrate 10 is discharged. In other words, the photons are integrated during the sampling period. As the switching gate Gs is switched on, the total current can flow out the bipolar device MB is proportional to the residue charges stored in the TC charge storage region. FIG. 21Q shows the P type BiMOS single device active pixel. Adopting the technology devekoped for the flash device, it is the first time to integrate the four different components, MOS, capacitorm, diode and bipolar, to be one single device!

Figure 22B:
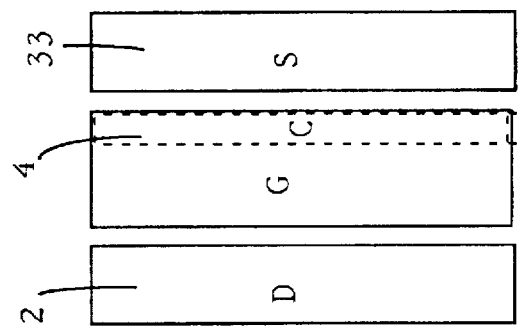
Figure 22A:
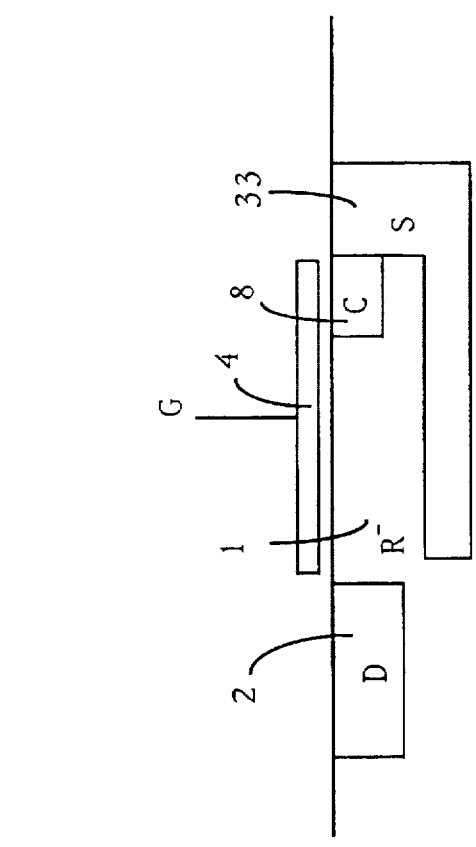
Figure 22D:
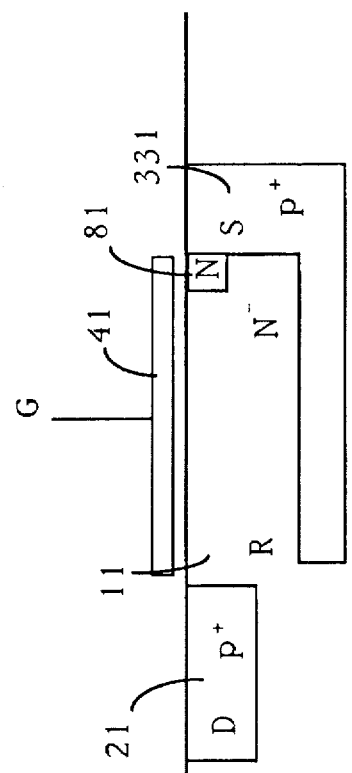
Figure 22C:
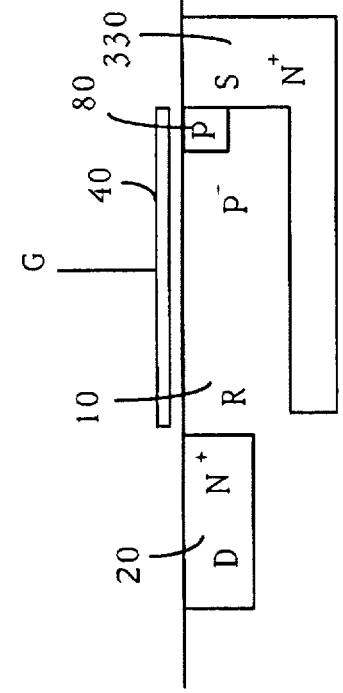

To minimize the carriers flowing through the surface channel, FIG. 22A shows another implementation [general structure] of the flash device. There is no distance between the gate 4 and the source(S) 33. To block the surface current, there is a high threshold diffusion region 8 near the source. Comparing with the symmetrical structure of CMOS, the anti-symmetrical structure of the flash device enable it to have the unidirectional operation. As the gate switch on the low-threshhold channel and the depletion layer has reached the buried source, the high-threshold channel is not switched on yet. At the begining of the switch, the ground bounce and power surge are serious, the uni-direction characteristics supresses the ground bounce and power surge to avoid the false glitch signal. As the gate continues switching on and the high-threshold channel is switched on, the carrier can flow through the surface channel from the source to drain. It is equivalent to CMOS. This device combines both the good characteristics of the bipolar device and CMOS device. As the gate is fully switched on, the CMOS operation enables the device having the full-swing voltage driving capability. FIG. 22B is the top view of the flash device. FIG. 22C shows the N type flash device. The high threshold doped P diffusion region 80 near the source(S) 330. The source 330 is in the L-shape segment having the horizontal N segment under the gate 40. As the gate 40 is switched on from the low state to high state, the electrons flow out of the buried source 330 and flow to the drain 20 first. As the voltage of gate 40 continue increasing, the channel in the region 80 is switched on and the electrons flow from the source 330 to drain 20. FIG. 22D is the P type flash device. The high threshold doped N diffusion region 81 near the source(S) 331. The source(S) 331 is L shape having the horizontal P segment under the gate 41. As the voltage of gate 41 is switched from high to low, the holes in the buried source 331 are attracted to flow out and flow to the drain 21. As the voltage of gate 41 continues decreasing, the channel in the region 81 is formed and the holes flow through this channel to the drain 21. The vector field is shown in FIG. 23C; the streamline of the current is shown in FIG. 23D. FIG. 22E to FIG. 22H shows the flash device with the ohmic contact to have both the charge coupling and current injecting effects. As the gate 4 is switched on, the drain 2 is connected with the contact 93 first. As the voltage of gate 4 continues increasing, the channel in the high doping region 8 is switched on, too. The carriers can flow from the source 33 to drain 2 through the channel. With this alignment, we could get rid of the capacitor fieldshield effect at the begining to have the unidirectional current and have the full-swing voltage driving capability later. The anti-symmetrical buried source enables the flash device having the unidirectional current; the symmetrical CMOS mechanism enable the flash device having the full-swing voltage driving capability. For the N type flash device, the highly doping region 931 and 932 constituting the ohmic contact to inject the holes into the river region 10. At the beginning of the gate 40 being switched on, the high threshold voltage P region 80 blocks the electrons to flow. For the P type flash device, the highly doping region 933 and 934 constituting the ohmic contact to inject the electrons into the river region 11. At the beginning of the gate 41 being switched, the high threshold voltage N region 81 blocks the holes to flow.

FIG. 22I shows a general structure of the BiMOS flash device. Using the field only, with the channel blocking technique, the field controlled bipolar mechanism also can be implemented with the buried source 25 and buried drain 235. There is no distance between the gate 4 and the source(S) 335. To block the surface current, there is a high threshold voltage diffusion region 8 near the source 335. The carriers don't flow through the channel beneath the gate 4. The field blocking capacitor effect is eliminated. As the low-threshold voltage channel is switched on and the high-threshold voltage channel isn't switched on yet, the field attracts the carriers to flow out the buried source 335. These carriers are attracted by the buried drain 25 and flow to the buried drain directly. FIG. 22J shows the N type flash device. The high threshold voltage doped P diffusion region 80 is near the source(S) 332. The source 332 is in the L shape [segment] having the horizontal N segment under the gate 40. As the gate 40 is switched on, the electrons are attracted to flow out of the buried source 332 and flow to the buried drain 22 directly. FIG. 22K is the P type flash device. The high threshold voltage doped N diffusion region 81 near the source(S) 333. The source(S) 333 is L shape having the horizontal P segment under the gate 41. As the gate 41 is switched on, the holes are attracted to flow out of the buried source 333 and flow to the buried drain 23 directly.

To increase the operational efficiency of the BiMOS mechanism, the contact technology is adopted. FIG. 22L shows another general structure of the BiMOS flash device with ohmic contact. There is no distance between the gate 4 and the source(S) 335. To block the surface current, there is a high threshold voltage diffusion region 8 near the source. As the gate 4 switches on the low threshold voltage channel , the drain 25 is connected with the contact 93. The contact 4 injects the current into the gap between the buried source 335 and the buried drain 25. The carriers are attracted to flow out of the buried source 335 and flow into the buried drain 25 directly. FIG. 22M shows the N type flash device. The high threshold voltage doped P diffusion region 80 is near the source(S) 332. The source 332 is in the L shape [segment] having the horizontal N segment under the gate 40. As the gate 40 switches on the low threshold voltage channel, the drain 22 is connected with the contact 931. The contact 932 injects the holes into the gap between the buried source 332 and the buried drain 22. The electrons are attracted to flow out of the source 332 and flow into the buried drain 22 directly. FIG. 22N is the P type flash device. The high threshold voltage doped N diffusion region 81 near the source(S) 333. The source(S) 333 is in the L shape having the horizontal P segment under the gate 41. As the gate 41 switches on the low threshold voltage channel, the drain 2.3 is connected with the contact 933. The contact 934 injects the electrons into the gap between the buried source 333 and the buried drain 23. The carriers are attracted to flow out of the source 333 and flow into the buried drain 23 directly. The vector field is shown in FIG. 23E; the streamline of the current is shown in FIG. 23F.

Figure 24A:
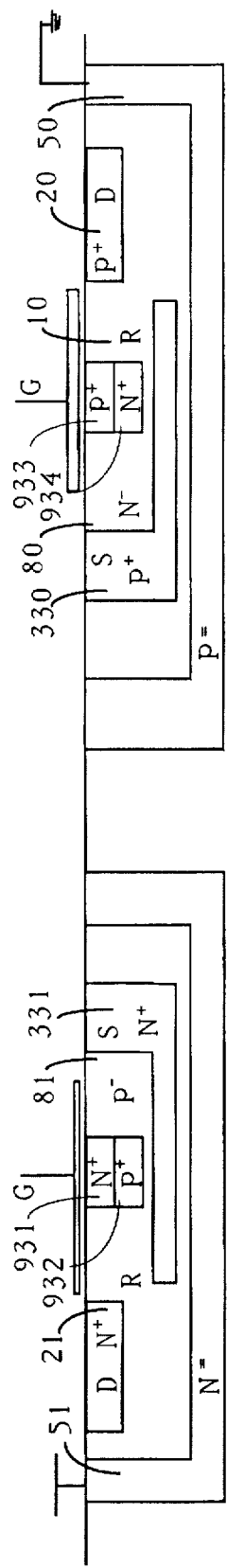
Figure 25A:
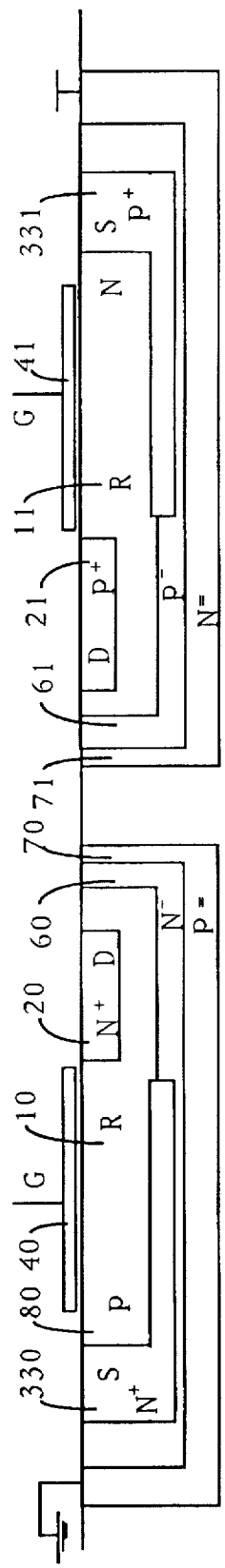

Combing the above different P type flash device and N type flash device, there are many complementary flash device having the BiMOS effect. FIG. 24A shows the twin well complementary flash device made of the N flash device and P flash device. FIG. 25A shows the alternative design of the twin well complementary flash device made of the N flash device and P flash device. The source(S) 330 contacts with the source region 60; the source(S) 331 contacts with the source region 61.

Figure 24B:
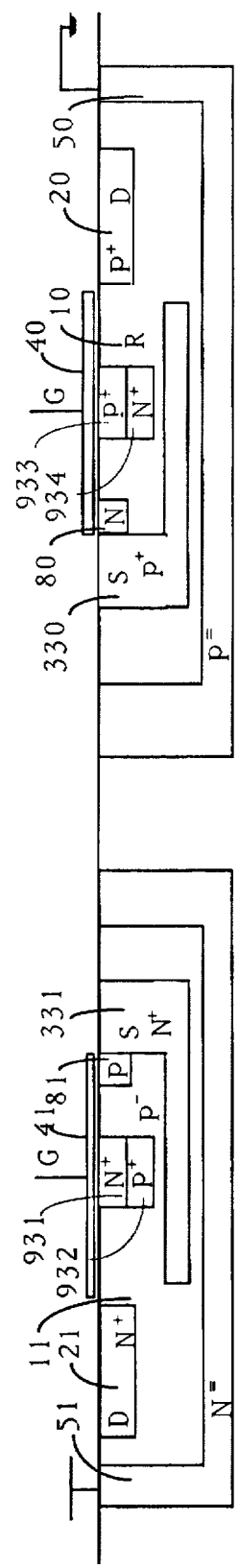
Figure 24C:
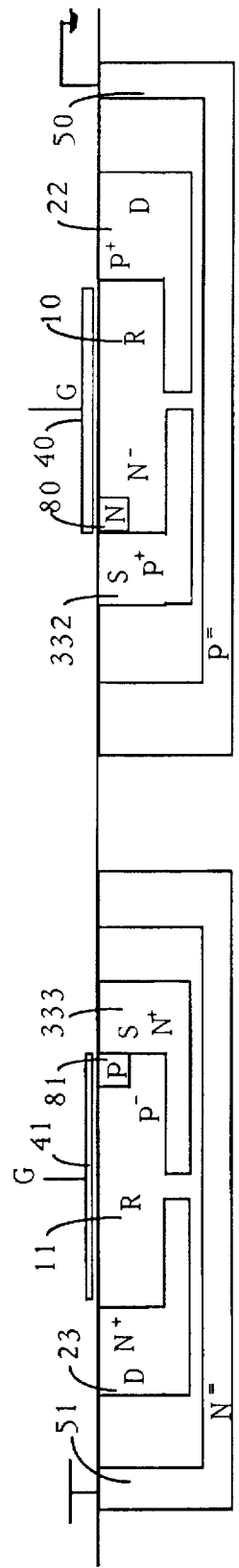
Figure 24D:
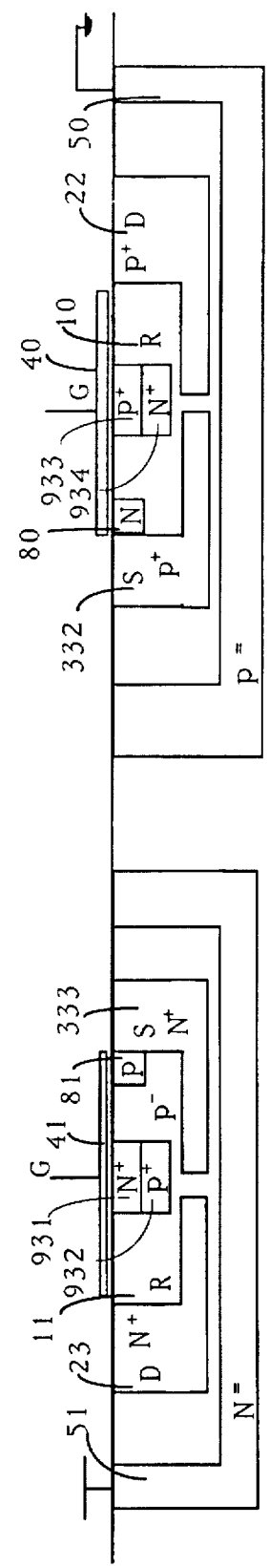
Figure 25B:
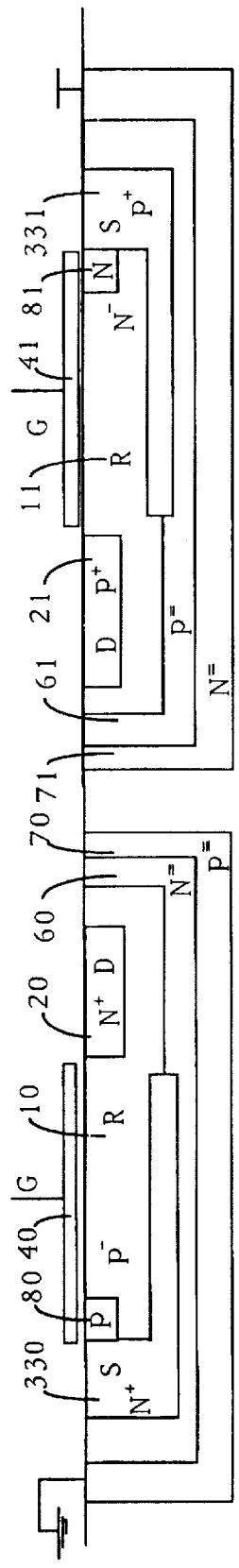
Figure 25C:
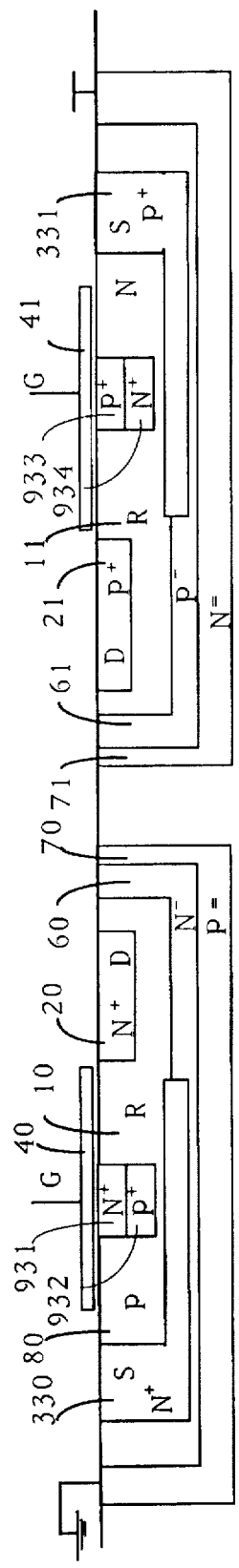
Figure 25D:
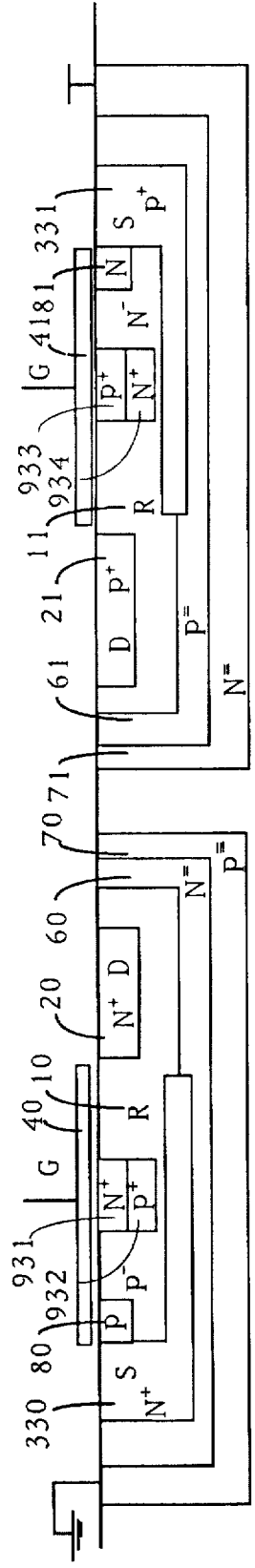
Figure 26A:
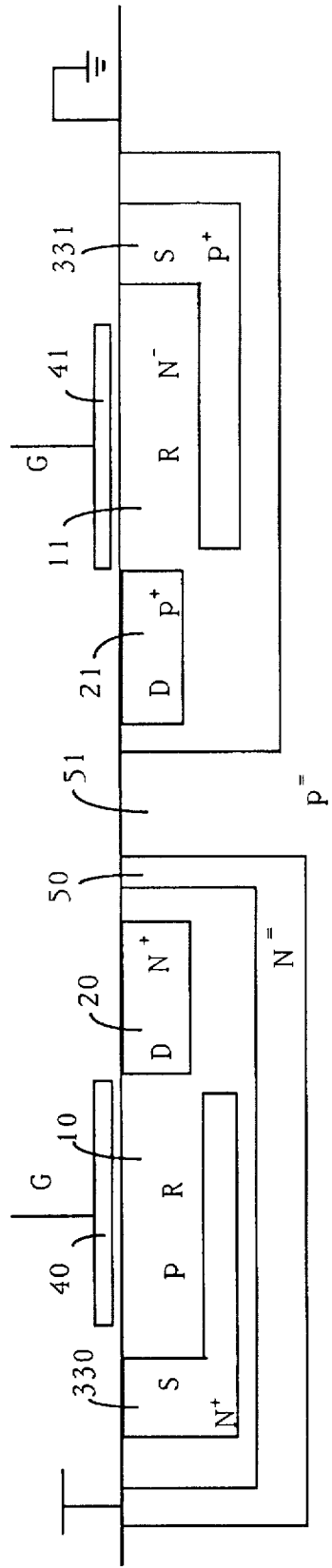
Figure 26B:
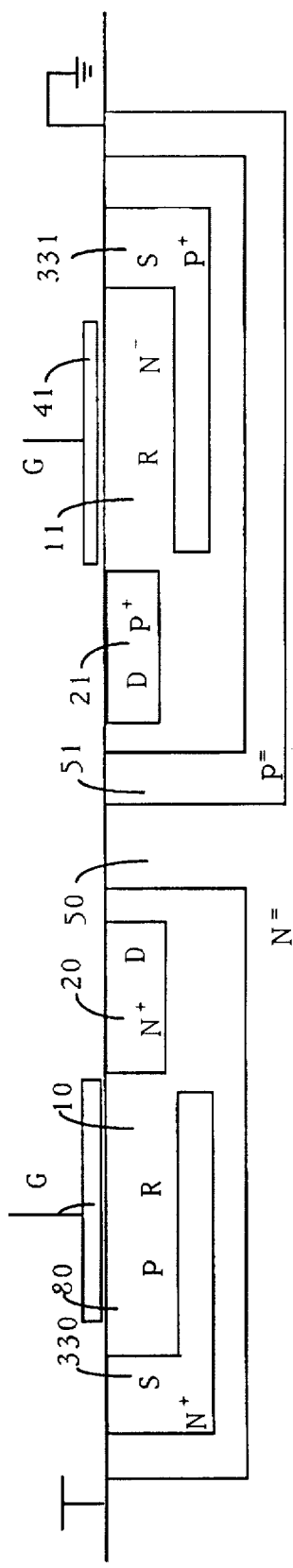
Figure 26C:
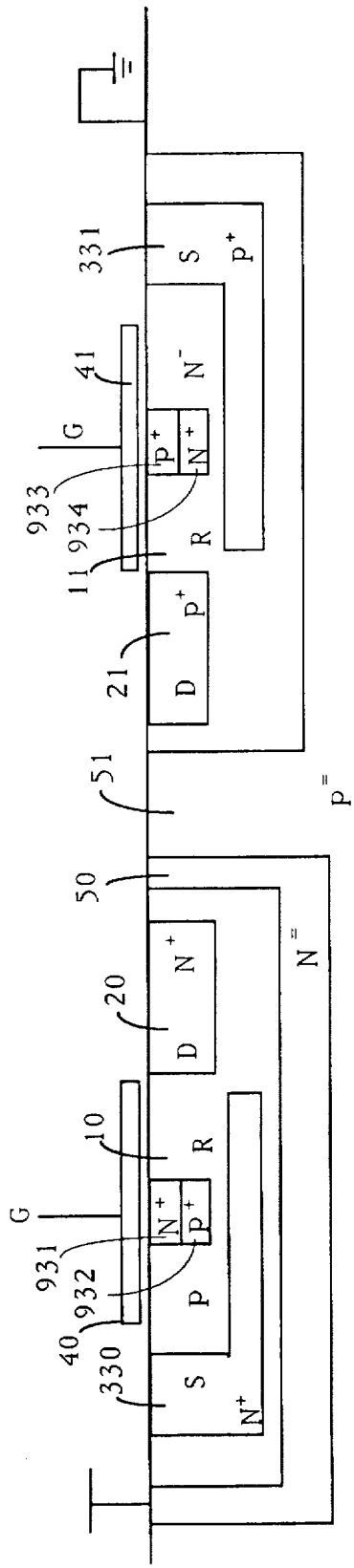
Figure 26D:
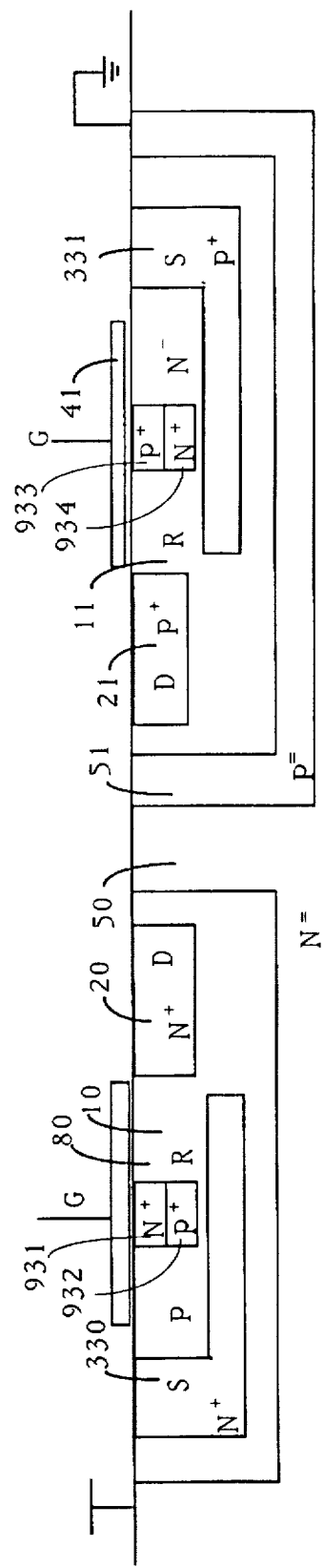

FIG. 24B shows the twin well complementary flash device made of the N flash device and P flash device. FIG. 25B shows the alternative design of the twin well complementary flash device made of the N flash device and P flash device. The source(S) 330 contacts with the source region 60; the source(S) 331 contacts with the source region 61. FIG. 24C is the BiMOS flash device having the voltage charge coupling bipolar effect. FIG. 24D is the BiMOS flash device having both the voltage charge coupling bipolar effect and current injecting bipolar effect. FIG. 25C and FIG. 25D are the flash devices having the voltage charge coupling and current injecting effects.

Figure 27C:
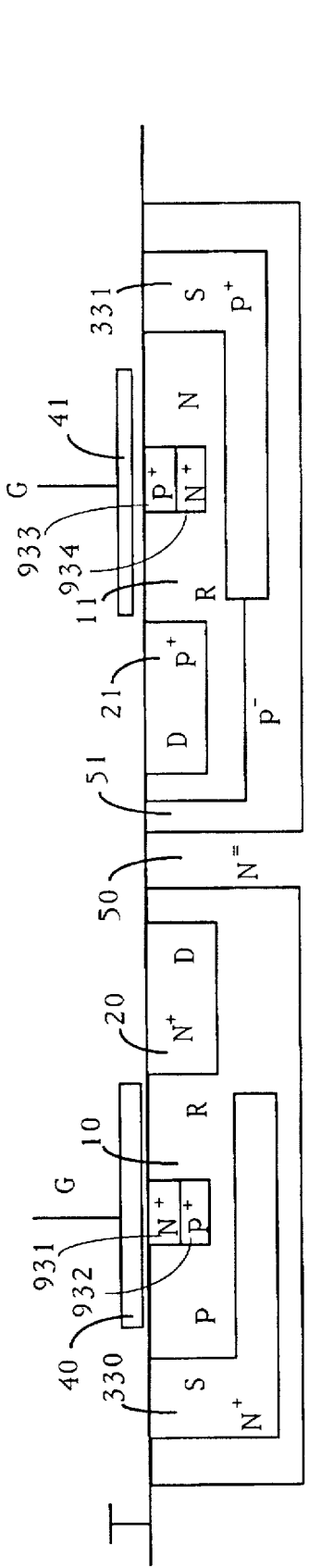
Figure 27D:
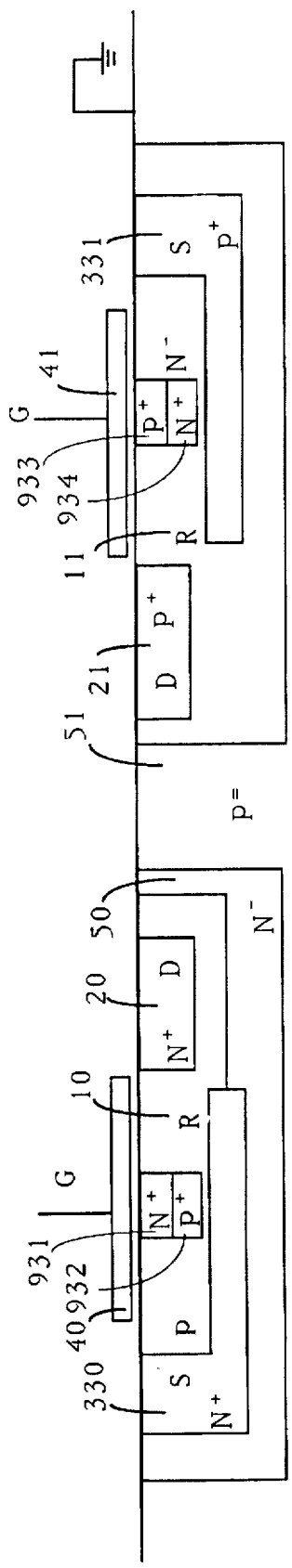

FIG. 26 and FIG. 27 show different complementary flash devices. To block the surface channel current, there is a distance between the gate and source. FIG. 26A shows the complementary flash devices sharing the P substrate 51. The N flash device has an isolation 50. FIG. 26C has the ohmic contact. FIG. 26B shows the complementary flash devices share the N substrate 50. The P flash device has an isolation 51. FIG. 26D has the ohmic contact. FIG. 27A shows the complementary flash devices sharing the N substrate 50. The N substrate 50 serves as the isolation layer for both the P flash device and N flash device. FIG. 27C has the ohmic contact. FIG. 27B shows the complementary flash devices sharing the P substrate 51. The P substrate 51 serves as the isolation layer for both the P flash device and N flash device. FIG. 27D has the ohmic contact.

Figure 28C:
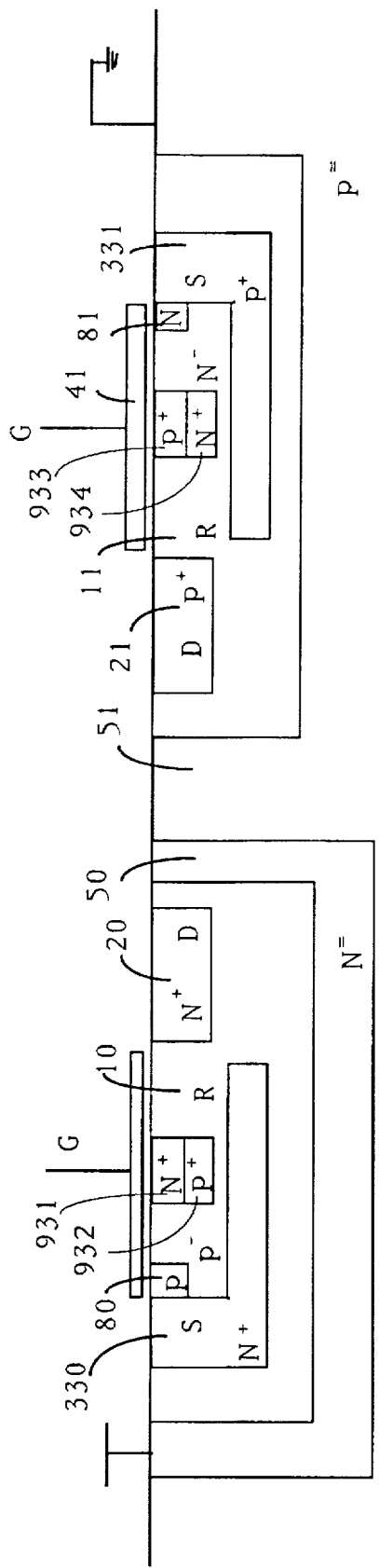
Figure 28D:
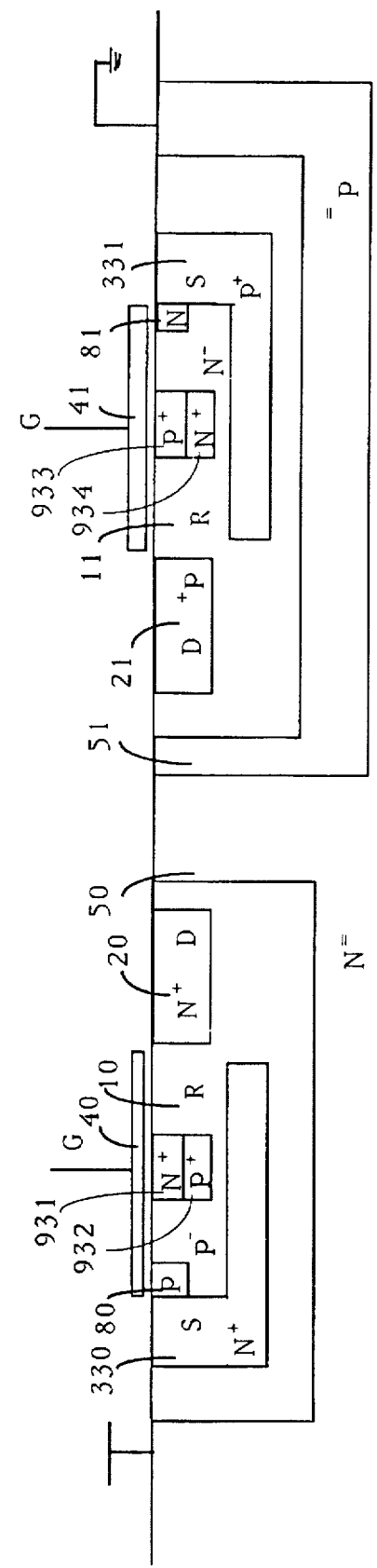
Figure 29A:
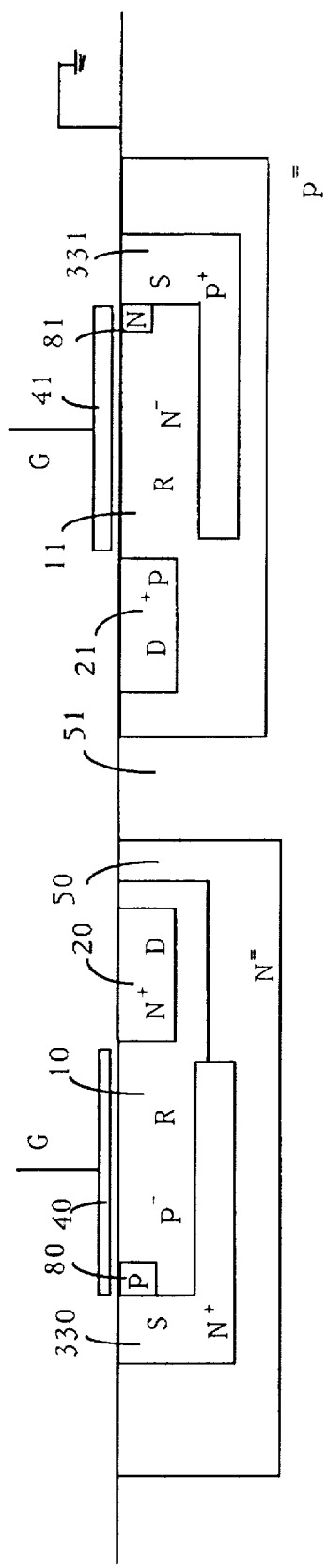
Figure 29B:
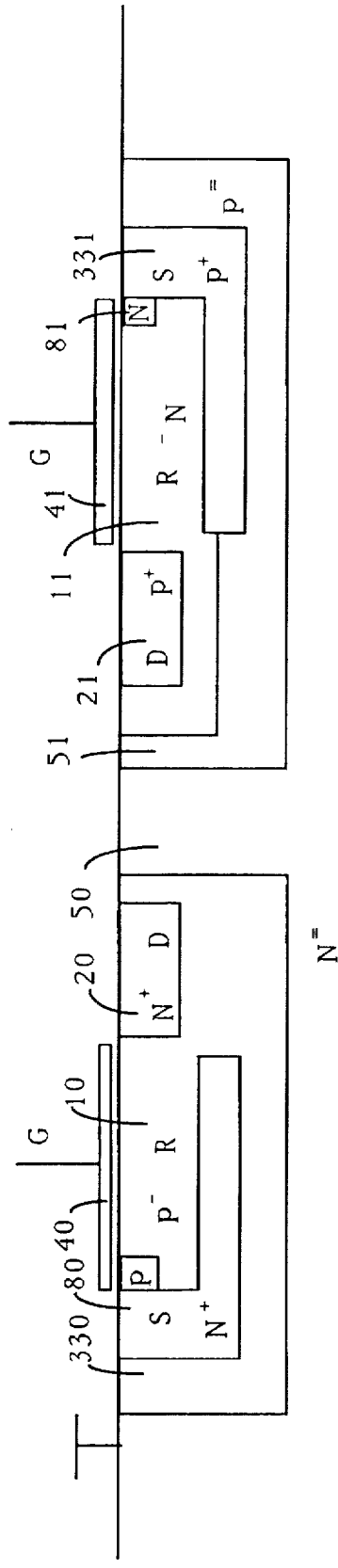

FIG. 28 and FIG. 29 show another four different complementary flash devices. To block the surface channel current, near the source, there is a highly doped region in the river region. FIG. 28A shows the complementary flash devices sharing the P substrate 51. The N flash device has an isolation 50. FIG. 28C has the ohmic contact. FIG. 28B shows the complementary flash devices sharing the N substrate 50. The P flash device has an isolation 51. FIG. 28D has the ohmic contact. FIG. 29A shows the complementary flash devices sharing the P substrate 51. The P substrate 51 serves as the isolation layer for both the P flash device and N flash device. FIG. 29C has the ohmic contact. FIG. 29B shows the complementary flash devices sharing the N substrate 50. The substrate 50 serves as the isolation layer for both the P flash device and N flash device. FIG. 29D has the ohmic contact.

Almost all the techniques developed for MOS EPROM and MOS EEPROM can be applied to the flash device to generate the novel flash EPROM and flash EEPROM. The flash EPROM and flash EEPROM are the high speed nonvolatile memory device. Similar to the MOS EPROM and MOS EEPROM, with the addition of floating gate and/or controlled gate and/or side gate to the flash device, the flash EPROM and flash EEPROM may be generated.

Figure 30I:
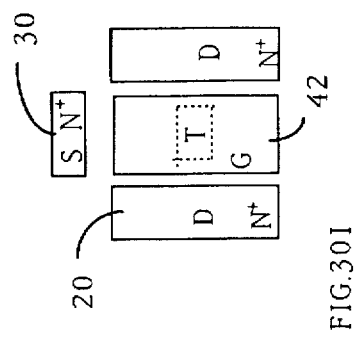
Figure 30K:
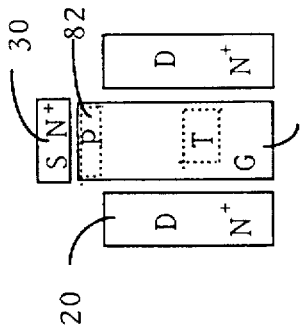
Figure 30G:
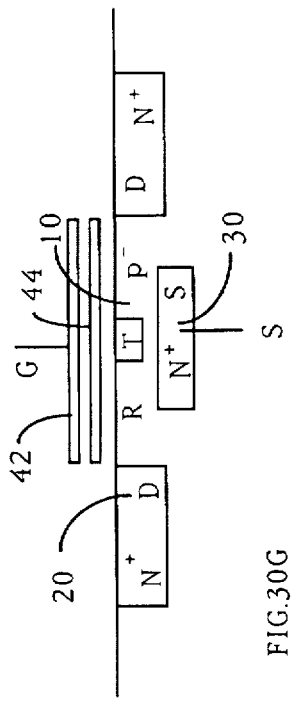
Figure 30H:
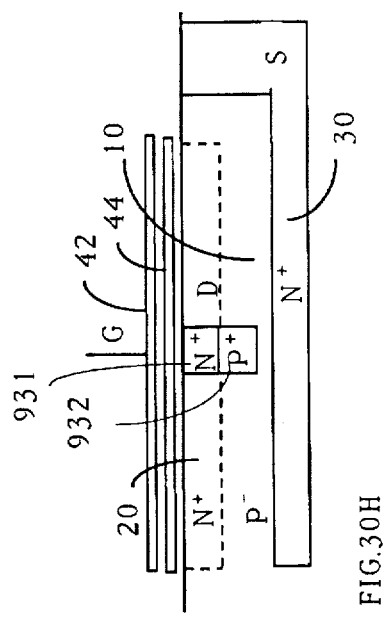
Figure 30J:
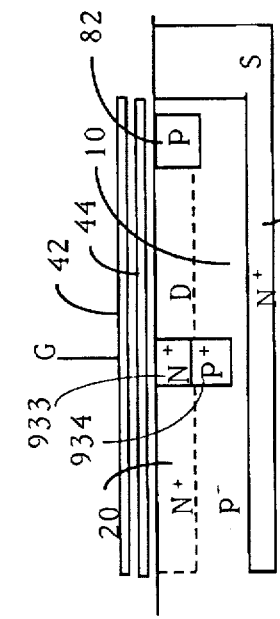

From FIG. 30A to FIG. 30F, the control gate 42 overlaps on the floating gate 40. FIG. 30B is the symbol of the N flash EEPROM. The control gate 42 controls the charging and discharging process of the stored charges in the floating gate 40. As the stored charge in the floating gate is in 1(logic high) state, the N flash EEPROM is conductive. As the stored charge in the floating gate is in 0(logic low) state, the N flash EEPROM is turned off. From FIG. 30G to FIG. 30K, the flash device has the ohmic contact to have both vertical charge coupling and current injecting effects.

Furthermore, the flash device develops a lot new advanced techniques in the substrate regions. In CMOS technology, the substrate region is just connected to the ground. In the flash device, the substrate can be connected to the switch voltage to use the capacitor effect to kick the floating gate to generate the novel super-flash EEPROM device. For the composite contact region, keep the substrate contact only and connect all the substract contact to be one array. As shown in FIG. 30L, FIG. 30O or FIG. 30S, the P− substrate has one segment P+ to increase the substrate speed and reduce the layout area. As the gate of CMOS device is not opened yet, the drain and the source almost have no capacitor effect with the gate at all. In other words, Cgs and Cgd are almost zero. All the capacitor is the capacitor between the gate and the substrate, Cgb. Cgb has its maximum value. As shown in FIG. 30U, the P+ region 30a and the P− substrate are charged to be negative with substrate charge pump. The gate can be switched to the positive voltage or charged to be high positive voltage with the charge pump. From the field theory, the needle pin is the singular point to generate the very high field strength locally. The local high field strength easily attracts the electrons to punch throgh the isolation oxide layer. The punch through position is not on the channel that the reliability of the super-flash EEPROM device is much higher than the conventional EEPROM device. To increase the local field concentration effect, the needle pin 44b is constituted of the horizontal form factor and the vertical form factor. As shown in the FIG. 30V, the horizontal projection of the gate 44a has a needle pin 44b. As shown in FIG. 30U, the vertical section also shows the gate 44a has a needle pin 44b. To increase the local field intensity, not only the float gate has the needle pin but also the control gate has the needle pin. As shown in FIG. 30V, the control gate 44a has a needle pin 44b in the horizontal plan. As shown in FIG. 30U, the control gate 44a has a needle pin 44b in the vertical section view. Having the needle form factors in both horizontal plan and vertical section for both the floating gate and the control gate, the needle pin has very strong local field intensity and the programming voltages can be small. The super-flash device program the EEPROM with the substrate and the control gate, not the drain or source and the control gate. The punch through path is between the float gate and the control gate, not between the the channel and the float gate. The oxide between the channel and the float gate is not destroyed by the hot electrons and the traps during the programming process. So the reliability of super-flash EEPROM is much better.

Figure 30T:
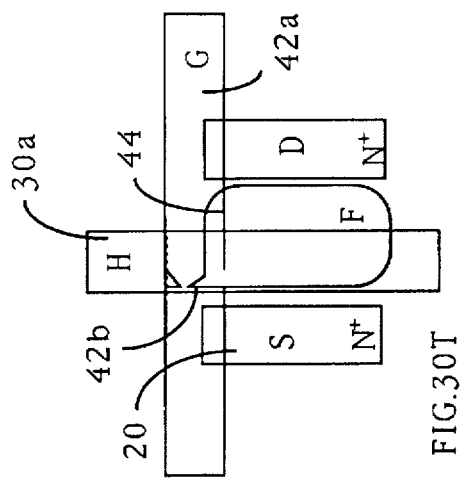
Figure 30V:
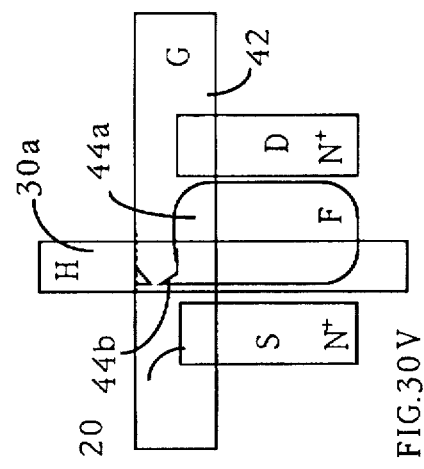
Figure 30S:
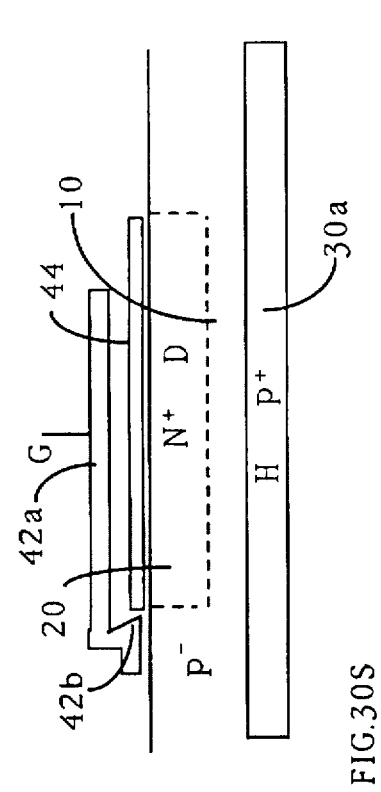
Figure 30U:
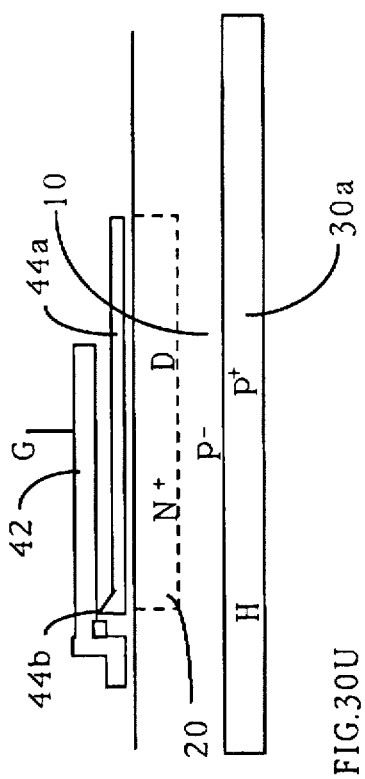

Based on the same principles, from FIG. 30L to FIG. 30V show the different implementations of the super-flash EEPROM. In FIG. 30L, the needle pin 42b is beneath the control gate 42a. The symbole for the superflash EEPROM is shown as FIG. 30M. As shown in FIG. 30O and FIG. 30P, the needle pin 42b also can locate at the side of the gate 44. Both the float gate and the control gate have the form facotr of the needle pin. As shown in FIG. 30Q and FIG. 30R, the needle pin 44b is at the top edge of the float gate 44a. The corresponding symbol of superflash EEPROM is shown as FIG. 30N. In FIG. 30O and FIG. 30P, the substrate program line 30a is perpendicular to channel length and the control gate 42 is parallel to the channel length. In FIG. 30Q and FIG. 30R, the substrate program line 30a is perpendicular to channel length and the control gate 42 is parallel to the channel length. In FIG. 30S and FIG. 30T, the substrate program line 30a is parallel to channel length and the control gate 42 is perpendicular to the channel length. In FIG. 30U and FIG. 30V, the substrate program line 30a is also parallel to channel length and the control gate 42 is perpendicular to the channel length.

Figure 31B:
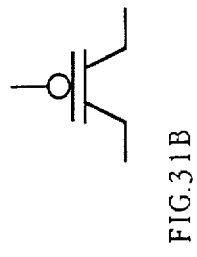
Figure 31A:
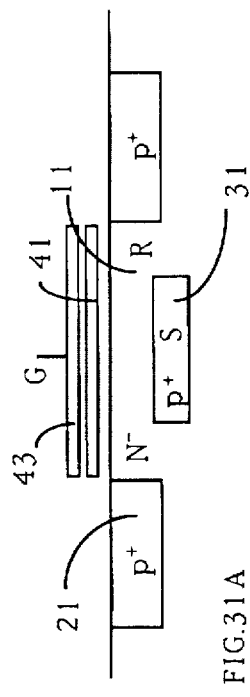
Figure 31D:
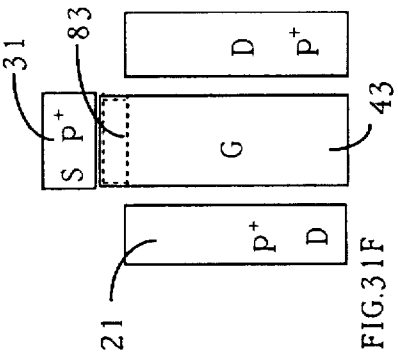
Figure 31C:
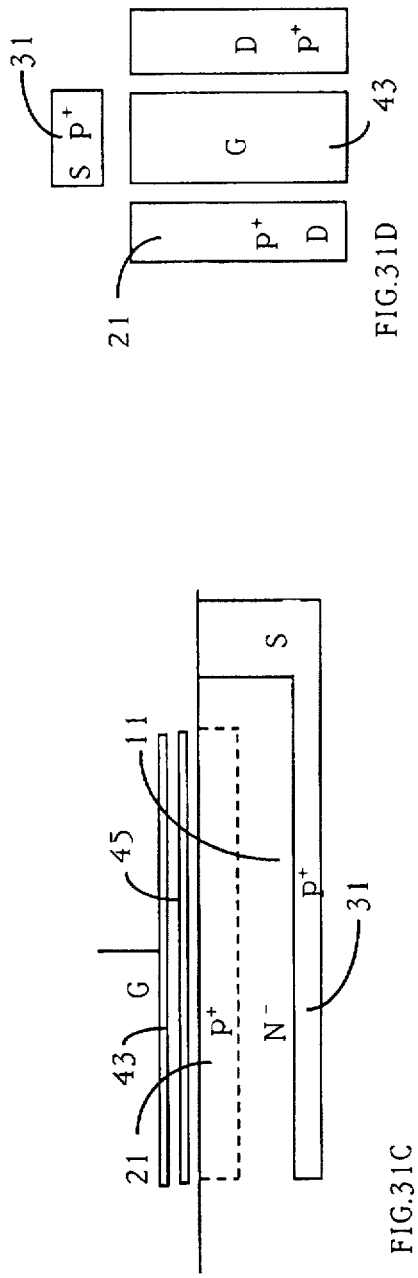
Figure 31F:
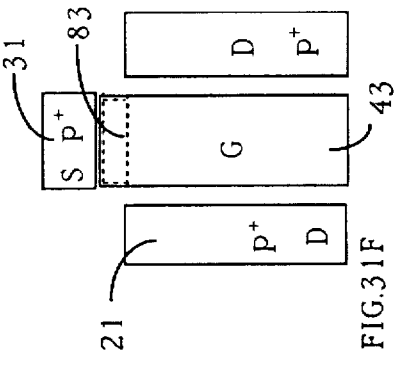
Figure 31E:
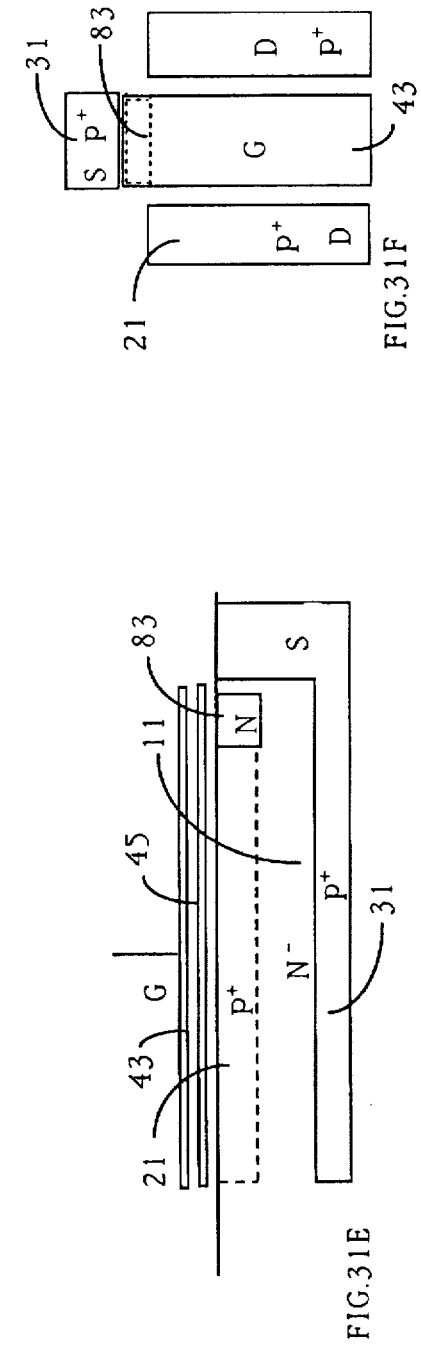
Figure 32B:
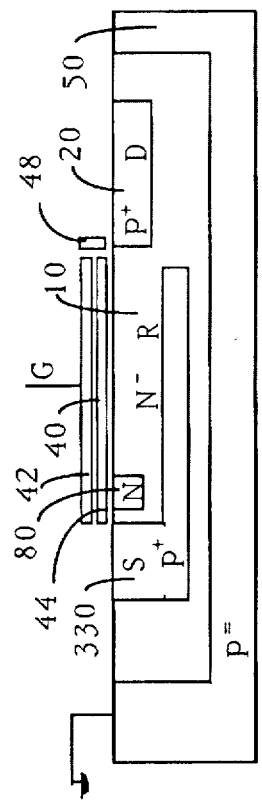
Figure 32D:
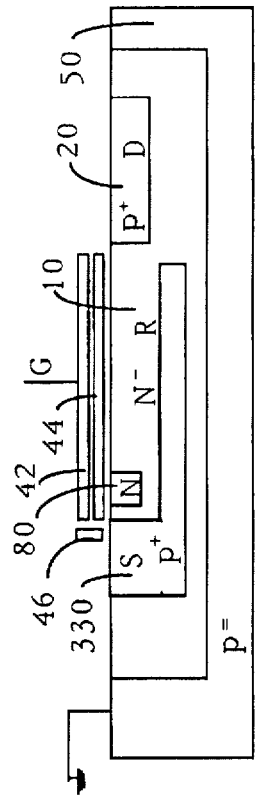
Figure 32A:
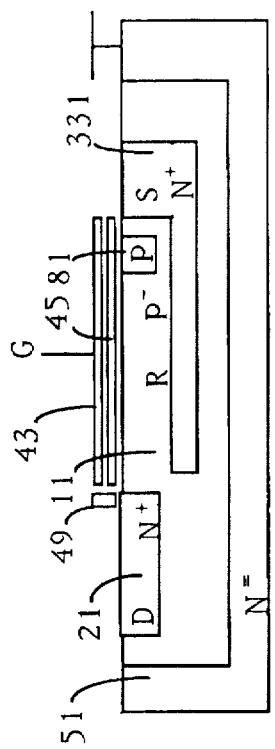
Figure 32C:
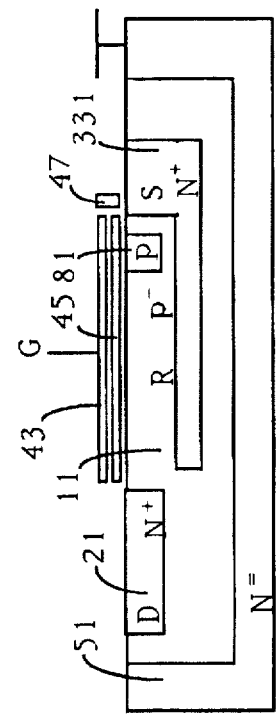
Figure 33B:
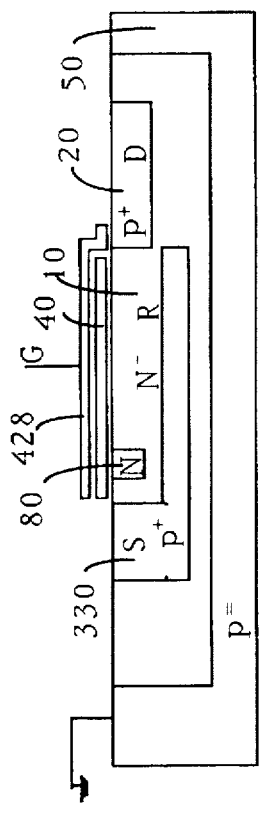
Figure 33D:
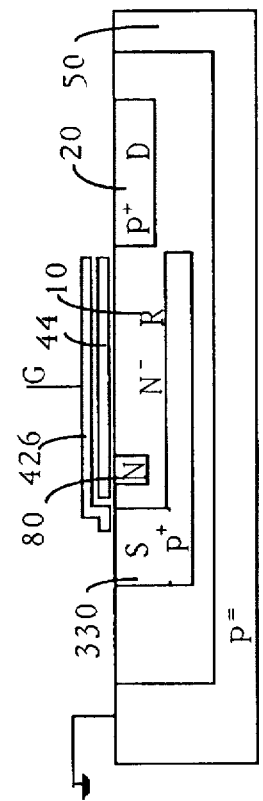
Figure 33A:
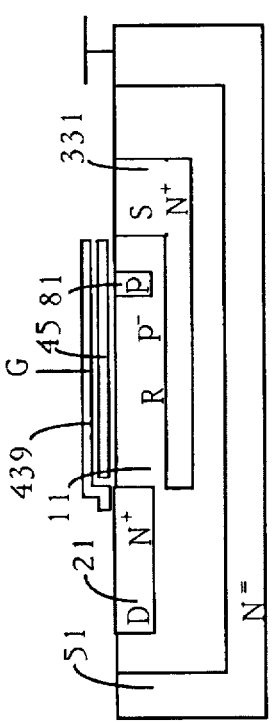
Figure 33C:
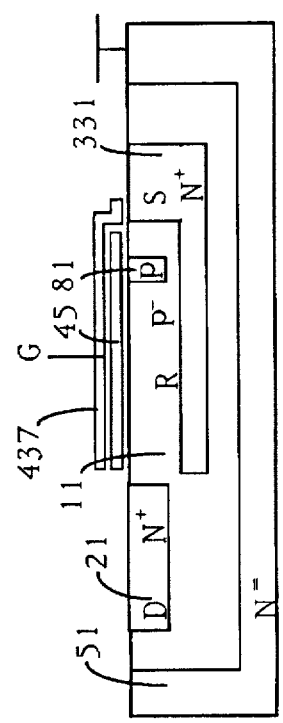
Figure 32E:
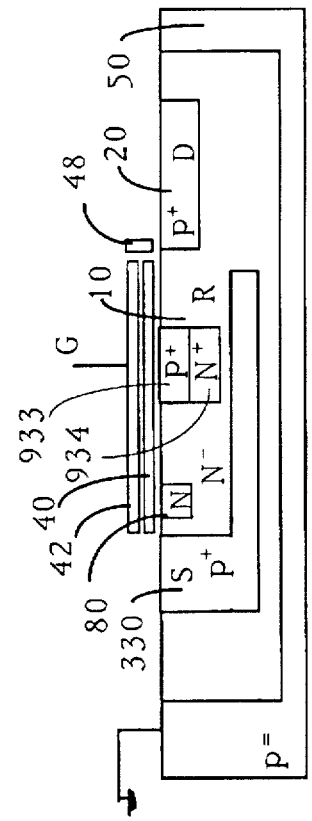
Figure 32G:
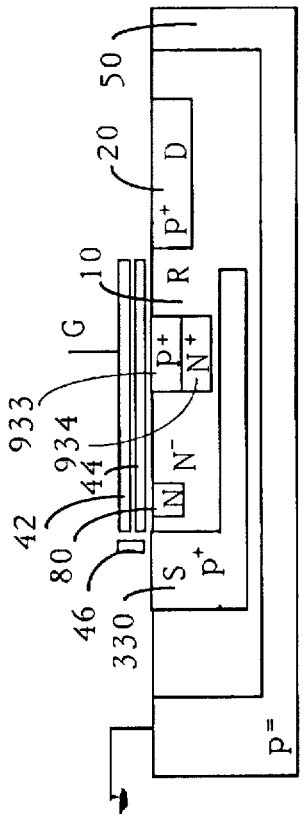
Figure 32F:
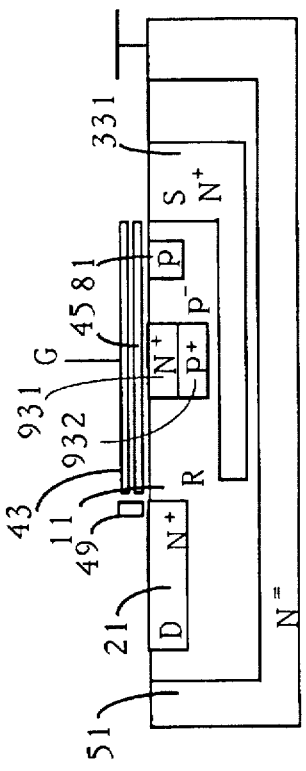
Figure 32H:
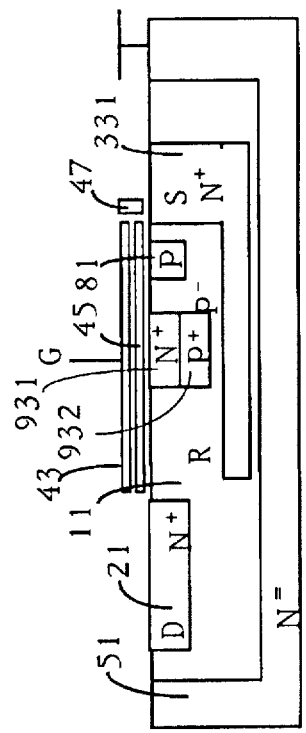
Figure 33E:
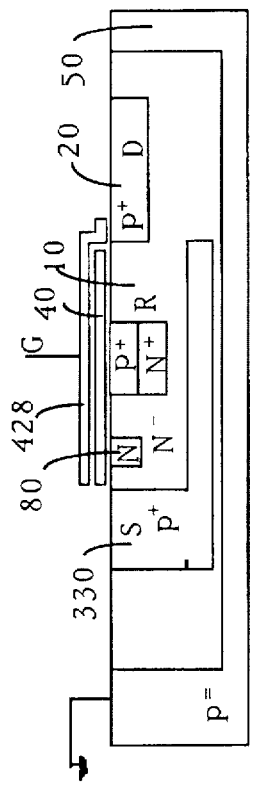
Figure 33G:
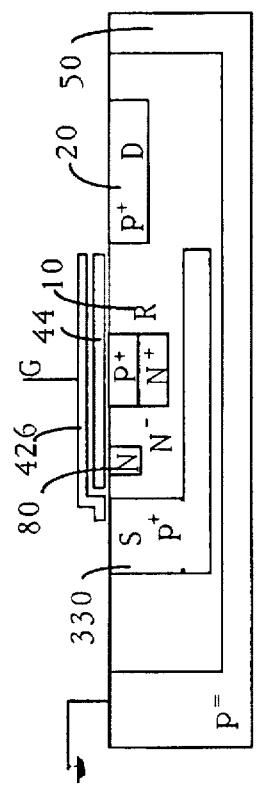
Figure 33F:
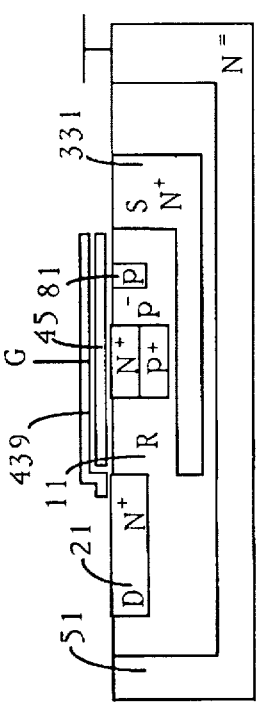
Figure 33H:
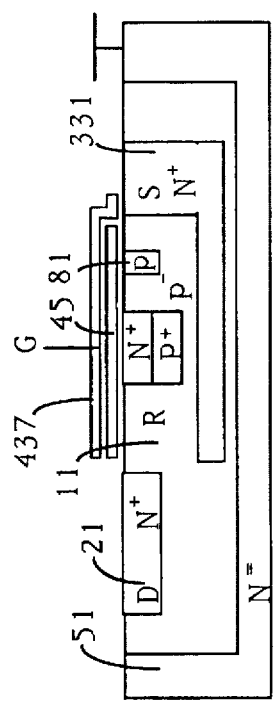
Figure 34A:
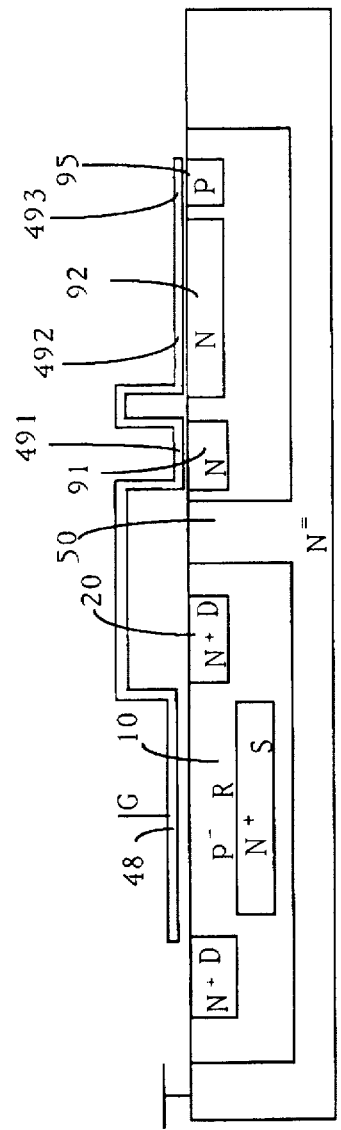
Figure 34B:
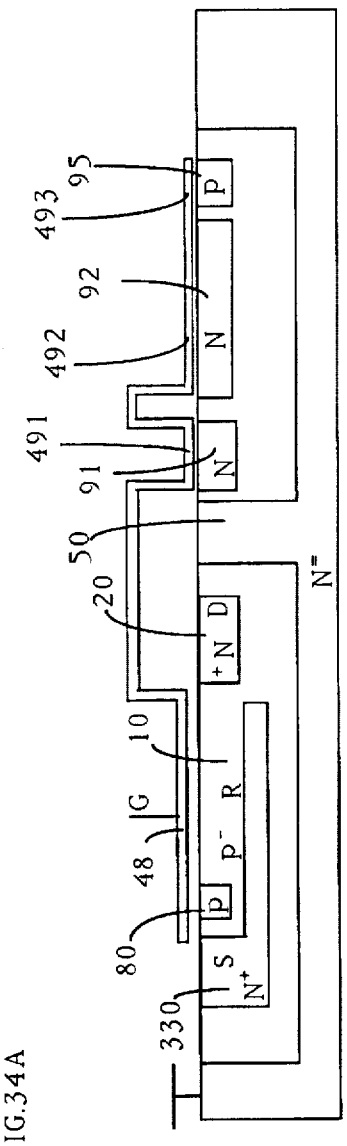
Figure 34C:
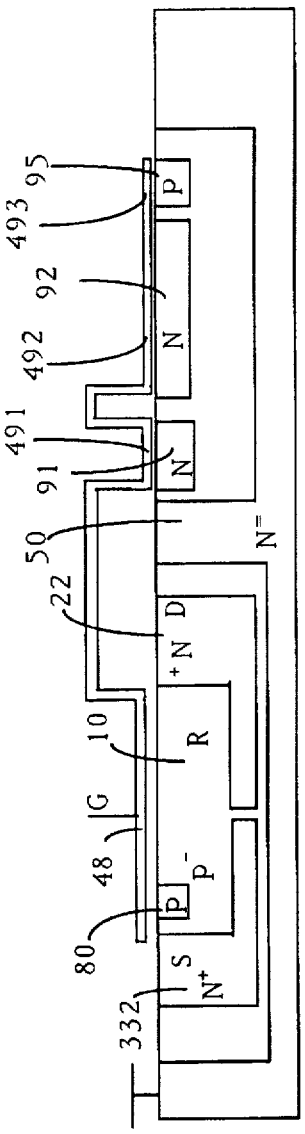
Figure 34D:
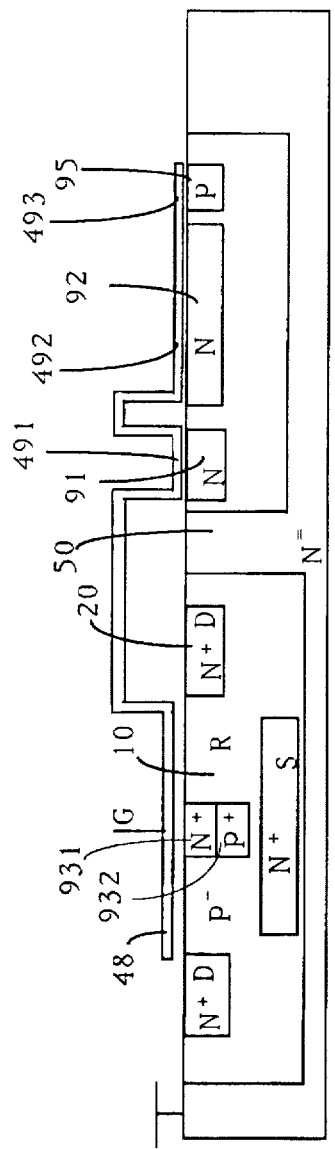
Figure 34E:
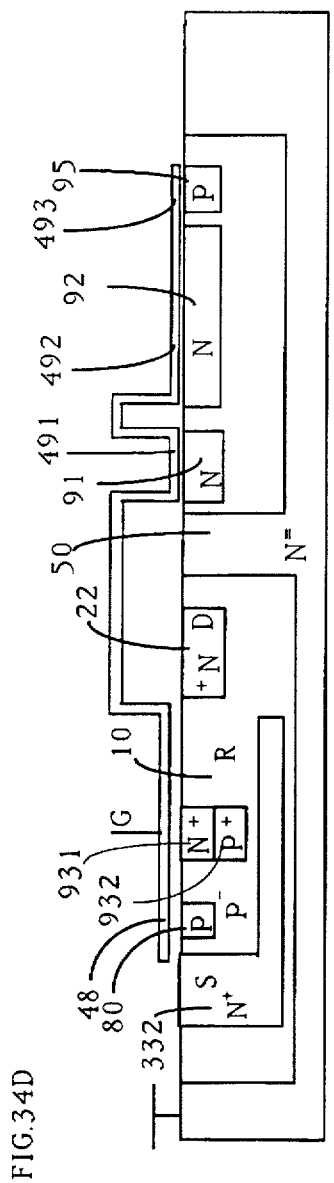
Figure 34F:
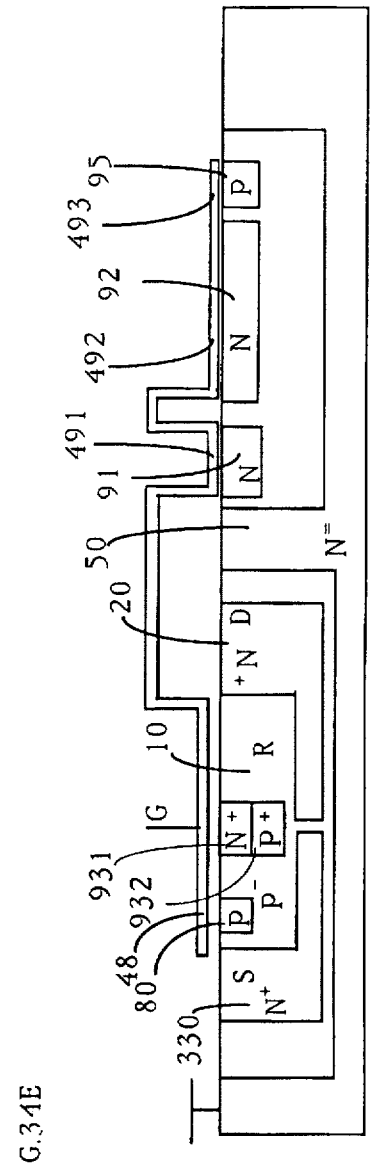

From FIG. 31A to FIG. 31F, the control gate 43 overlaps on the floating gate 45. FIG. 31B is the symbol of the P flash EEPROM. The control gate 43 controls the charging and discharging process of the stored charge in the floating gate 45. As the stored charge in the floating gate is in 0 state, the P flash EEPROM is conductive. As the stored charge in the floating gate is in 1 state, the P flash EEPROM is turned off. From FIG. 31G to FIG. 31K, the flash device has the ohmic contact to have both vertical charge coupling and current injecting effects.

FIG. 32, FIG. 33 and FIG. 34 illustrate my flash devices applying to the other different EEPROM technologies. From FIG. 32A to FIG. 32D, the flash memory device is the low voltage source side injection EEPROM. The side gates 46,47,48 and 49 are floating polysilicon spacers. FIG. 32A is the N type flash EEPROM having the floating polysilicon spacer located at the drain side. FIG. 32B is the P type flash EEPROM having the floating polysilicon spacer located at the drain side. FIG. 32C is the N type flash EEPROM having the floating polysilicon spacer located at the source side. FIG. 32B is the P type flash EEPROM having the floating polysilicon spacer located at the source side. From FIG. 32E to FIG. 32 H, the flash memory device has the ohmic contact to have both vertical charge coupling and current injecting effects.

FIG. 33 is the alternative design of EEPROM employing source side injection. The control gate 46 in FIG. 33 is the merge of side gate 49 and the control gate 42 in FIG. 32. A weak gate control region is provided in the device near the source or drain so that a relatively high channel electrical field for promoting hot-electron injection is created under the weak gate control region when the device is biased for programming. FIG. 33A is the N type flash EEPROM having the stepped side of the stepped control gate 439 located at the drain side. FIG. 33B is the P type flash EEPROM having the stepped side of the stepped control gate 428 located at the drain side. FIG. 33C is the N type flash EEPROM having the stepped side of the stepped control gate 437 located at the source side. FIG. 33D is the P type flash EEPROM having the stepped side of the stepped control gate 426 located at the source side. From FIG. 33E to FIG. 33H, the flash memory device has the ohmic contact to have both vertical charge coupling and current injecting effects.

FIG. 34 shows the single gate EEPROM. The reading and writing electrodes may be integrated with the source and drain regions of the reading field effect transistor. During writing, the programming voltage is momentarily applied to the writing electrode 92 via the larger capacitance. During erasing, the programming voltage is momentarily applied to the writing electrode 91 via the smaller capacitance. The insulated-gate portions 491 and 493 over the erasing electrode 91 or the diffusion region 95[3] are to be dimensioned so thin as to enable the junction crossing of hot carriers. The insulated-gate portion over the writing electrode is prefered to be given the same thickness. From FIG. 34D to FIG. 34F, the flash memory device has the ohmic contact to have both vertical charge coupling and current injecting effects.

The flash device is comparable with the CMOS device: from the device process to circuit design, it needs only very minor changes. Apparently, our new invention will be accepted by the industry as standard devices. While the invention has been particularly shown and described with reference to the preferred embodiments thereof, it will be understood by those skilled in the art that various changes in form and detail may be made therein without departing from the spirit and scope of the invention.

We claim:

1. A semiconductor device(FIG. 21A) comprising:

a first semiconductor region of first conductivity type, said first semiconductor region having a major surface;

second and third regions of second conductivity type in said first region, said third region being L shape region having a vertical segment and a horizontal segment, said second and said vertical segment of said third regions each adjoining said major surface, said third region being spaced from said second region by a portion of said first region, said horizontal segment of said third region buried inside said first region and under said major surface, a gate electrode insulatingly overlaying a portion of said first region and right above the buried horizontal segment of said third region, a drain electrode connected to said second region and a source electrode connected to said third region, said second region having a portion laying under said gate, said vertical segment of said third region being away from said gate to have a single-side offset with said gate to form a surface drainage to drain carriers to elinimate electric shield formed by carriers that electric field of said gate being able to reach hulk portion of said first semiconductor region to form a bulk channel (FIG. 23A and FIG. 23B), but said third region having the buried horizontal segment laying directly under said gate, whereby said structure forms a field effect transistor with said gate controlling the a buried portion and an interface between said buried portion and a channel portion, said channel portion of said first region being formed under the applied voltage of said gate to allow current flowing only from the buried portion of said third region to said second region.

2. A semiconductor device according to claim 1, wherein said first semiconductor region is of N-type conductivity and said second and third regions are of P-type conductivity.

3. A semiconductor device according to claim 1, wherein said first semiconductor region is of P-type conductivity and said second and third regions are of N-type conductivity.

4. A semiconductor device according to claim 1 which further comprises a fourth region of second conductivity type, said fourth region enwrapping said first region and isolating said device from other devices(FIG. 24).

5. A semiconductor device according to claim 4, wherein said fourth region adjoining said third region, said device further comprising a fifth region of first conductivity type enwrapping said fourth region and isolating said device from other devices(FIG. 26).

6. A semiconductor device(FIG. 26) according to claim 1 which further comprises a fourth region of second conductivity type adjoining said major surface and being connected to said source electrode, said fourth region also having a portion laying under said gate to share the current flow to reduce the resistivity.

7. A semiconductor device(FIG. 22) comprising:

a first semiconductor region of first conductivity type, said first semiconductor region having a major surface;

second and third regions of second conductivity type in said first region, said third region having a vertical segment and a horizontal segment, said second and said vertical segment of said third regions each adjoining said major surface, said horizontal segment of said third region buried inside said first region and under said major surface, a gate electrode insulatingly overlaying a portion of said first region and right above the buried horizontal segment of said third region, a drain electrode connected to said second region and a source electrode connected to said third region, whereby said structure forms a field effect transistor with said gate controlling the potential barrier at the interface of said first region and said buried portion of said third region, a channel portion of said first region being formed under the applied voltage of said gate to allow current flowing from the buried portion of said third region to said second region, said second region and said vertical segment of said third region which adjoining said major surface being aligned with edges of said gate, a small portion of said first region having higher doping concentration than a concentration of said first region to have higher threshold voltage than a threshold voltage of said first region, said small portion laying under said gate to prevent current flowing directly from said drain to said source through said surface channel.

8. A semiconductor device according to claim 7, wherein said first semiconductor region is of N-type conductivity and said second and third regions are of P-type conductivity.

9. A semiconductor device according to claim 7, wherein said first semiconductor region is of P-type conductivity and said second and third regions are of N-type conductivity.

10. A semiconductor device according to claim 1 further comprises a floating gate underlying said gate electrode and insulated from said first, second and third regions, said gate electrode being a control gate.

11. A semiconductor device according to claim 10 further includes a sidewall spacer insulated from said floating gate and said second region, said sidewall spacer being located in the vicinity of the second region, the semiconductor device being electrically programmable memory device employing drain side injection.

12. A semiconductor device according to claim 10 further includes a sidewall spacer insulated from said control gate, said floating gate and said second region, said sidewall spacer being located in the vicinity of the second region, wherein the semiconductor device being electrically programmable memory device employing drain side injection.

13. A semiconductor device according to claim 1 further comprises a pair of programming electrodes constituted by planar regions, comprising a writing electrode and an erasing electrode, each electrode constituting a gate laying over a dielectric of thickness permitting junction crossing by hot carrriers, the region of said writing electrode being larger than that at said erasing electrode.

14. A semiconductor device(FIG. 21E) comprising:

a first semiconductor region of first conductivity type, said first semiconductor region having a major surface;

second and third regions of second conductivity type in said first region, said second and third regions being L shape regions having a vertical segment and a horizontal segment respectively, said vertical segment of-second region and said vertical segment of said third region each adjoining said major surface, said third region being spaced from said second region by a portion of said first region, said horizontal segment of said third region and said horizontal segment of said third region buried inside said first region and under said major surface, a gate electrode insulatingly overlaying a portion of said first region and right above the buried horizontal segment of said third region, a drain electrode connected to said second region and a source electrode connected to said third region, said second region having a horizontal segment laying under said gate, said vertical segment of said third region being away from said gate, said third region having the horizontal segment laying under said gate, whereby said structure forms a field effect transistor with said gate controlling the potential barrier at the interface of said first region and said buried portion of said third region, having field induced bipolar effect, a channel portion of said first region being formed under the applied voltage of said gate to allow current flowing from the buried horizontal segment of said third region to said second region.

15. A semiconductor device according to claim 14, wherein said first semiconductor region is of N-type conductivity and said second and third regions are of P-type conductivity.

16. A semiconductor device according to claim 14, wherein said first semiconductor region is of P-type conductivity and said second and third regions are of N-type conductivity.

17. A semiconductor device according to claim 14 which further comprises a fourth region of second conductivity type, said fourth region enwrapping said first region and isolating said device from other devices(FIG. 24).

18. A semiconductor device according to claim 17, wherein said fourth region adjoining said third region, said device further comprising a fifth region of first conductivity type enwrapping said fourth region and isolating said device from other devices(FIG. 26).

19. A semiconductor device(FIG. 26) according to claim 14 which further comprises a fourth region of second conductivity type adjoining said major surface and being connected to said source electrode, said fourth region also having a portion laying under said gate to share the current flow to reduce the resistivity.

20. A semiconductor device(FIG. 22E) comprising:

a first semiconductor region of first conductivity type, said first semiconductor region having a major surface;

second and third regions of second conductivity type in said first region, said second region having a vertical segment and a horizontal segment, said third region having a vertical segment and a horizontal segment, said vertical segment of said second region and said vertical segment of said third region each adjoining said major surface, said horizontal segments of said second region and third region buried inside said first region and under said major surface, a gate electrode insulatingly overlaying a portion of said first region and right above the buried horizontal segments of said second region and third region, a drain electrode connected to said second region and a source electrode connected to said third region, whereby said structure forms a field effect transistor with said gate controlling the potential barrier at the interface of said first region and said buried portion of said third region, having field induced bipolar effect, a channel portion of said first region being formed under the applied voltage of said gate to allow current flowing from the buried segment of said third region to said second region, said vertical segment of second region and said vertical segment of said third region which adjoining said major surface being aligned with edges of said gate, a small portion of said first region having higher doping concentration than a concentration of said first region to have higher threshold voltage than a threshold voltage of said first region, said small portion laying under said gate to prevent current flowing directly from said drain to said source through said surface channel.

21. A semiconductor device according to claim 20, wherein said first semiconductor region is of N-type conductivity and said second and third regions are of P-type conductivity.

22. A semiconductor device according to claim 20, wherein said first semi-conductor region is of P-type conductivity and said second and third regions are of N-type conductivity.

23. A semiconductor device according to claim 14 further comprises a floating gate underlying said gate electrode and insulated from said first, second and third regions, said gate electrode being a control gate.

24. A semiconductor device according to claim 22 further includes a sidewall spacer insulated from said floating gate and said second region, said sidewall spacer being located in the vicinity of the second region, the semiconductor device being electrically programmable memory device employing drain side injection.

25. A semiconductor device according to claim 22 further includes a sidewall spacer insulated from said control gate, said floating gate and said second region, said sidewall spacer being located in the vicinity of the second region, wherein the semiconductor device being electrically programmable memory device employing drain side injection.

26. A semiconductor device according to claim 14 further comprises a pair of programming electrodes constituted by planar regions, comprising a writing electrode and an erasing electrode, each electrode constituting a gate laying over a dielectric of thickness permitting junction crossing by hot carriers, the region of said writing electrode being larger than that at said erasing electrode.

27. A semiconductor device(FIG. 21A) comprising:

a first semiconductor region of first conductivity type, said first semiconductor region having a major surface;

second and third regions of second conductivity type in said first region, said third region being L shape region having a vertical segment and a horizontal segment, said second and said vertical segment of said third regions each adjoining said major surface, said third region being spaced from said second region by a portion of said first region, said horizontal segment of said third region buried inside said first region and under said major surface, a gate electrode insulatingly overlaying a portion of said first region and right above the buried horizontal segment of said third region, an ohmic contact adjoining said major surface being beneath said gate;

a drain electrode connected to said second region and a source electrode connected to said third region, said second region having a portion laying under said gate, said vertical segment of said third region being away from said gate but having the buried horizontal segment laying under said gate, whereby said structure forms a field effect transistor with said gate controlling the potential barrier at the interface of said first region and said buried portion of said third region, a channel portion of said first region being formed under the applied voltage of said gate to allow current flowing from the buried portion of said third region to said second region.

28. A semiconductor device according to claim 27, wherein said first semiconductor region is of N-type conductivity and said second and third regions are of P-type conductivity; said ohmic contact having a highly doped P region adjoining said major surface and a highly doped N region beneath said highly doped P region.

29. A semiconductor device according to claim 27, wherein said first semiconductor region is of P-type conductivity and said second and third regions are of N-type conductivity; said ohmic contact having a highly doped N region adjoining said major surface and a highly doped P region beneath said highly doped N region.

30. A semiconductor device according to claim 27 which further comprises a fourth region of second conductivity type, said fourth region enwrapping said first region and isolating said device from other devices(FIG. 24).

31. A semiconductor device according to claim 30, wherein said fourth region adjoining said third region, said device further comprising a fifth region of first conductivity type enwrapping said fourth region and isolating said device from other devices(FIG. 26).

32. A semiconductor device(FIG. 26) according to claim 27 which further comprises a fourth region of second conductivity type adjoining said major surface and being connected to said source electrode, said fourth region also having a portion laying under said gate to share the current flow to reduce the resistivity.

33. A semiconductor device(FIG. 22) comprising:

a first semiconductor region of first conductivity type, said first semiconductor region having a major surface;

second and third regions of second conductivity type in said first region, said third region having a vertical segment and a horizontal segment, said second and said vertical segment of said third regions each adjoining said major surface, said horizontal segment of said third region buried inside said first region and under said major surface, a gate electrode insulatingly overlaying a portion of said first region and right above the buried horizontal segment of said third region, an ohmic contact adjoining said major surface being beneath said gate;

a drain electrode connected to said second region and a source electrode connected to said third region, whereby said structure forms a field effect transistor with said gate controlling the potential barrier at the interface of said first region and said buried portion of said third region, a channel portion of said first region being formed under the applied voltage of said gate to allow current flowing from the buried portion of said third region to said second region, said second region and said vertical segment of said third region which adjoining said major surface being aligned with edges of said gate, a small portion of said first region having higher doping concentration than a concentration of said first region to have higher threshold voltage than a threshold voltage of said first region, said small portion laying under said gate to prevent current flowing directly from said drain to said source through said surface channel.

34. A semiconductor device according to claim 33, wherein said first semiconductor region is of N-type conductivity and said second and third regions are of P-type conductivity; said ohmic contact having a highly doped P region adjoining said major surface and a highly doped N region beneath said highly doped P region.

35. A semiconductor device according to claim 33, wherein said first semiconductor region is of P-type conductivity and said second and third regions are of N-type conductivity; said ohmic contact having a highly doped N region adjoining said major surface and a highly doped P region beneath said highly doped N region.

36. A semiconductor device according to claim 27 further comprises a floating gate underlying said gate electrode and insulated from said first, second and third regions, said gate electrode being a control gate.

37. A semiconductor device according to claim 36 further includes a sidewall spacer insulated from said floating gate and said second region, said sidewall spacer being located in the vicinity of the second region, the semiconductor device being electrically programmable memory device employing drain side injection.

38. A semiconductor device according to claim 36 further includes a sidewall spacer insulated from said control gate, said floating gate and said second region, said sidewall spacer being located in the vicinity of the second region, wherein the semiconductor device being electrically programmable memory device employing drain side injection.

39. A semiconductor device according to claim 27 further comprises a pair of programming electrodes constituted by planar regions, comprising a writing electrode and an erasing electrode, each electrode constituting a gate laying over a dielectric of thickness permitting junction crossing by hot carrriers, the region of said writing electrode being larger than that at said erasing electrode.

40. A semiconductor device(FIG. 21E) comprising:
a first semiconductor region of first conductivity type, said first semiconductor region having a major surface;
second and third regions of second conductivity type in said first region, said second and third regions being L shape regions having a vertical segment and a horizontal segment respectively, said vertical segment of-second region and said vertical segment of said third region each adjoining said major surface, said third region being spaced from said second region by a portion of said first region, said horizontal segment of said third region and said horizontal segment of said third region buried inside said first region and under said major surface.

a gate electrode insu.atingly overlaying a portion of said first region and right above the buried horizontal segment of said third region, an ohmic contact adjoining said major surface being beneath said gate;

a drain electrode connected to said second region and a source electrode connected to said third region.

said second region having a horizontal segment laying under said gate, said vertical segment of said third region being away from said gale, said third region having the horizontal segment laying under said gate.

whereby said structure forms a field effect transistor with said gate controlling the potential barrier at the interface of said first region and said buried portion of said third region, having field induced bipolar effect, a channel portion of said first region being formed under the applied voltage of said gate to allow current flowing from the buried horizontal segment of said third region to said second region.

41. A semiconductor device according to claim 40, wherein said first semiconductor region is of N-type conductivity and said second and third regions are of P-type conductivity; said ohmic contact having a highly doped P region adjoining said major surface and a highly doped N region beneath said highly doped P region.

42. A semiconductor device according to claim 40, wherein said first semiconductor region is of P-type conductivity and said second and third regions are of N-type conductivity; said ohmic contact having a highly doped N region adjoining said major surface and a highly doped P region beneath said highly doped N region.

43. A semiconductor device according to claim 40 which further comprises a fourth region of second conductivity type, said fourth region enwrapping said first region and isolating said device from other devices(FIG. 24).

44. A semiconductor device according to claim 40, wherein said fourth region adjoining said third region, said device further comprising a fifth region of first conductivity type enwrapping said fourth region and isolating said device from other devices(FIG. 26).

45. A semiconductor device(FIG. 26) according to claim 40 which further comprises a fourth region of second conductivity type adjoining said major surface and being connected to said source electrode, said fourth region also having a portion laying under said gate to share the current flow to reduce the resistivity.

46. A semiconductor device(FIG. 22E) comprising:
a first semiconductor region of first conductivity type, said first semiconductor region having a major surface;
second and third regions of second conductivity type in said first region, said second region having a vertical segment and a horizontal segment, said third region having a vertical segment and a horizontal segment, said vertical segment of said second region and said vertical segment of said third region each adjoining said major surface, said horizontal segments of said second region and third region buried inside said first region and under said major surface,
a gate electrode insulatingly overlaying a portion of said first region and right above the buried horizontal segments of said second region and third region.

an ohmic contact adjoining said major surface being beneath said gate;

a drain electrode connected to said second region and a source electrode connected to said third region, whereby said structure forms a field effect transistor with said gate controlling the potential barrier at the interface of said first region and said buried portion of said third region, having field induced bipolar effect, a channel portion of said first region being formed under the applied voltage of said gate to allow current flowing from the buried segment of said third region to said second region, said vertical segment of second region and said vertical segment of said third region which adjoining said major surface being aligned with edges of said gate, a small portion of said first region having higher doping concentration than a concentration of said first region to have higher threshold voltage than a threshold voltage of said first region, said small portion laying under said gate to prevent current flowing directly from said drain to said source through said surface channel.

47. A semiconductor device according to claim 46, wherein said first semiconductor region is of N-type conductivity and said second and third regions are of P-type conductivity; said ohmic contact having a highly doped P region adjoining said major surface and a highly doped N region beneath said highly doped P region.

48. A semiconductor device according to claim 46, wherein said first semiconductor region is of P-type conductivity and said second and third regions are of N-type conductivity; said ohmic contact having a highly doped N region adjoining said major surface and a highly doped P region beneath said highly doped N region.

49. A semiconductor device according to claim 40 further comprises a floating gate underlying said gate electrode and insulated from said first, second and third regions, said gate electrode being a control gate.

50. A semiconductor device according to claim 49 further includes a sidewall spacer insulated from said floating gate and said second region, said sidewall spacer being located in the vicinity of the second region, the semiconductor device being electrically programmable memory device employing drain side injection.

51. A semiconductor device according to claim 50 further includes a sidewall spacer insulated from said control gate, said floating gate and said second region, said sidewall spacer being located in the vicinity of the second region, wherein the semiconductor device being electrically programmable memory device employing drain side injection.

52. A semiconductor device according to claim 40 further comprises a pair of programming electrodes constituted by planar regions, comprising a writing electrode and an erasing electrode, each electrode constituting a gate laying over a dielectric of thickness permitting junction crossing by hot carriers, the region of said writing electrode being larger thar that at said erasing electrode.

53. A semiconductor device(FIG. 21E) comprising:

a first semiconductor region of first conductivity type, said first semiconductor region having a major surface;

second and third regions of second conductivity type in said first region, said second region adjoining said major surface, said third region being spaced from said second region by a portion of said first region, said third region being buried inside said first region and under said major surface, a gate electrode insulatingly overlaying a portion of said first region and right above the buried fourth region, an ohmic contact adjoining said major surface being beneath said gate;

a drain electrode connected to said second region and a source electrode connected to said third region, whereby said structure forms a field effect transistor with said gate controlling the potential barrier at the interface of said first region and said buried portion of said third region, a channel portion of said first region being formed under the applied voltage of said gate to allow current flowing from the third region to said second region.

54. A semiconductor device according to claim 53, wherein said first semiconductor region is of N-type conductivity and said second and third regions are of P-type conductivity; said ohmic contact having a highly doped P region adjoining said major surface and a highly doped N region beneath said highly doped P region.

55. A semiconductor device according to claim 53, wherein said first semiconductor region is of P-type conductivity and said second and third regions are of N-type conductivity; said ohmic contact having a highly doped N region adjoining said major surface and a highly doped P region beneath said highly doped N region.

56. A semiconductor device according to claim 53 which further comprises a fourth region of second conductivity type, said fourth region enwrapping said first region and isolating said device from other devices(FIG. 24).

57. A semiconductor device according to claim 53, wherein said fourth region adjoining said third region, said device further comprising a fifth region of first conductivity type enwrapping said fourth region and isolating said device from other devices(FIG. 26).

58. A semiconductor device(FIG. 26) according to claim 53 which further comprises a fourth region of second conductivity type adjoining said major surface and being connected to said source electrode, said fourth region also having a portion laying under said gate to share the current flow to reduce the resistivity.

59. A semiconductor device(FIG. 22E) comprising:

a first semiconductor region of first conductivity type, said first semiconductor region having a major surface;

second, third and fourth regions of second conductivity type in said first region, said second region and fourth region adjoining said major surface, said third region being buried inside said first region and under said major surface, a gate electrode insulatingly overlaying a portion of said first region and right above the buried third region, an ohmic contact adjoining said major surface being beneath said gate;

whereby said structure forms a field effect transistor with said gate controlling the potential barrier at the interface of said first region and said third region, a channel portion of said first region being formed under the applied voltage of said gate to allow current flowing from the third region to said second region, said second region and said vertical segment of said third region which adjoining said major surface being aligned with edges of said gate, a small portion of said first region having higher doping concentration than a concentration of said first region to have higher threshold voltage than a threshold voltage of said first region, said small portion laying under said gate to prevent current flowing directly from said fourth region to said second region through said surface channel.

60. A semiconductor device according to claim 59, wherein said first semiconductor region is of N-type conductivity and said second and third regions are of P-type conductivity; said ohmic contact having a highly doped P region adjoining said major surface and a highly doped N region beneath said highly doped P region.

61. A semiconductor device according to claim 59, wherein said first semiconductor region is of P-type conductivity and said second and third regions are of N-type conductivity; said ohmic contact having a highly doped N region adjoining said major surface and a highly doped P region beneath said highly doped N region.

62. A semiconductor device according to claim 53 further comprises a floating gate underlying said gate electrode and insulated from said first, second and third regions, said gate electrode being a control gate.

63. A semiconductor device according to claim 62 further includes a sidewall spacer insulated from said floating gate and said second region, said sidewall spacer being located in the vicinity of the second region, the semiconductor device being electrically programmable memory device employing drain side injection.

64. A semiconductor device according to claim 63 further includes a sidewall spacer insulated from said control gate, said floating gate and said second region, said sidewall spacer being located in the vicinity of the second region, wherein the semiconductor device being electrically programmable memory device employing drain side injection.

65. A semiconductor device according to claim 53 further comprises a pair of programming electrodes constituted by planar regions, comprising a writing electrode and an erasing electrode, each electrode constituting a gate laying over a dielectric of thickness permitting junction crossing by hot carrriers, the region of said writing electrode being larger than that at said erasing electrode.

66. A single cell semiconductor device(FIG. 21H) comprising:

a first semiconductor region of first conductivity type, said first semiconductor region having a major surface;

second and third regions of second conductivity type in said first region, said second and third region being L shape region having a vertical segment and a horizontal segment, a drain electrode connected to said second region and a source electrode connected to said third region, a fourth semiconductor region of second conductivity which having a flat upper portion locating between said second and third region, said fourth region each adjoining said major surface, a switching capacitor gate electrode insulatingly overlaying said fourth region;

a precharging gate overlaying between said second region and said fourth region, a channel portion of said first region being formed under a applied voltage of said precharging gate to allow current flowing from said second region to said fourth region, a junction between said fourth region and said first region constituting a reverse diode;

a fifth isolation region beneath said fourth semiconductor contacting with said fourth region, said fourth region, fifth region, horizontal segments of said second and third regions constituting a field transistor.

67. A single cell semiconductor device(FIG. 21M) according to claim 66 further comprising a highly doped sixth region of the first conductivity which made a contact between a narrow region between said second region and third region.

68. A semiconductor device(FIG. 30L and FIG. 30U) comprising:

a first semiconductor region of first conductivity type, said first semiconductor region having a major surface;

second and third regions of second conductivity type in said first region, said third region being spaced from said second region by a portion of said first region, a gate electrode insulatingly overlaying a portion of said first region, a drain electrode connected to said second region and a source electrode connected to said third region, a floating gate underlying said gate electrode and insulated from said first, second and third regions, said gate electrode being a control gate, a low resistance connection means connecting said first conductivity region to switching voltage to inducing charge separation in said floating gate;

local high field strength needle pin mechanisms transferring charges through insulation layer between said floating gate and control gate.

69. A semiconductor device according to claim 68 of which needle pin mechanism is on the float gate.

70. A semiconductor device according to claim 68 of which needle pin mechanism is on the control gate.

71. A semiconductor device according to claim 68 of which needle pin mechanism is on the float gate and control gate.

* * * * *